US012581745B2

(12) United States Patent
Tzeng et al.

(10) Patent No.: US 12,581,745 B2
(45) Date of Patent: Mar. 17, 2026

(54) INTEGRATED CIRCUIT AND SYSTEM FOR FABRICATING THE SAME

(71) Applicant: TAIWAN SEMICONDUCTOR MANUFACTURING COMPANY, LTD., Hsinchu (TW)

(72) Inventors: Wei-Cheng Tzeng, Taipei City (TW); Shih-Wei Peng, Hsinchu City (TW); Ching-Yu Huang, Hsinchu City (TW); Chun-Yen Lin, Hsinchu City (TW); Wei-Cheng Lin, Taichung City (TW); Jiann-Tyng Tzeng, Hsinchu City (TW); Szuya Liao, Hsinchu County (TW); Jui-Chien Huang, Hsinchu City (TW); Cheng-Yin Wang, Taipei City (TW); Ting-Yun Wu, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 683 days.

(21) Appl. No.: 18/153,250

(22) Filed: Jan. 11, 2023

(65) Prior Publication Data

US 2024/0234404 A1 Jul. 11, 2024

(51) Int. Cl.
*H10D 89/10* (2025.01)
*G06F 30/392* (2020.01)
*H10D 84/85* (2025.01)

(52) U.S. Cl.
CPC .......... *H10D 89/10* (2025.01); *G06F 30/392* (2020.01); *H10D 84/85* (2025.01)

(58) Field of Classification Search
CPC ...... H10D 89/10; H10D 84/85; H10D 84/851; H10D 84/975; H10D 84/0186; H10D 84/038; G06F 30/39; G06F 30/392; G06F 30/394
USPC .......................................................... 716/119
See application file for complete search history.

(56) References Cited

U.S. PATENT DOCUMENTS

2023/0077532 A1* 3/2023 Kim ...................... H10D 89/10 716/119

OTHER PUBLICATIONS

"Imec Presents Complementary FET (CFET) as Scaling Contender for Nodes Beyond N3", Imec, Jun. 20, 2018, (https://www.imec-int.com/en/articles/imec-presents-complementary-fet-cfet-as-scaling-contender-for-nodes-beyond-n3), total of 8 pages.

(Continued)

*Primary Examiner* — Paul Dinh
(74) *Attorney, Agent, or Firm* — Birch, Stewart, Kolasch & Birch, LLP

(57) ABSTRACT

An integrated circuit is provided, including a first cell. The first cell includes a first pair of active regions, at least one first gate, two first conductive segments, and a first interconnect structure. The first pair of active regions extends in a first direction and stacked on each other. The at least one first gate extends in a second direction different from the first direction, and is arranged across the first pair of active regions, to form at least one first pair of devices that are stacked on each other. The first conductive segments are coupled to the first pair of active regions respectively. The first interconnect structure is coupled to at least one of a first via or one of the two first conductive segments.

20 Claims, 38 Drawing Sheets

(56) References Cited

OTHER PUBLICATIONS

Julien Ryckaert "Scaling CMOS beyond FinFETs: from nanosheets and forksheets to CFETs", Imec, Dec. 4, 2019, (https://www.imec-int.com/en/imec-magazine/imec-magazine-december-2019/scaling-cmos-beyond-finfets-from-nanosheets-and-forksheets-to-cfets), total of 20 pages.

* cited by examiner

INTEGRATED CIRCUIT AND SYSTEM FOR FABRICATING THE SAME

BACKGROUND

Complementary filed effect transistor (CFET) is a promising structure of future standard cell. It stacks n-type and p-type devices to scale the cell area by 50% in ideal case. Traditionally, a deep via is used in CFET to vertically connect the n-type and p-type devices. Yet, because the deep via has high aspect ratio (AR), its process is challenging, and it may have large resistance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
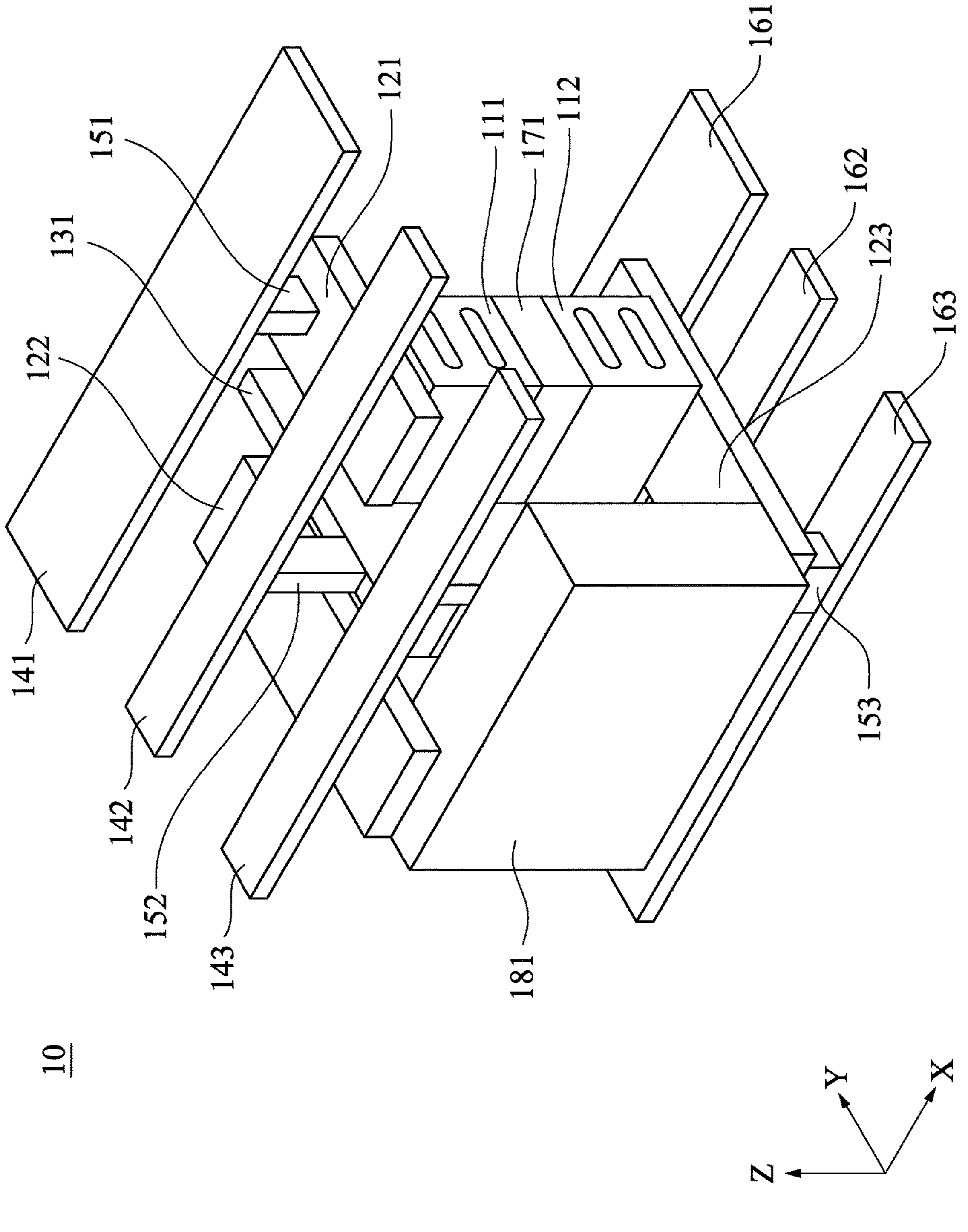
FIG. 1 is a schematic diagram of an integrated circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of an integrated circuit 10, in accordance with some embodiments of the present disclosure. The integrated circuit 10 includes active regions 111-112, a gate 131, conductive segments 121-123, vias 151-153, conductive lines 141-143 and 161-163, an isolation region 171, and an interconnect structure 181. In some embodiments, the gate 131 is formed of polysilicon and is referred to as "poly gate." In some embodiments, the conductive segments 121-123 are formed of metal and are referred to as metal diffusion layers.

In FIG. 1, the active regions 111-112 extend in the x direction and are separated from each other in the z direction. The active regions 111-112 are referred to as a pair of stacked active regions and crossed by the gate 131 extending in the y direction. In some embodiments, the integrated circuit 10 is implemented by or includes a complementary field-effect transistor (CFET). In such embodiments, the active regions 111-112 correspond to source/drain regions of the CFET.

In some embodiments, the active region 111 and the gate 131 are included in N-type transistors, in which the active region 111 is N-type doped. The active region 112 and the gate 131 are included in P-type transistors, in which the active region 112 is P-type doped. Alternatively stated, the gate 131 is shared by the P-type transistors and N-type transistors including the active regions 111-112, respectively.

As shown in FIG. 1, the isolation region 171 is sandwiched between the active regions 111 and 112. In some embodiments, the isolation region 171 is configured as an isolation between the active regions 111-112.

As shown in FIG. 1, the gate 131 is coupled to the conductive line 142 through the via 152. In some embodiments, the conductive line 142 is configured to transmit a logic signal, and the gate 131 is configured to receive the logic signal from the conductive line 142 through the via 152, such that the N-type transistors and the P-type transistors as discussed above are controlled with logic signal.

The conductive segments 121-123 extend in the Y direction. The conductive segments 121-123 are configured as source/drain contacts when the integrated circuit 10 is implemented by or includes the CFET, as discussed above. As illustratively shown in FIG. 1, the active region 111 is coupled to the conductive line 141 through the conductive segment 121 and the via 151, the active region 112 is coupled to the conductive line 163 through the conductive segment 123 and the via 153 and is coupled to the interconnect structure 181 through the conductive segment 123, and the active region 111 is coupled to the interconnect structure 181 through the conductive segment 122.

As shown in FIG. 1, the conductive lines 141-143 are arranged on a front side (or front portion) of the integrated circuit 10, and the conductive lines 161-163 are arranged on a back side (or back portion) of the integrated circuit 10 that is opposite to the front side.

In some embodiments, the conductive line 141 is referred to as a power rail on the front side of the integrated circuit 10 and configured to transmit a supply voltage including, for example, a relatively lower voltage VSS. In some embodiments, the conductive line 161 is referred to as a power rail on the back side of the integrated circuit 10 and configured to transmit a supply voltage including, for example, a relatively higher voltage VDD. In some embodiments, the conductive lines 142-143 are referred to as metal-zero conductive lines and configured to transmit supply voltages or signals for the integrated circuit 10. In some embodiments, the conductive lines 162-163 are referred to as backside metal-zero conductive lines and configured to transmit supply voltages or signals for the integrated circuit 10.

In FIG. 1, the N-type transistors including the active region 111 and the gate 131 as discussed above is stacked over the P-type transistors including the active region 112 and the gate 131. In some embodiments, the interconnect structure 181 is configured for the signal connection between the N-type and P-type transistors. Specifically, the interconnect structure 181 is configured to transmit signals between the active regions 111-112 through the conductive segments 122-123. Alternatively stated, the interconnect structure 181 is configured to couple the active region 111 and the active region 112 through the conductive segments 122-123.

In some embodiments, the integrated circuit 10 further includes at least one conductive segment that is landed on the interconnect structure 181. For illustration of FIG. 1, the conductive segments 122-123 are landed on opposite surfaces of the interconnect structure 181. The configurations of the at least one conductive segment landed on the interconnect structure 181 are given for illustrative purposes. Various configurations landed on the interconnect structure 181 are within the contemplated scope of the present disclosure. For example, in various embodiments, at least one via is landed on the interconnect structure 181.

In some embodiments, the active regions 111-112, the gate 131, and/or the conductive segment 121 does not extend to contact the interconnect structure 181, in order to prevent electrical short with the interconnect structure 181 and/or malfunction of the integrated circuit 10. In some embodiments, the interconnect structure 181 is surrounded by a dielectric structure (not shown in FIG. 1) which is configured to separate the interconnect structure 181 from the active regions 111-112, the gate 131, and the conductive segment 121.

The configurations of the integrated circuit 10 in FIG. 1 are given for illustrative purposes. Various configurations of the integrated circuit 10 are within the contemplated scope of the present disclosure. For example, in various embodiments, the active region 111 is P-type doped, and the active region 112 is N-type doped.

Figure 2A:
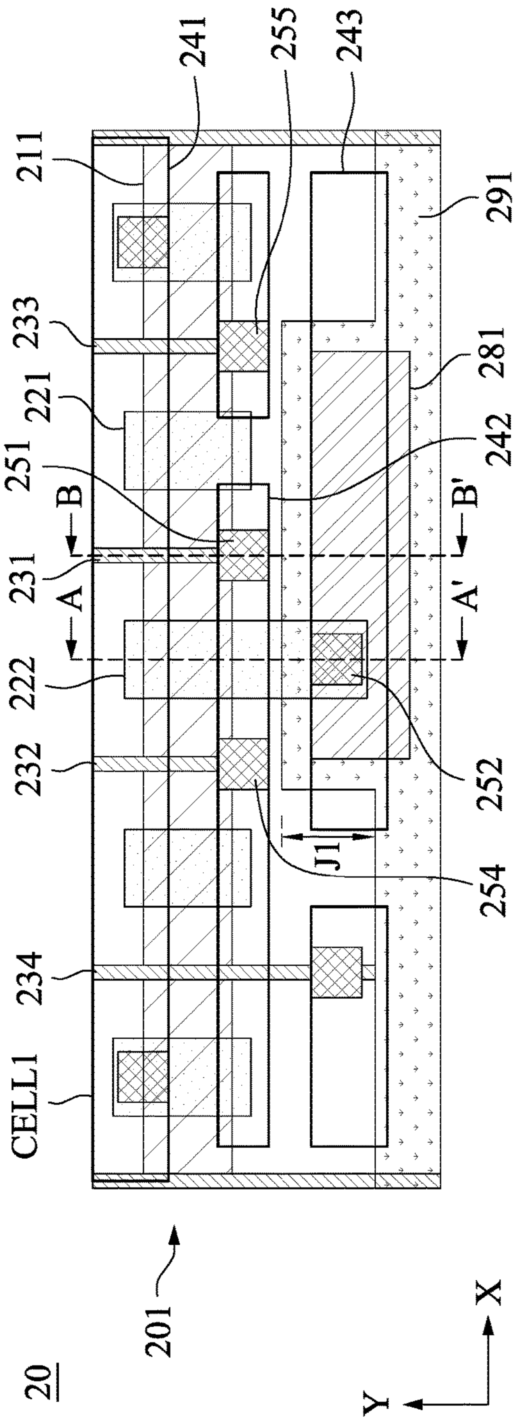
FIGS. 2A-2B are layout diagrams in a plan view of a front portion and a back portion of an integrated circuit including a portion of the integrated circuit in FIG. 1, in accordance with some embodiments of the present disclosure.
Figure 2B:
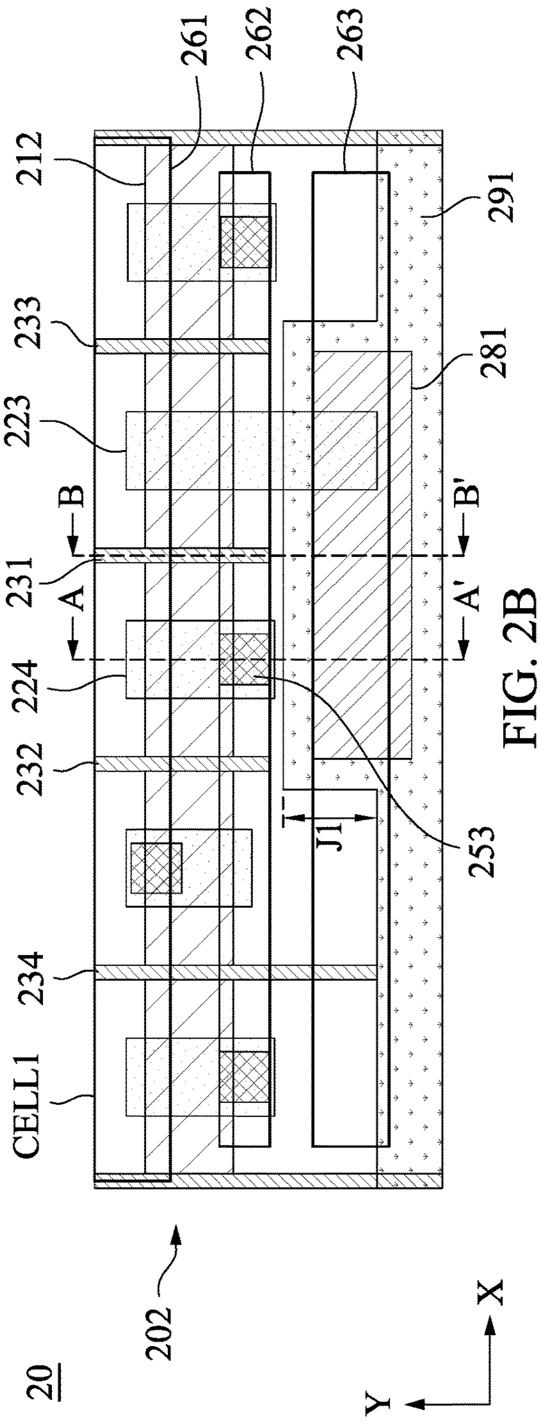
Figure 2C:
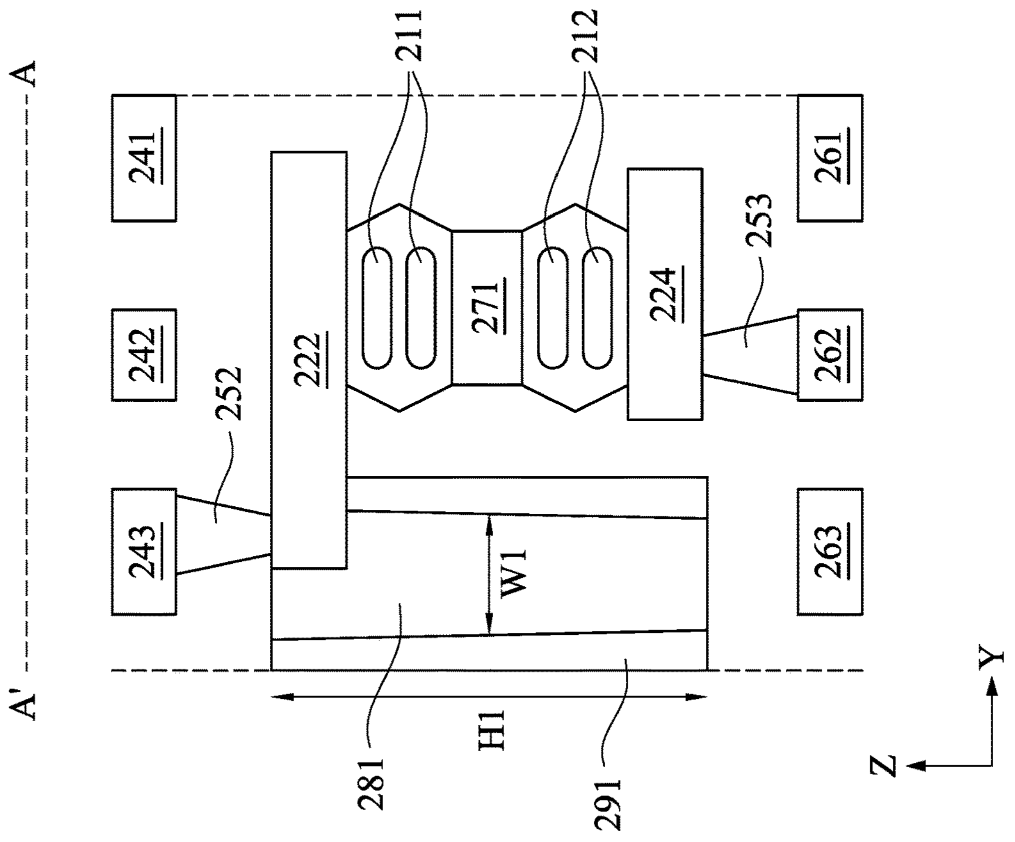
FIG. 2C is a cross-sectional diagram of the integrated circuit along line A-A' in FIGS. 2A-2B, in accordance with some embodiments of the present disclosure.
Figure 2D:
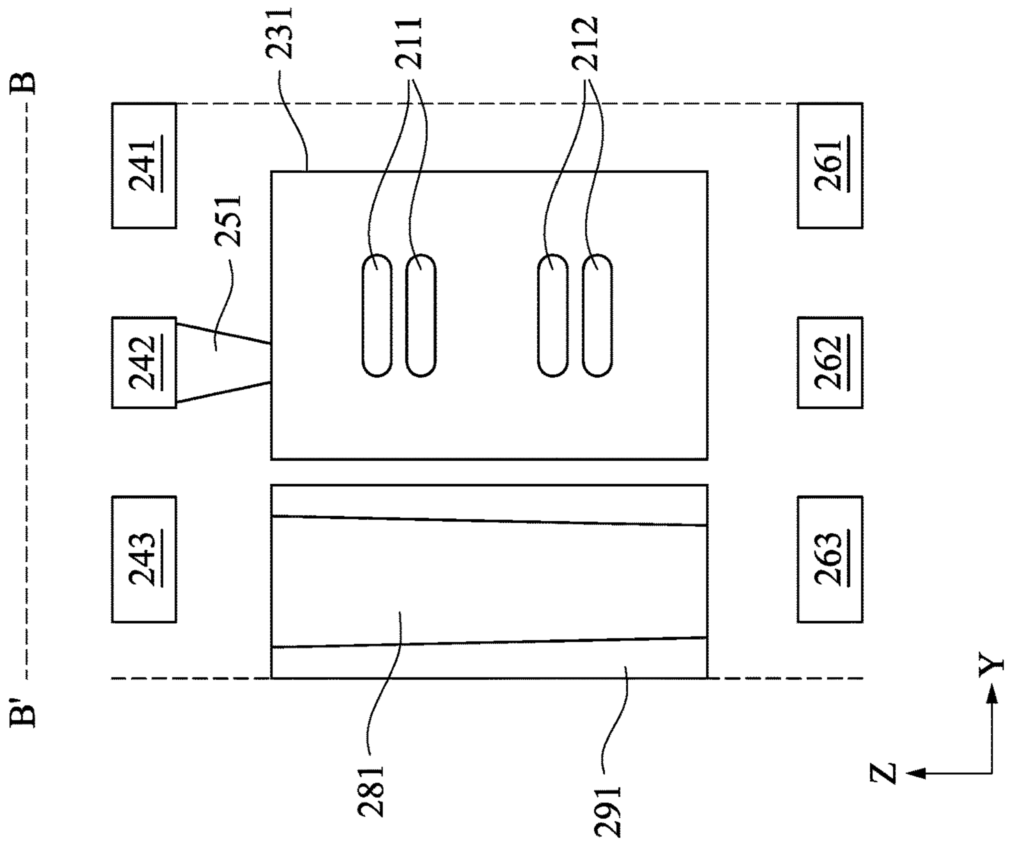
FIG. 2D is a cross-sectional diagram of the integrated circuit along line B-B' in FIGS. 2A-2B, in accordance with some embodiments of the present disclosure.

Reference is now made to FIGS. 2A-2D. FIGS. 2A-2B are layout diagrams in a plan view of a front portion 201 and a back portion 202 of an integrated circuit 20 including a portion of the integrated circuit 10 in FIG. 1, FIG. 2C is a cross-sectional diagram of the integrated circuit 20 along line A-A' in FIGS. 2A-2B, and FIG. 2D is a cross-sectional diagram of the integrated circuit 20 along line B-B' in FIGS. 2A-2B, in accordance with some embodiments of the present disclosure. In FIGS. 2A-2D, the integrated circuit 20 includes active regions 211-212, conductive segments 221-223, a gate 231, conductive lines 241-243 and 261-263, a contact via 251, and an interconnect structure 281. The active regions 211-212 are configured with respect to the active regions 111-112 in FIG. 1. The conductive segments 221-223 are configured with respect to the conductive segments 121-123 in FIG. 1. The gate 231 is configured with respect to the gate 131 in FIG. 1. The conductive lines 241-243 are configured with respect to the conductive lines 141-143 in FIG. 1. The conductive lines 261-263 are configured with respect to the conductive lines 161-163 in FIG. 1. The contact via 251 is configured with respect to the contact via 152 in FIG. 1. The interconnect structure 281 is configured with respect to the interconnect structure 181 in FIG. 1.

As shown in FIGS. 2A-2B, the active region 211 of the front portion 201 of the integrated circuit 20 is coupled to the interconnect structure 281 through the conductive segment 222, and the active region 212 of the back portion 202 of the integrated circuit 20 is coupled to the interconnect structure 281 through the conductive segment 223. Alternatively stated, the interconnect structure 281 is configured to couple the active region 211 of the front portion 201 to the active region 212 of the back portion 202 with each other.

As shown in FIGS. 2A-2B, the integrated circuit 20 includes a cell CELL1. The cell CELL1 includes the active regions 211-212. The active regions 211-212 in the CELL1 extend in the X direction and are stacked on each other. The integrated circuit 20 further includes the gate 231 extending in the Y direction and arranged across the active regions 211-212, the conductive segments 221-224 coupled to the active regions 211-212, and the interconnect structure 281 coupled to the conductive segments 222-223. The interconnect structure 281 extends from the front portion 201 to the back portion 202 and is separate from the active regions 211-212 and the gate 231.

For illustration of FIGS. 2A-2B, the interconnect structure 281 has a length in the X direction and a width in the Y direction that is smaller than the length in the X direction.

For illustration of FIGS. 2A-2B, the integrated circuit 20 further includes gates 232-234, other than the gate 231 and the interconnect structure 281 is arranged across the gates 231-233.

For illustration of FIGS. 2A-2B, any two adjacent gates of the gates 231-234 are separate by a pitch P1. In some embodiments, the pitch P1 is referred as a contacted poly pitch (CPP).

In some embodiments, the length of the interconnect structure 281 in the X direction is in a range from approximately the pitch P1 to approximately three times of the pitch P1. In some embodiments, the minimum of the length of the interconnect structure 281 in the X direction is in a range from approximately the pitch P1 to approximately two times of the pitch P1. In some embodiments, the maximum of the length of the interconnect structure 281 in the X direction is in a range from approximately two times of the pitch P1 to approximately three times of the pitch P1.

In some embodiments, as shown in FIGS. 2A-2D, the cell CELL1 further includes a dielectric structure 291. The dielectric structure 291 surrounds the interconnect structure 281 and is separate from the active regions 211-212 and the gate 231. In some embodiments, the dielectric structure 291 is formed before the interconnect structure 281 is formed.

In some embodiments, the process of manufacturing the interconnect structure 281 includes cutting parts of the gates 231-234 in FIGS. 2A-2B and/or etching other parts of a cell, filling dielectric material to form the dielectric structure 291 while leaving a space, and filling a conductive material including, for example, metal, into the space to form the interconnect structure 281.

In some embodiments, the dielectric structure 291 formed by the process described above has a jog distance J1 for accommodating the interconnect structure 281.

In some embodiments, the conductive line 241 is configured to transmit a supply voltage, the conductive line 242 is coupled to the gate 231 through the via 251, and the conductive line 243 is coupled to the interconnect structure 281 through the via 252, as shown in FIGS. 2A-2D. For illustration of FIG. 2A, the vias 251 and 254-255 are arranged in a same row along the X direction.

For illustration of FIG. 2C, the interconnect structure 281 has a width W1 in the Y direction and a height H1 in the Z direction. In some embodiments, the height H1 is approximately 150 nm, the width W1 is approximately 30 nm, and the aspect ratio (height/width) is approximately 5.

In some approaches, a deep via is included in a CFET with respect to the CFET as discussed above, and is used for transmitting signals in the Z direction as shown in FIG. 1. The deep via has a high resistance because the deep via is tapered from one side to the other side, thus affecting the performance of the CFET. Moreover, to have the tapered deep via, the process of manufacturing such deep via is difficult or requires significant time and/or resources.

Compared to the above approaches, the interconnect structure 281 in the present disclosure is also able to transmit signals in the Z direction as shown in FIG. 1 and has a relatively low resistance because the interconnect structure 281 has no tapered shape, thus improving the performance of the CFET. Moreover, compared to the above approaches, without the tapered shape, the process of manufacturing the interconnect structure 281 is easier and requires less time and/or resources.

For illustration of FIGS. 2C-2D, the interconnect structure 281 has the height H1 that is greater than a sum of heights of the active regions 211-212, the isolation region 271, and the conductive segments 222 and 224.

Figure 3:
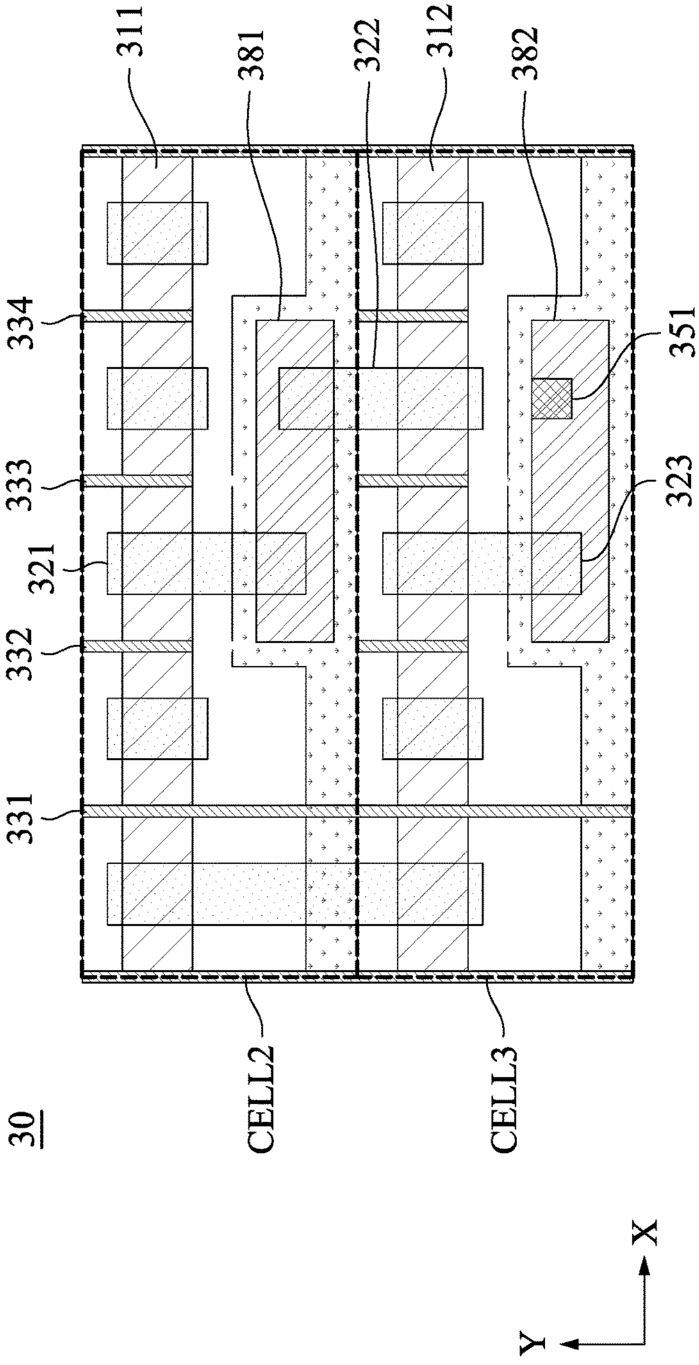
FIG. 3 is a layout diagram in a plan view of a front portion of an integrated circuit including a portion of the integrated circuit in FIG. 1, in accordance with some embodiments of the present disclosure.

Reference is now made to FIG. 3. FIG. 3 is a layout diagram in a plan view of a front portion of an integrated circuit 30 including a portion of the integrated circuit 10 in FIG. 1, in accordance with some embodiments of the present disclosure. The integrated circuit 30 includes cells CELL2-CELL3 abutting with each other along the Y direction. The cell CELL2 includes an active region 311, a portion of a conductive segment 321, an interconnect structure 381, and portions of gates 331-334. The cell CELL3 includes an active region 312, a portion of the conductive segment 322, a conductive segment 323, an interconnect structure 382, a via 351, and portions of the gates 331-334.

For illustration of FIG. 3, the active regions 311-312 extend in the X direction, the conductive segments 321-323 extend in the Y direction, the interconnect structure 381-382 extend in the X direction, and the gates 331-334 extend in the Y direction.

In some embodiments, the active regions 311-312 of the cells CELL2-CELL3 are the active regions arranged on the front portion of the integrated circuit 30, and the integrated circuit 30 further includes active regions (not shown in FIG. 3) arranged on the back portion of the integrated circuit 30. Alternatively stated, the active regions 311-312 are stacked on the active regions arranged on the back portion of the integrated circuit 30.

As shown in FIG. 3, each of the interconnect structures 381-382 has a length in the X direction and a width in the Y direction that is smaller than the length.

For illustration of FIG. 3, the interconnect structure 381 is coupled to the active region 311 through the conductive segment 321 and coupled to the active region 312 through the conductive segment 322, and the interconnect structure 382 is coupled to the active region 312 through the conductive segment 323. Alternatively stated, the interconnect structure 381 is configured to couple the active regions 311-312 through the conductive segments 321-322 and transmit voltage or signal between the cells CELL2-CELL3. In such embodiments, the interconnect structure 381 is configured as a routing resource between the cells CELL2-CELL3.

In some embodiments, each of the cells CELL2-CELL3 has one cell height along the Y direction. In various embodiments, the cells CELL2-CELL3 are referred to as a single cell having double cell heights along the Y direction.

In some embodiments, the via 351 is landed on the interconnect structure 382 and configured to transmit signals or voltages from the interconnect structure 382 to a conductive line arranged above the via 351 (not shown in FIG. 3).

For illustration of FIG. 3, the gate 331 is continuous in the Y direction and arranged across the active regions 311-312. Alternatively stated, the cells CELL2-CELL3 share the same gate 331.

Figure 4:
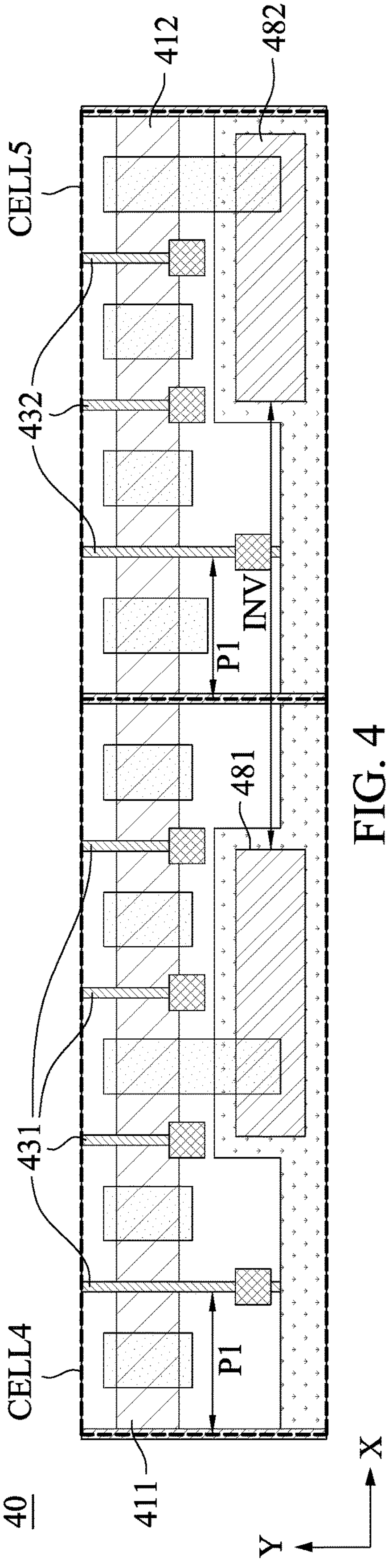
FIG. 4 is a layout diagram in a plan view of a front portion of an integrated circuit including a portion of the integrated circuit in FIG. 1, in accordance with some embodiments of the present disclosure.

Reference is now made to FIG. 4. FIG. 4 is a layout diagram in a plan view of a front portion of an integrated circuit 40 including a portion of the integrated circuit 10 in FIG. 1, in accordance with some embodiments of the present disclosure. The integrated circuit 40 includes cells CELL4-CELL5. The cell CELL4 includes an active region 411 extending along the X direction, multiple gates 431, and an interconnect structure 481. The cell CELL5 includes an active region 412 extending along the X direction, multiple gates 432, and an interconnect structure 482.

In some embodiments, the active regions 411-412 of the cells CELL4-CELL5 are the active regions arranged on the front portion of the integrated circuit 40, and the integrated circuit 40 further includes active regions (not shown in FIG. 4) arranged on the back portion. Alternatively stated, the active region 411 is stacked on another active region arranged on the back portion of the cell CELL4, and the active region 412 is stacked on another active region arranged on the back portion of the cell CELL5.

For illustration, any two adjacent gates of the gates 431 have the pitch P1 therebetween, and any two adjacent gates of the gates 432 have the pitch P1 therebetween.

For illustration, an interval INV between the interconnect structure 481 and the interconnect structure 482 is around three times the pitch P1. In various embodiments, the minimum of an interval INV between the interconnect structure 481 and the interconnect structure 482 is in a range from approximately the pitch P1 to approximately two times of the pitch P1. In various embodiments, the minimum of the interval INV is greater than the pitch P1.

Figure 5C:
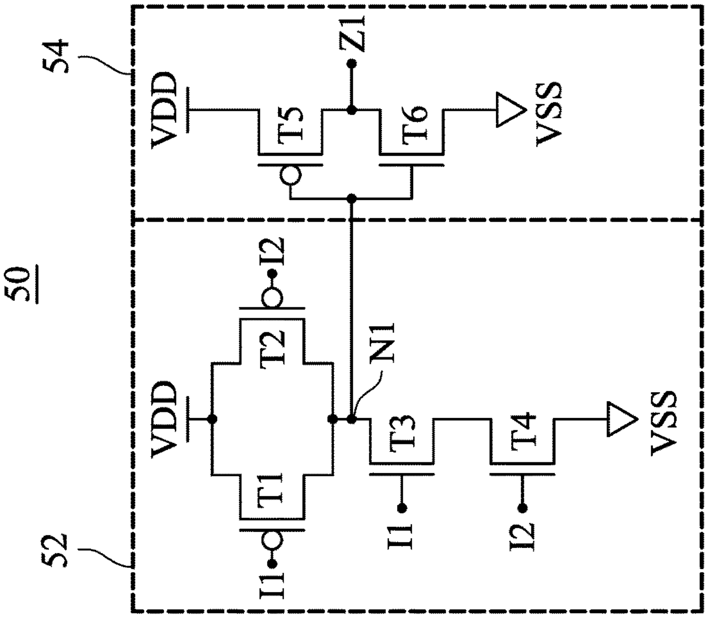
FIG. 5C is a schematic diagram of a circuit, in accordance with some embodiments of the present disclosure.
Figure 5A:
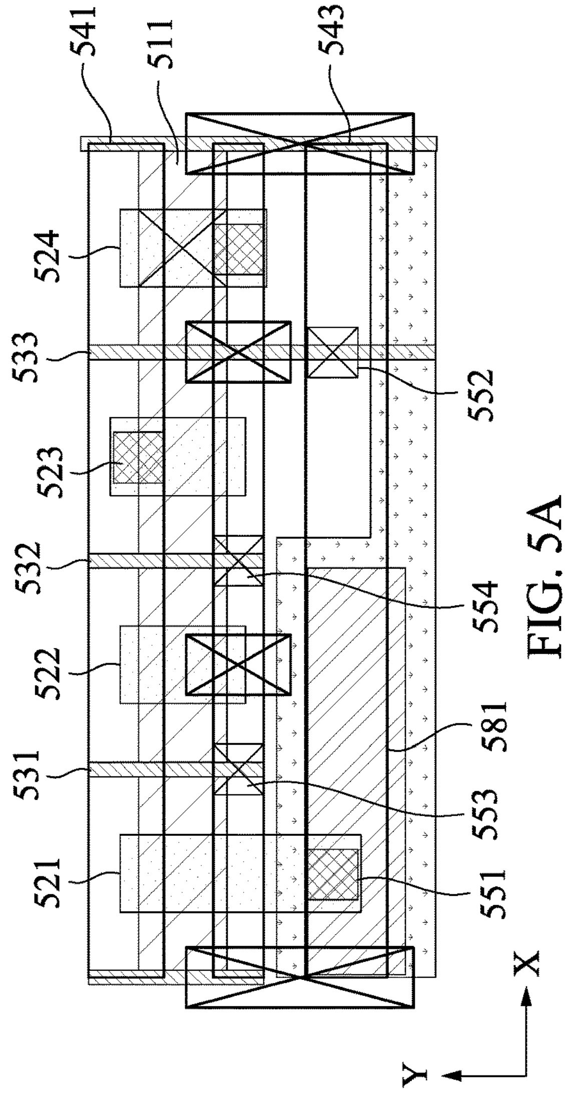
FIG. 5A is a layout diagram in a plan view of a front portion of the circuit in FIG. 5C, in accordance with some embodiments of the present disclosure.
Figure 5B:
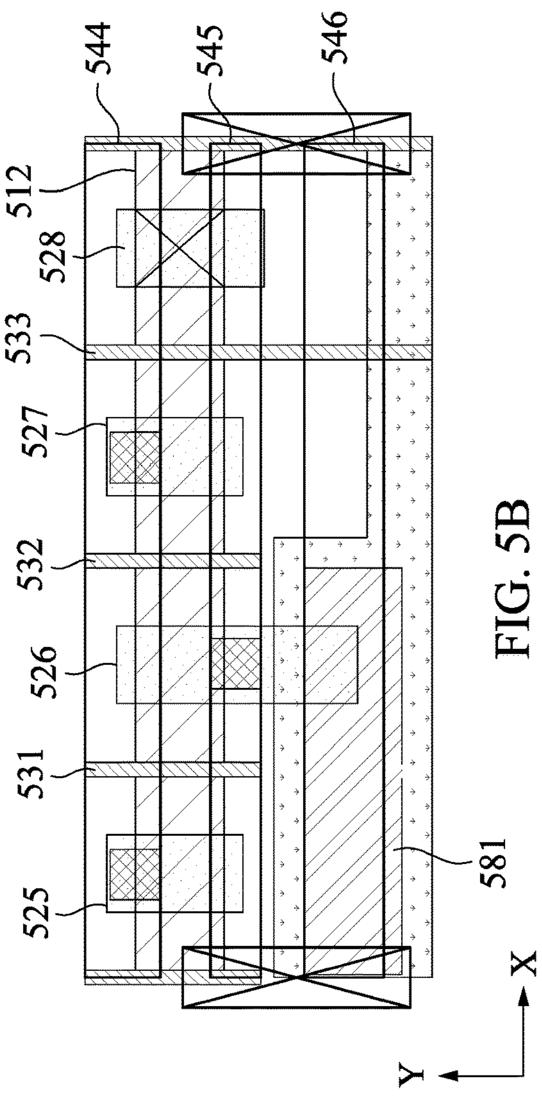
FIG. 5B is a layout diagram in a plan view of a back portion of the circuit in FIG. 5C, in accordance with some embodiments of the present disclosure.

Reference is now made to FIGS. 5A-5C. FIG. 5C is a schematic diagram of a circuit 50, in accordance with some embodiments of the present disclosure. FIG. 5A is a layout diagram in a plan view of a front portion of the circuit 50 in FIG. 5C, in accordance with some embodiments of the present disclosure. FIG. 5B is a layout diagram in a plan view of a back portion of the circuit 50 in FIG. 5C, in accordance with some embodiments of the present disclosure.

For illustration of FIG. 5C, the circuit 50 includes sub-circuits 52 and 54. The sub-circuit 52 is configured as a NAND gate and includes P-type transistors T1-T2 and N-type transistors T3-T4. The transistors T1-T2 are coupled in parallel and coupled between a power rail providing a relatively higher supply voltage VDD and a node N1, and the transistors T3-T4 are coupled in series and coupled between the node N1 and a power rail providing a relatively lower supply voltage VSS.

For illustration, the gates of the transistors T1 and T3 are both coupled to an input terminal I1, and the gates of the transistors T2 and T4 are both coupled to an input terminal I2.

For illustration, the sub-circuit 54 is configured as an inverter and includes transistors T5-T6. The transistors T5-T6 are coupled in series and coupled between the power rails respectively providing the supply voltages VDD and VSS. The gates of the transistors T5-T6 are both coupled to the node N1 to receive the signal of the node N1. The drain terminal of the transistor T5 and the drain terminal of the transistor T6 are both coupled to an output terminal Z1.

In FIGS. 5A-5C, the conductive segment 525 corresponds to the source terminal of the transistor T1, the conductive segment 527 corresponds to the source terminal of the transistor T2, the conductive segment 526 corresponds to the drain terminals of the transistors T1-T2 coupled together, the conductive segment 521 corresponds to the drain terminal of the transistor T3, the conductive segment 522 corresponds to the source terminal of the transistor T3 and the drain terminal of the transistor T4 that are coupled together, and the conductive segment 523 corresponds to the source terminal of the transistor T4.

As shown in FIG. 5C, the drain terminals of the transistors T1-T3 are coupled together at the node N1. In the configuration of FIGS. 5A-5B where the N-type transistors are stacked over the P-type transistors, the interconnect structure 581 is configured to couple the drain terminals of the transistors T1-T3 with each other. Specifically, the interconnect structure 581 is coupled to the active region 512, which consists of the P-type transistors T1-T2, through the conductive segment 526, and is coupled to the active region 511 included in the N-type transistor T3 through the conductive segment 521.

The gate 531 corresponds to the gates of the transistors T1 and T3, the gate 531 is coupled to a conductive line through the via 553, and the conductive line is configured to transmit voltage or signal for controlling the gates of the transistors T1 and T3. The gate 532 corresponds to the gates of the transistors T2 and T4, the gate 532 is coupled to a conductive line through the via 554, and the conductive line is configured to transmit voltage or signal for controlling the gates of the transistors T2 and T4.

The interconnect structure 581 is further coupled to the conductive line 543 through the via 551. The conductive line 543 is coupled to the gate 533 through the via 552. Thus, the interconnect structure is able to transmit voltage or signal received from the conductive segments 521 and 526 to the gate 533 through the via 551, the conductive line 543, and the via 552. Alternatively stated, in FIGS. 5A-5C, the drain terminals of the transistors T1-T3 are coupled to the gates of the transistors T5-T6 through the interconnect structure 581, and the vias 551-552.

Figure 6C:
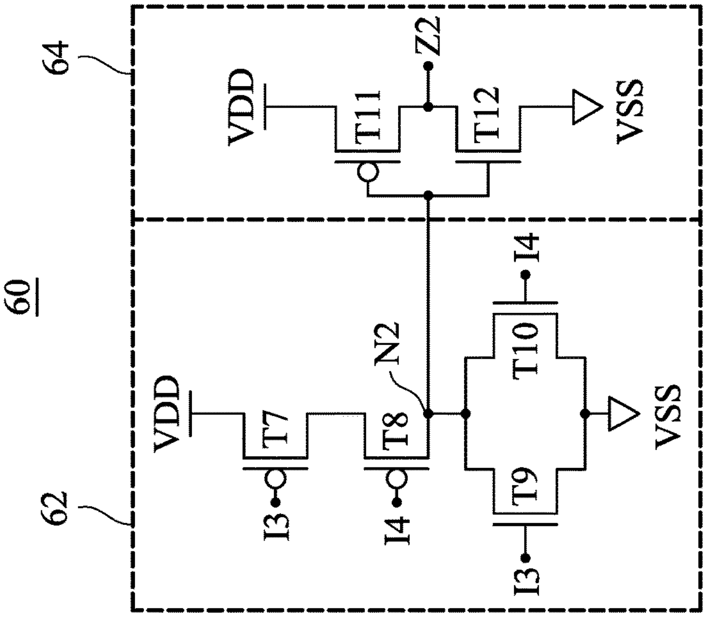
FIG. 6C is a schematic diagram of a circuit, in accordance with some embodiments of the present disclosure.
Figure 6A:
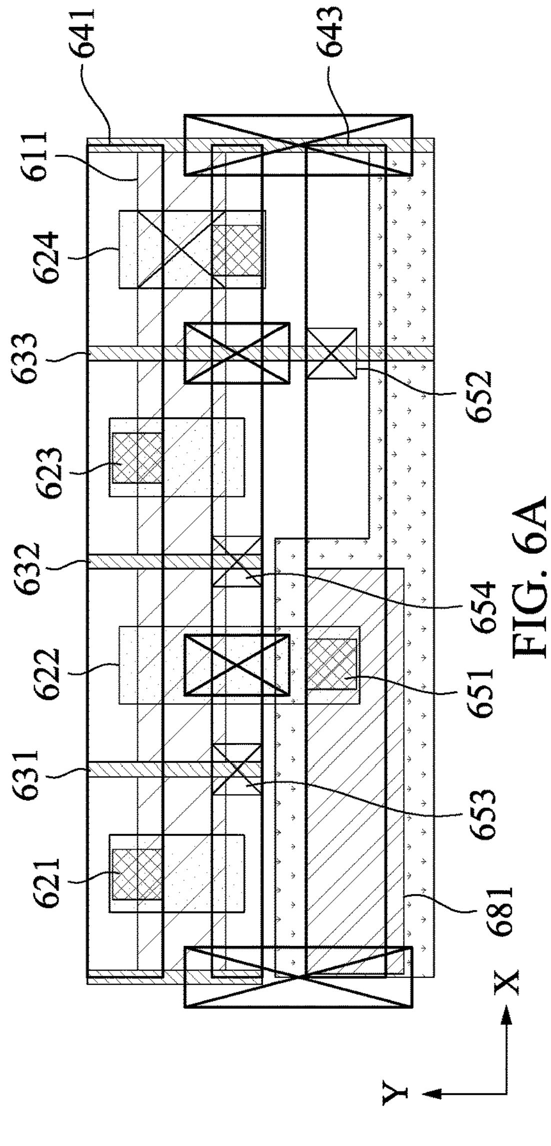
FIG. 6A is a layout diagram in a plan view of a front portion of the circuit in FIG. 6C, in accordance with some embodiments of the present disclosure.
Figure 6B:
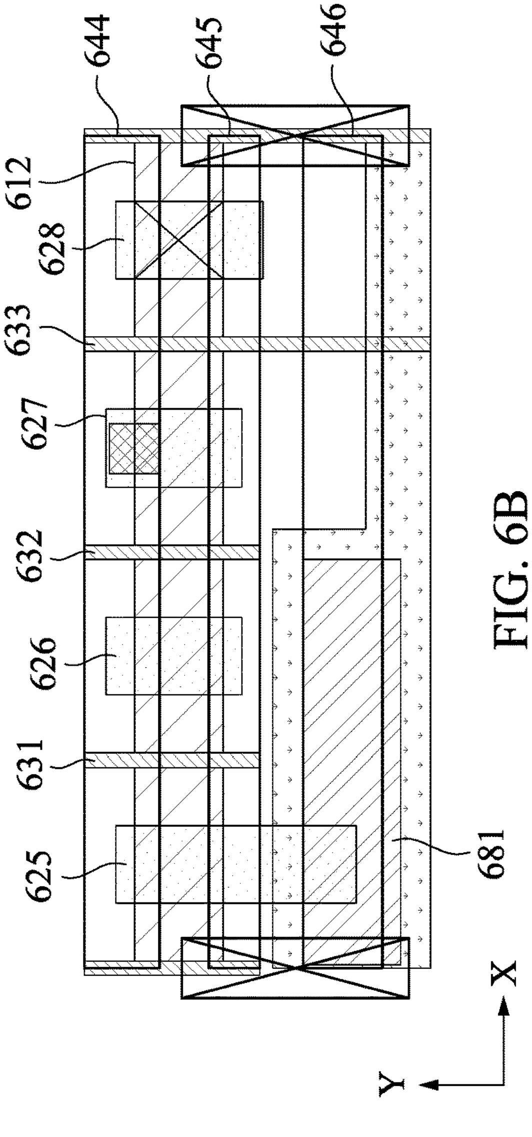
FIG. 6B is a layout diagram in a plan view of a back portion of the circuit in FIG. 6C, in accordance with some embodiments of the present disclosure.

Reference is now made to FIGS. 6A-6C. FIG. 6C is a schematic diagram of a circuit 60, in accordance with some embodiments of the present disclosure. FIG. 6A is a layout diagram in a plan view of a front portion of the circuit 60 in FIG. 6A, in accordance with some embodiments of the present disclosure. FIG. 6B is a layout diagram in a plan view of a back portion of the circuit 60 in FIG. 6A, in accordance with some embodiments of the present disclosure.

The circuit 60 includes sub-circuits 62 and 64. The sub-circuit 62 is configured as a NOR gate and includes P-type transistors T7-T8 and N-type transistors T9-T10. The transistors T7-T8 are coupled in series and coupled between the power rail providing the supply voltage VDD discussed above and a node N2. The transistors T9-T10 are coupled in parallel and between the node N2 and the power rail providing the supply voltage VSS discussed above.

For illustration, the gates of the transistors T7 and T9 are both coupled to an input terminal I3, and the gates of the transistors T8 and T10 are both coupled to an input terminal I4.

For illustration, the sub-circuit 64 is configured as an inverter and includes transistors T11-T12. The transistors T11-T12 are coupled in series and coupled between the power rails respectively providing the supply voltages VDD and VSS. The gates of the transistors T11-T12 are both coupled to the node N2 to receive the signal of the node N2. The drain terminal of the transistor T11 and the drain terminal of the transistor T12 are both coupled to an output terminal Z2.

In FIGS. 6A-6C, the conductive line 627 corresponds to the source terminal of the transistor T7, the conductive line 626 corresponds to the drain terminal of the transistor T7 and the source terminal of the transistor T8, the conductive line 625 corresponds to the drain terminal of the transistor T8, the conductive line 622 corresponds to the drain terminals of the transistors T9-T10, the conductive line 621 corresponds to the source terminal of the transistor T9, and the conductive line 623 corresponds to the source terminal of the transistor T10.

As shown in FIG. 6C, the drain terminals of the transistors T8-T10 are coupled together at the node N2. In the configuration of FIGS. 6A-6B where the N-type transistors are stacked over the P-type transistors, the interconnect structure 681 is configured to couple the drain terminals of the transistors T8-T10 with each other. Specifically, the interconnect structure 681 is coupled to the active region 612 included in the P-type transistor T8 through the conductive segment 625, and is coupled to the active region 611 included in the N-type transistors T7-T8 through the conductive segment 622.

The gate 631 corresponds to the gates of the transistors T7 and T9, the gate 631 is coupled to a conductive line through the via 653, and the conductive line is configured to transmit voltage or signal for controlling the gates of the transistors T7 and T9. The gate 632 corresponds to the gates of the transistors T8 and T10, the gate 632 is coupled to a conductive line through the via 654, and the conductive line is configured to transmit voltage or signal for controlling the gates of the transistors T8 and T10.

The interconnect structure 681 is further coupled to the conductive line 643 through the via 651. The conductive line 643 is coupled to the gate 633 through the via 652. Thus, the interconnect structure 681 can transmit voltage or signal received from the conductive segments 622 and 625 to the gate 633 through the via 651, the conductive line 643, and the via 652. Alternatively stated, in FIGS. 6A-6C, the drain terminals of the transistors T8-T10 are coupled to the gates of the transistors T11-T12 through the interconnect structure 681 and the vias 651-652.

Figure 7C:
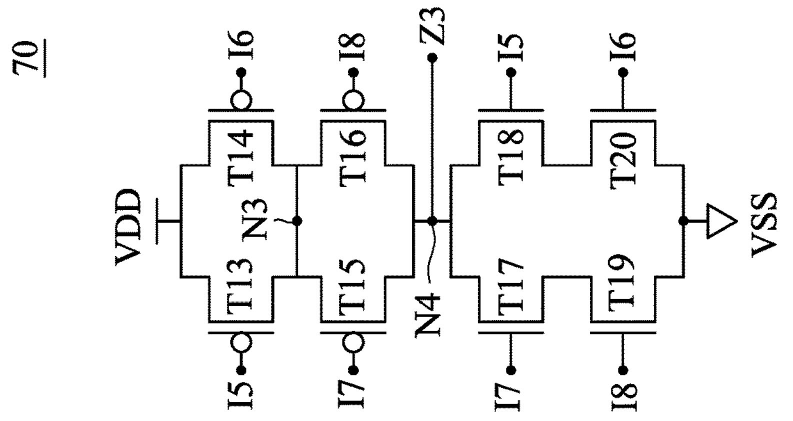
FIG. 7C is a schematic diagram of a circuit, in accordance with some embodiments of the present disclosure.
Figure 7A:
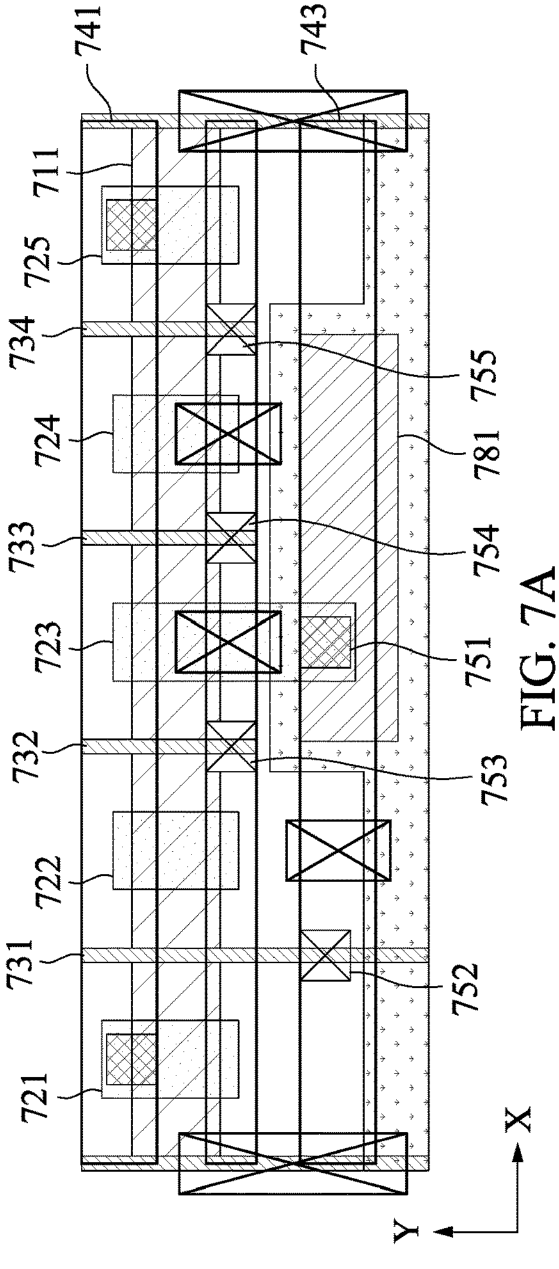
FIG. 7A is a layout diagram in a plan view of a front portion of the circuit in FIG. 7C, in accordance with some embodiments of the present disclosure.
Figure 7B:
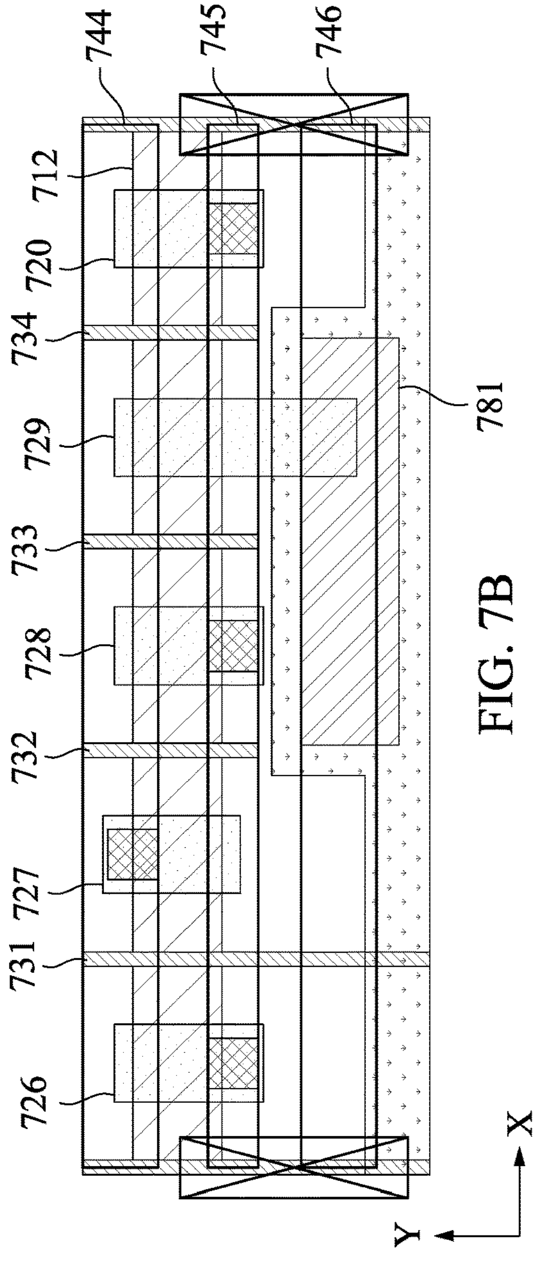
FIG. 7B is a layout diagram in a plan view of a back portion of the circuit in FIG. 7C, in accordance with some embodiments of the present disclosure.

Reference is now made to FIGS. 7A-7C. FIG. 7C is a schematic diagram of a circuit 70, in accordance with some embodiments of the present disclosure. FIG. 7A is a layout diagram in a plan view of a front portion of the circuit 70 in FIG. 7A, in accordance with some embodiments of the present disclosure. FIG. 7B is a layout diagram in a plan view of a back portion of the circuit 70 in FIG. 7A, in accordance with some embodiments of the present disclosure.

The circuit 70 is configured as a logic gate able to perform specific logic operations and includes P-type transistors T13-T16 and N-type transistors T17-T20. The transistors T13-T14 are coupled in parallel and coupled between the power rail providing the supply voltage VDD as discussed above and a node N3. The transistors T15-T16 are coupled in parallel and coupled between the node N3 and a node N4. The transistors T17 and T19 are coupled in series and coupled between the node N4 and the power rail providing the supply voltage VSS as discussed above. The transistors T18 and T20 are coupled in series and coupled between the node N4 and the power rail providing the supply voltage VSS.

For illustration, the gates of the transistors T13 and T18 are both coupled to an input terminal I5, the gates of the transistors T14 and T20 are both coupled to an input terminal I6, the gates of the transistors T15 and T17 are both coupled to an input terminal I7, and the gates of the transistors T16 and T19 are both coupled to an input terminal I8.

In FIGS. 7A-7C, the conductive line 727 corresponds to the source terminals of the transistors T13-T14, the conductive line 726 corresponds to the drain terminal of the transistor T14, the conductive line 728 corresponds to the drain terminal of the transistor T13 and the source terminal of the transistor T15, the conductive line 720 corresponds to the source terminal of the transistor T16, the conductive line 729 corresponds to the drain terminals of the transistors T15-16, the conductive line 723 corresponds to the drain terminals of the transistors T17-18, the conductive line 724 corresponds to the source terminal of the transistor T17 and the drain terminal of the transistor T19, the conductive line 725 corresponds to the source terminal of the transistor T19, the conductive line 722 corresponds to the source terminal of the transistor T18 and the drain terminal of the transistor T20, and the conductive line 721 corresponds to the source terminal of the transistor T20.

As shown in FIG. 7C, the drain terminals of the transistors T15-T18 are coupled together at the node N4. In the configuration of FIGS. 7A-7B where the N-type transistors are stacked over the P-type transistors, the interconnect structure 781 is configured to couple the drain terminals of the transistors T15-T18 with each other. Specifically, the interconnect structure 781 is coupled to the active region 712 included in the P-type transistors T15-T16 through the conductive segment 729, and is coupled to the active region 711 included in the N-type transistors T17-T18 through the conductive segment 723.

The gate 731 corresponds to the gates of the transistors T14 and T20, the gate 631 is coupled to a conductive line through the via 752, and the conductive line is configured to transmit voltage or signal for controlling the gates of the transistors T14 and T20. The gate 732 corresponds to the gates of the transistors T13 and T18, the gate 732 is coupled to a conductive line through the via 753, and the conductive line is configured to transmit voltage or signal for controlling the gates of the transistors T13 and T18. The gate 733 corresponds to the gates of the transistors T15 and T17, the gate 733 is coupled to a conductive line through the via 754, and the conductive line is configured to transmit voltage or signal for controlling the gates of the transistors T15 and T17. The gate 734 corresponds to the gates of the transistors T16 and T19, the gate 734 is coupled to a conductive line through the via 755, and the conductive line is configured to transmit voltage or signal for controlling the gates of the transistors T16 and T19.

In the configurations of the circuits 50, 60, and 70 as shown in FIGS. 5A-7C, the interconnect structure 581, 681, and 781 are configured for the stacked N-type and P-type transistors to couple signals that are misaligned in the layout view. For example, the interconnect structure 581 is configured to couple the signals respectively received from the conductive segments 521 and 526 which are not aligned in the Z direction. Thus, the interconnect structure disclosed in these embodiments is able to transmit misaligned signals vertically with low resistance.

Above describe how the interconnect structure disclosed herein can be used for coupling misaligned signals. Below discuss how to generate layout designs of integrated circuits with such interconnect structures.

Figure 8:
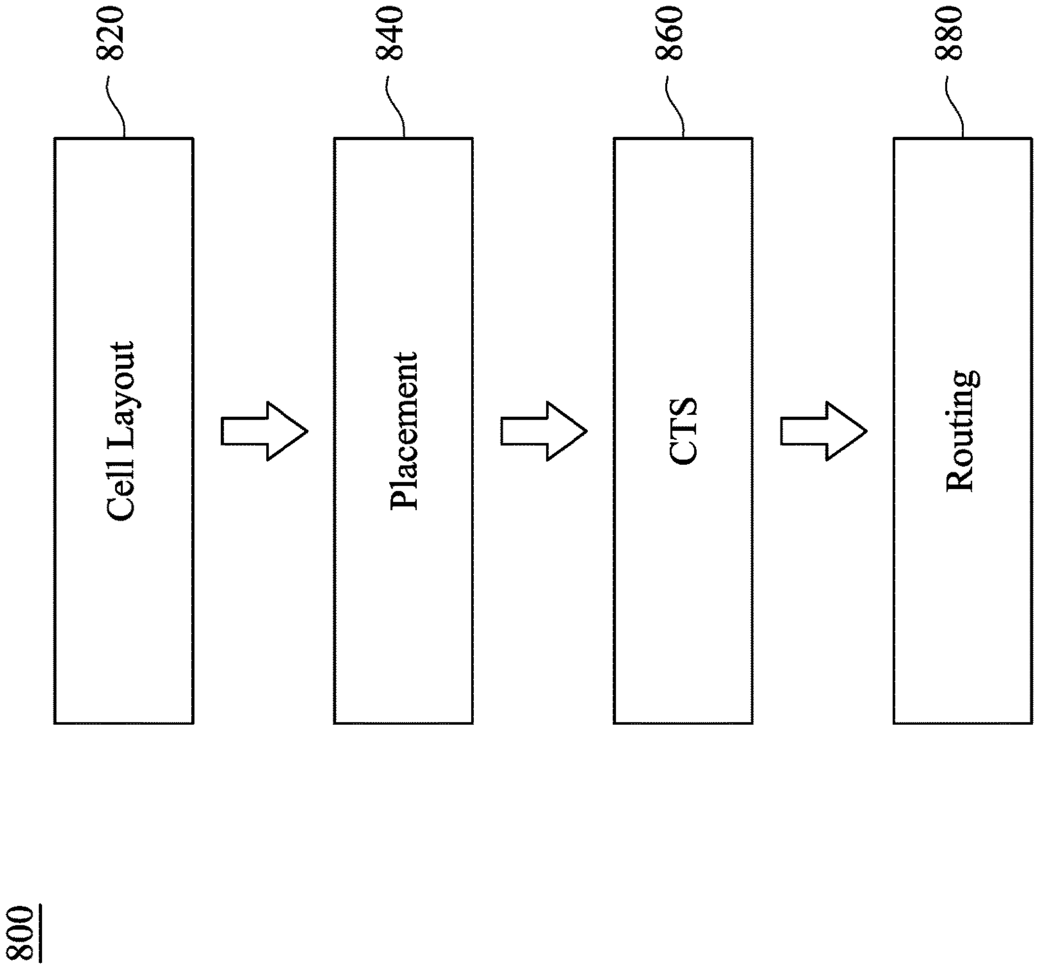
FIG. 8 is a flowchart of a method 800 for designing an integrated circuit, in accordance with some embodiments of the present disclosure.

Reference is now made to FIG. 8. FIG. 8 is a flowchart of a method 800 for designing an integrated circuit, in accordance with some embodiments of the present disclosure. The method 800 includes operations 820-880. In the operation 820, the layout of cell(s) corresponding to an integrated circuit is determined. During the operation 820, different design rules can be involved in deciding the layout of cell(s), such as rules regarding whether each of the cells can be flipped horizontally or vertically.

For illustration, in the operation 840, the placement of the cells corresponding to the integrated circuit is determined. During the operation 840, different design rules are involved in deciding the placement of cells, such as rules regarding whether the cells with certain boundaries can abut with each other.

For illustration, in the operation 860, clock tree synthesis (CTS) is performed, in order to synthesize the components in different cells.

For illustration, in the operation 880, routing for the integrated circuit is performed.

Figure 9A:
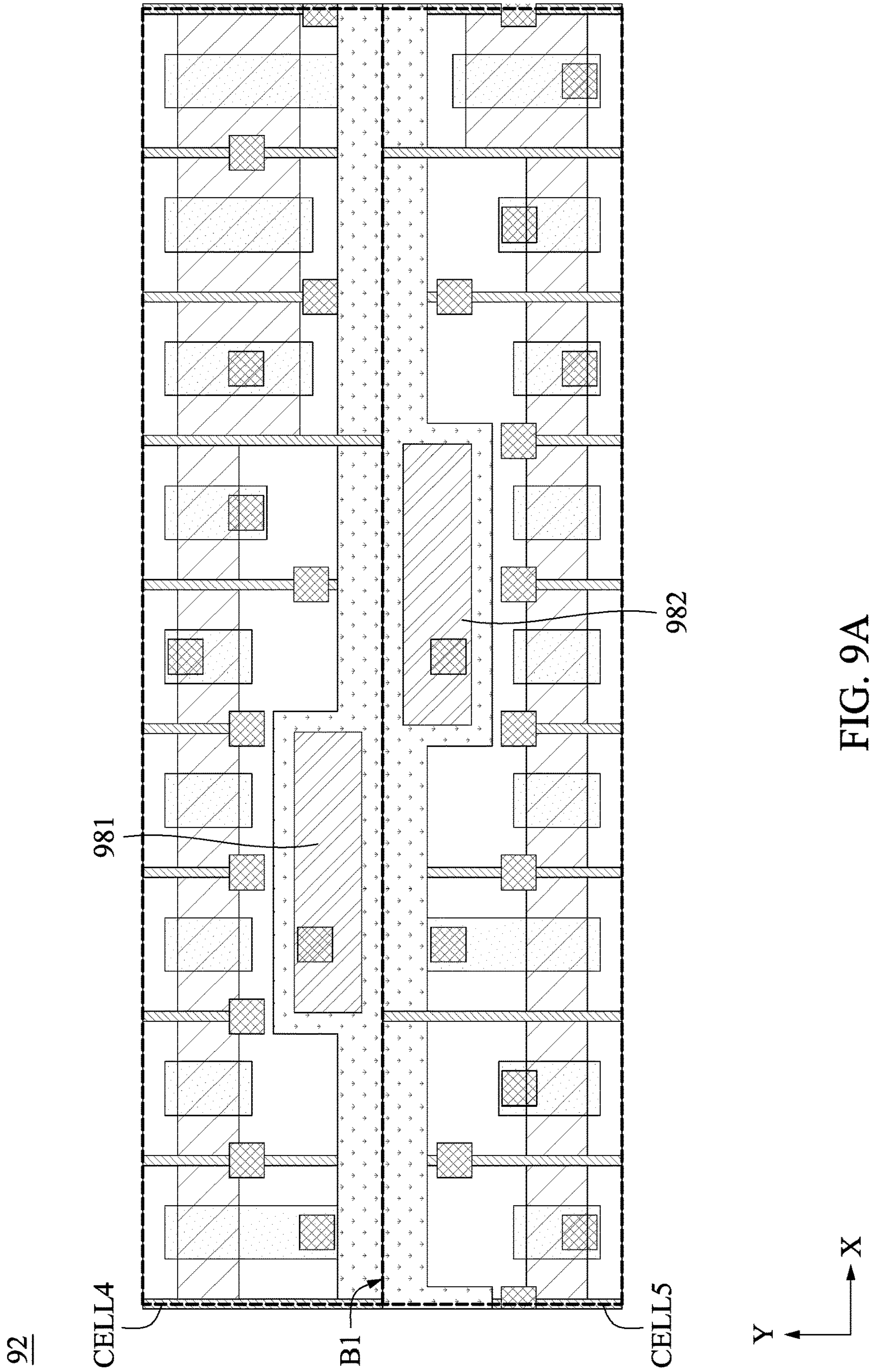
FIG. 9A is a layout diagram in a plan view of a front portion of an integrated circuit, in accordance with some embodiments of the present disclosure.
Figure 9B:
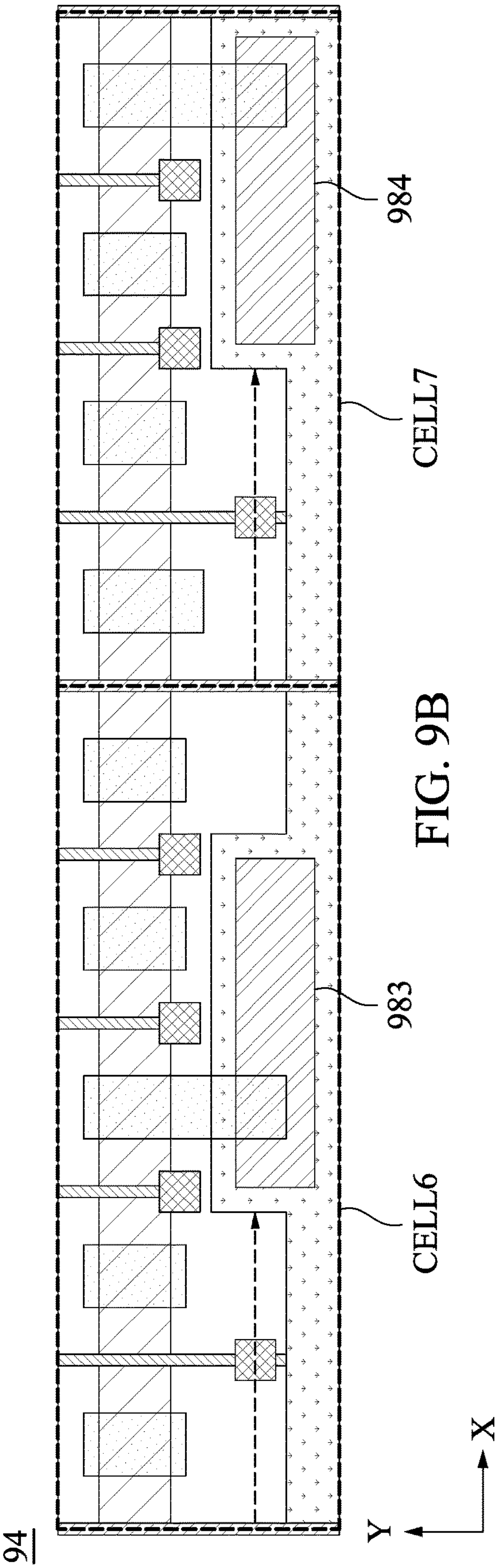
FIG. 9B is a layout diagram in a plan view of a front portion of an integrated circuit, in accordance with some embodiments of the present disclosure.
Figure 9C:
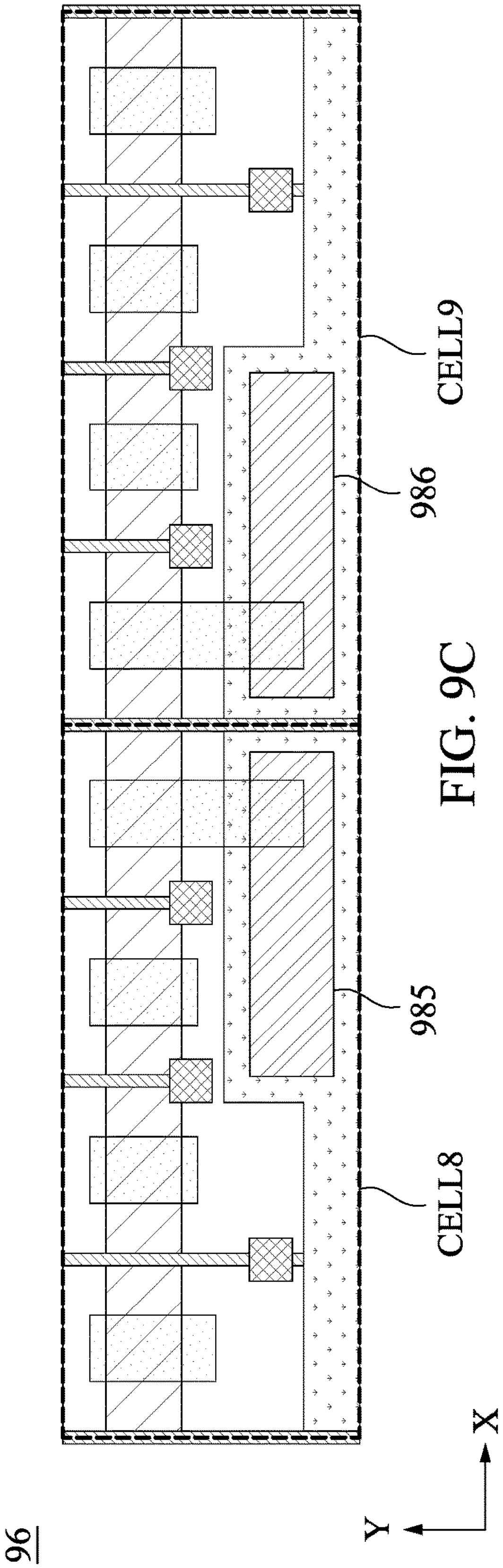
FIG. 9C is a layout diagram in a plan view of a front portion of an integrated circuit, in accordance with some embodiments of the present disclosure.

Reference is now made to FIGS. 9A-9C. FIGS. 9A-9C are layout diagrams in a plan view of front portions of integrated circuits 92, 94, and 96, in accordance with some embodiments of the present disclosure. Different design rules are involved in designing the cell layouts of the integrated circuits 92, 94, and 96.

For illustration, since each cell of the integrated circuits 92, 94, and 96 includes an interconnect structure, the layouts of the integrated circuits 92, 94, and 96 are to be designed in a way that the interconnect structures of different cells are separate from each other, in order to prevent electrical short or unintended signal transmission between two interconnect structures.

In FIG. 9A, the integrated circuit 92 includes cells CELL4-CELL5. The cell CELL4 includes an interconnect structure 981 arranged at the lower boundary of the cell CELL4, that is, at a boundary B1. The cell CELL5 includes an interconnect structure 982 arranged at the upper boundary of the cell CELL5, that is, at the boundary B1. Because the interconnect structures 981-982 are arranged at the same boundary B1 and are close to each other, electrical short can happen between them. To avoid such problem, design rules should be applied, such as a design rule requiring that the interconnect structures 981-982 should be arranged both at the lower (or upper) boundaries of the cells CELL4-CELL5, and that the cells CELL4-CELL5 cannot be flipped vertically (along the X axis) when designing the layout of the integrated circuit 92.

In FIG. 9B, the integrated circuit 94 includes cells CELL6-CELL7. The cell CELL7 abuts the cell CELL6 on the left boundary of the cell CELL7 (or, the right boundary of the cell CELL6) along the X direction. The cell CELL6 includes an interconnect structure 983. The cell CELL7 includes an interconnect structure 984. The interconnect structures 983-984 are arranged in the same row along the X direction.

In some embodiments, design rules are considered and implemented in deciding the layout of the integrated circuit 94, such as a design rule requiring that one side (e.g., right side) of the interconnect structure 984 is arranged to be close to or aligned with the right boundary of the cell CELL7, which is the opposite of the left boundary of the cell CELL7, so that the interconnect structure 984 is away from the left boundary where the cells CELL6-7 abut with each other and electrical short between the interconnect structures 983-984 can be prevented.

In some embodiments, different design rules are implemented in deciding the layout of the integrated circuit 94, such as a design rule requiring that, on the condition that the cells CELL6-CELL7 abut with each other, the interconnect structures 983-984 of the cells CELL6-CELL7 are both arranged to be close to or aligned with the right boundaries (or the left boundaries) of the cells CELL6-CELL7.

In FIG. 9C, the integrated circuit 96 includes the cells CELL8-CELL9, which abut with each other along the X direction. The cell CELL8 includes an interconnect structure 985, and the cell CELL9 includes an interconnect structure 986. The interconnect structures 985-986 abut with each other, and electrical short can happen between them. To avoid or fix such problem, design rules should be applied in deciding the layout of the integrated circuit 96, such as design rules requiring that the interconnect structures 985-986 are arranged to be close to or aligned with the right boundaries (or the left boundaries) of the cells CELL8-CELL9, and that one of the cells CELL8-CELL9 cannot be flipped horizontally (that is, flipped along the Y axis).

Figure 10A:
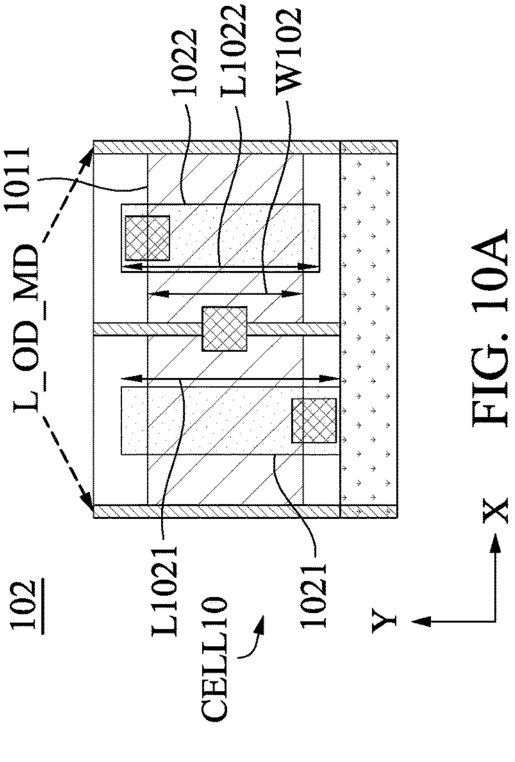
FIG. 10A is a layout diagram in a plan view of a front portion of an integrated circuit, in accordance with some embodiments of the present disclosure.
Figure 10B:
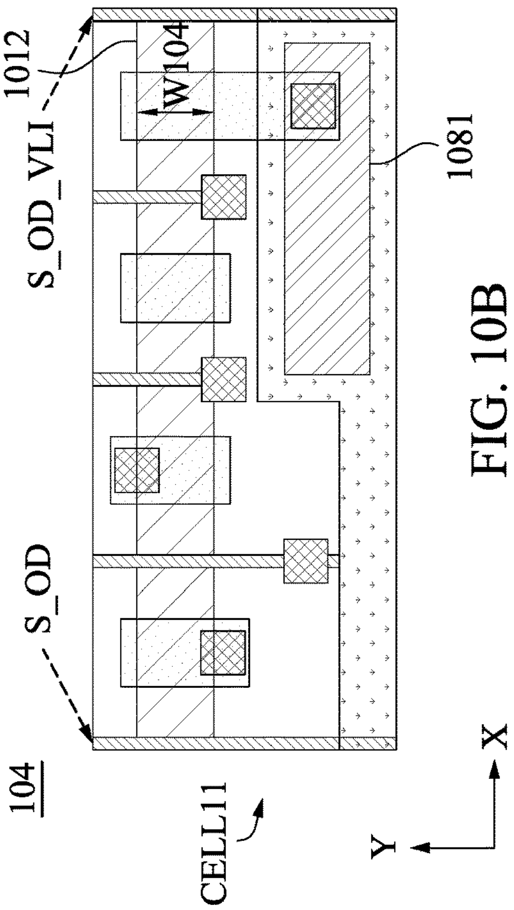
FIG. 10B is a layout diagram in a plan view of a front portion of an integrated circuit, in accordance with some embodiments of the present disclosure.
Figure 10C:
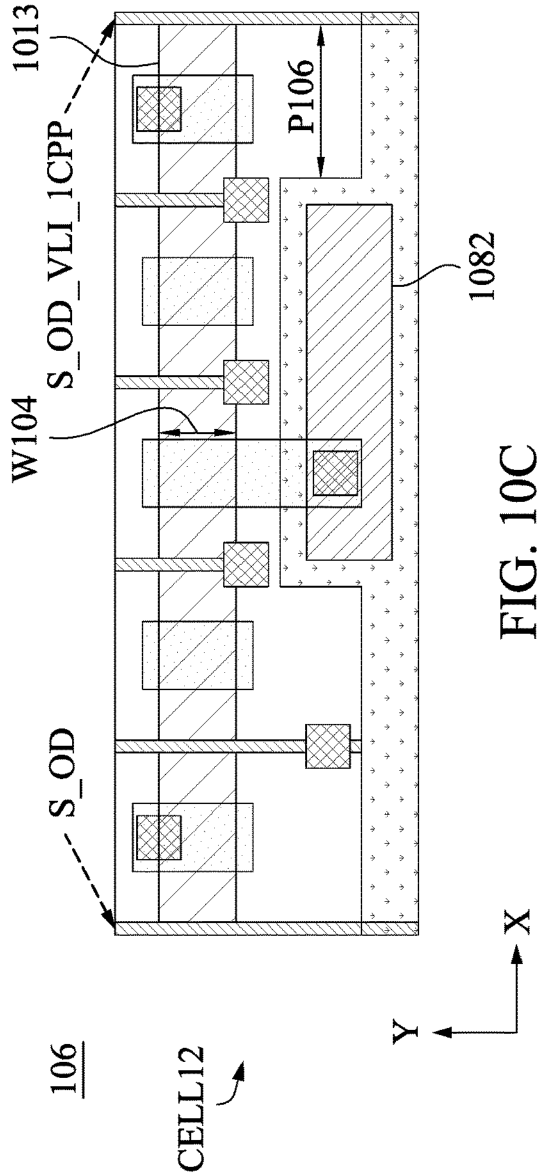
FIG. 10C is a layout diagram in a plan view of a front portion of an integrated circuit, in accordance with some embodiments of the present disclosure.

Reference is now made to FIGS. 10A-10C. FIGS. 10A-10C are layout diagrams in a plan view of front portions of integrated circuits 102, 104, and 106, in accordance with some embodiments of the present disclosure.

As shown in FIG. 10A, an active region 1011 of the integrated circuit 102 has a large width W102 along the Y direction, and conductive segments 1021-1022 have large lengths L1021-L1022 along the Y direction too. For the purpose of illustration, the left and right boundaries of the cell CELL10 are denoted as L_DO_MD, which indicates that there exists active region with large width or conductive segment with large length at the boundaries.

As shown FIG. 10B, an active region 1012 of the integrated circuit 104 has a small width W104 along the Y direction, and the integrated circuit 104 has an interconnect structure 1081. For the purpose of illustration, the left boundary of the cell CELL11 is denoted as S_OD, which indicates that there exists active region with small width at the boundary, and the right boundary of the cell CELL11 is denoted as S_OD_VLI, which indicates that there exists active region with small width and an interconnect structure (e.g., the interconnect structure 1081) at the boundary.

As shown FIG. 10C, an active region 1013 of the integrated circuit 106 has a small width W104 along the Y direction, and the integrated circuit 104 has an interconnect structure 1082, which is arranged to be separate from the right boundary of the cell CELL12 approximately by a pitch P106. The pitch P106 is the distance between two of the gates in the cell CELL12. For the purpose of illustration, the left boundary of the cell CELL12 is denoted as S_OD, which indicates that there exists active region with small width at the boundary, and the right boundary of the cell CELL12 is denoted as S_OD_VLI_1CPP, which indicates that there exists active region with small width at the boundary and an interconnect structure (e.g., the interconnect structure 1081) separate from the boundary by a pitch (e.g., the pitch P106), which is the distance between two of the gates in the cell.

In some embodiments, the cells CELL10-CELL12 are placed in a same layout, and different design rules have to be considered when placing the cells CELL10-CELL12, in order to prevent electrical short between interconnect structure(s), active region, and/or conductive segment. For example, the boundary denoted as L_OD_MD (e.g., the left and right boundaries of the cell CELL10) cannot abut the boundary denoted as S_OD_VLI (e.g., the right boundary of the cell CELL11), since the active region with large width (e.g., the active region 1011) or conductive segment with large length (e.g., the conductive segments 1021-1022) can contact the interconnect structure (e.g., the interconnect structure 1081), causing electrical short.

In some embodiments, the boundary denoted as L_OD_MD (e.g., the left and right boundaries of the cell CELL10) cannot abut the boundary denoted as S_OD_VLI_1CPP (e.g., the right boundary of the cell CELL12) as well, in order to prevent the interconnect structure (e.g., the interconnect structure 1082) from accidentally contact the active region with large width (e.g., the active region 1011) or conductive segment with large length (e.g., the conductive segments 1021-1022) during the process of making the interconnect structure.

In some embodiments, the boundary denoted as S_OD_VLI (e.g., the right boundary of the cell CELL11) cannot abut the boundary denoted as S_OD_VLI (e.g., the right boundary of the cell CELL11), since two interconnect structures will contact with each other and cause electrical short.

In some embodiments, the boundary denoted as S_OD_VLI (e.g., the right boundary of the cell CELL11) cannot abut the boundary denoted as S_OD_VLI_1CPP (e.g., the right boundary of the cell CELL12) as well, since two interconnect structures (e.g., the interconnect structures 1081-1082) may accidentally contact with other during the process of making them.

Figure 11A:
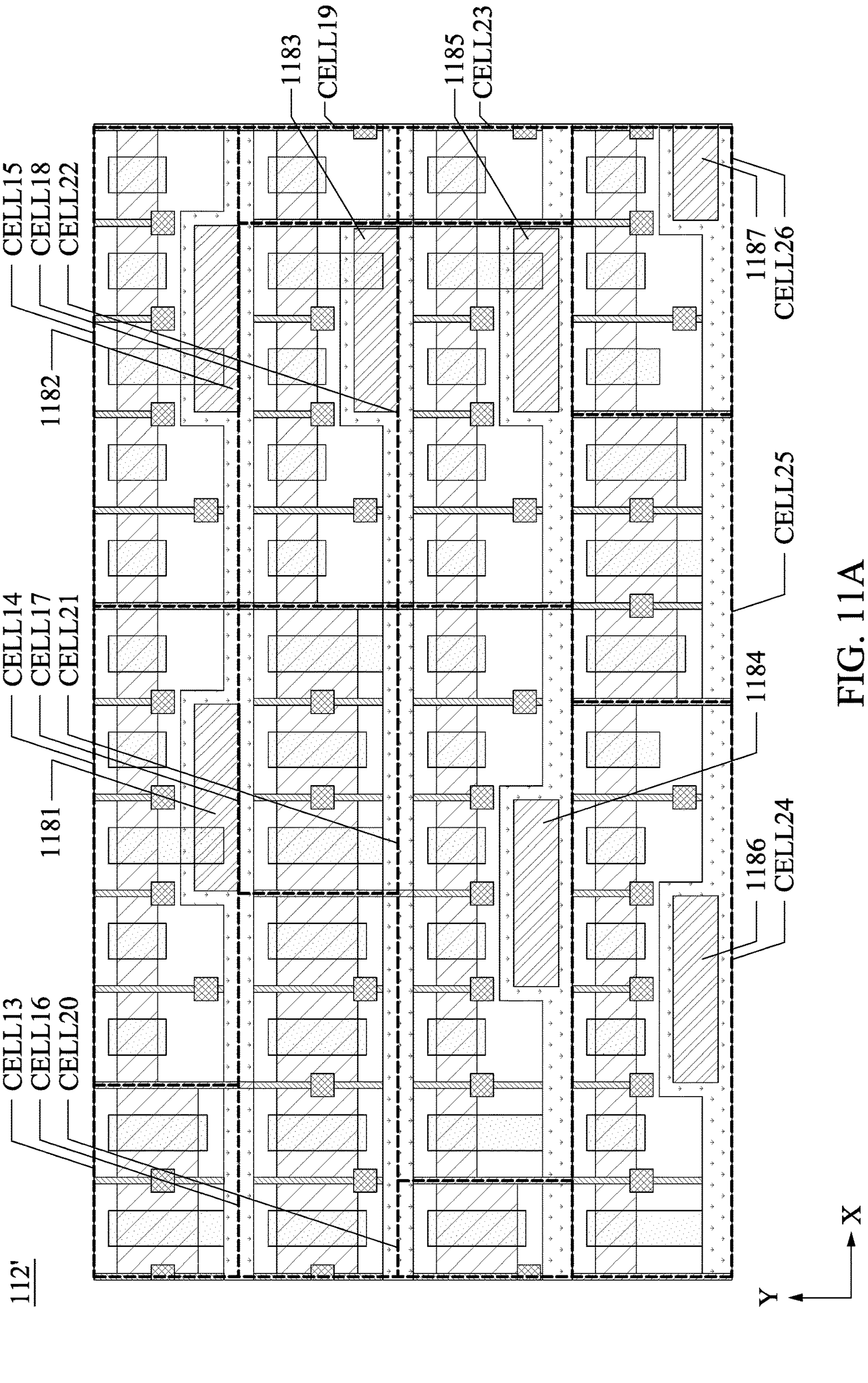
FIG. 11A is a layout diagram in a plan view of a front portion of an integrated circuit, in accordance with some embodiments of the present disclosure.

Reference is now made to FIG. 11A. FIG. 11A is a layout diagram in a plan view of a front portion of an integrated circuit 112', in accordance with some embodiments of the present disclosure. The integrated circuit 112' includes cells CELL13-CELL26, which abut with each other along the X or Y direction. Multiple interconnect structures are included in the integrated circuit 112', for example, the interconnect structure 1181 in the cell CELL14, the interconnect structure 1182 in the cell CELL15, the interconnect structure 1183 in the cell CELL18, the interconnect structure 1184 in the cell CELL21, the interconnect structure 1185 in the cell CELL22, the interconnect structure 1186 in the cell CELL24, and the interconnect structure 1187 in the cell CELL26.

Different design rules discussed with respect to FIGS. 8-10C are implemented in designing the layout of the integrated circuit 112' in FIG. 11A, such as the design rules requiring that the interconnect structures 1181-1187 are all arranged on the lower boundaries of the cells, that the cells with interconnect structures (e.g., the cells CELL14-CELL15, CELL18, CELL21-22, CELL24, and CELL26) cannot be flipped vertically (that is, along the X axis), that the interconnect structures 1181-1187 are arranged to close to or align the right boundaries of the cells, and/or that the cells with the boundaries denoted as L_OD_MD (e.g., the right boundaries of the cells CELL13, CELL16, CELL17, CELL20, and CELL25) cannot abut the boundary denoted as S_OD_VLI (e.g., the right boundaries of the cells CELL18, CELL22, and CELL 26) or S_OD_VLI_1CPP (e.g., the right boundaries of the cells CELL14-CELL15).

Figure 11B:
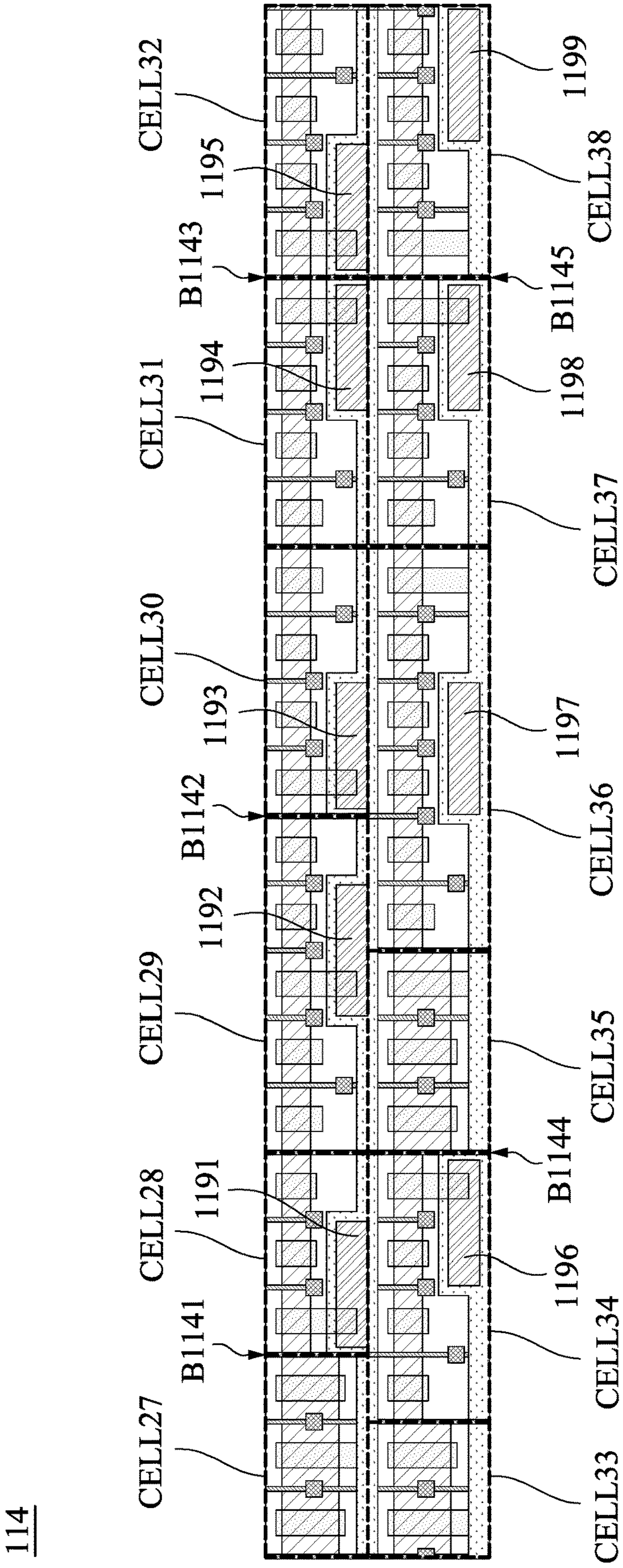
FIG. 11B is a layout diagram in a plan view of a front portion of an integrated circuit, in accordance with some embodiments of the present disclosure.

Reference is now made to FIG. 11B. FIG. 11B is a layout diagram in a plan view of a front portion of an integrated circuit 114, in accordance with some embodiments of the present disclosure. The integrated circuit 114 includes cells CELL27-38, which abut with each other along the X and/or Y direction. Multiple interconnect structures are included in the integrated circuit 114, for example, the interconnect structure 1191 in the cell CELL28, the interconnect structure 1192 in the cell CELL29, the interconnect structure 1193 in the cell CELL30, the interconnect structure 1194 in the cell CELL31, the interconnect structure 1195 in the cell CELL32, the interconnect structure 1196 in the cell CELL34, the interconnect structure 1197 in the cell CELL36, the interconnect structure 1198 in the cell CELL37, and the interconnect structure 1199 in the cell CELL38.

The design rules discussed with respect to FIG. 11A are not implemented in designing the layout of the integrated circuit 114 in FIG. 11B, and multiple issues may arise at the boundaries of different cells of the integrated circuit 114. At the boundary B1141, the active region or conductive segment of the cell CELL27 may contact the interconnect structure 1191 of the cell CELL28. At the boundary B1142, the interconnect structures 1192-1193 may contact with each other accidentally during the process of making them. At the boundary B1143, the interconnect structures 1194-1195 contact with each other. At the boundary B1144, the active region or conductive segment of the cell CELL35 may contact the interconnect structure 1196 of the cell CELL34. At the boundary B1145, the conductive segment of the cell CELL38 may contact the interconnect structure 1198 of the cell CELL37 during the process of making the interconnect structure 1198.

Figure 12A:
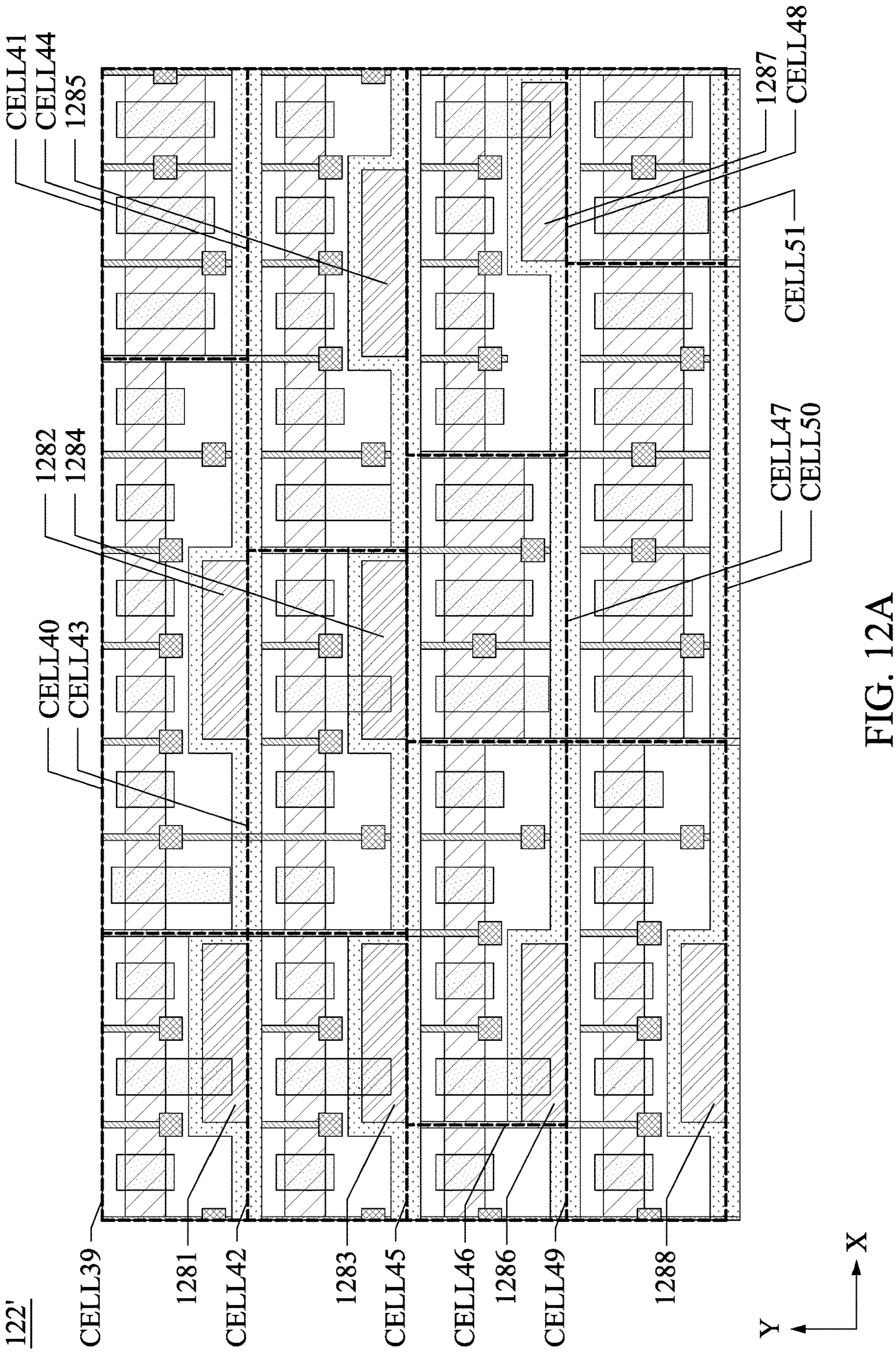
FIG. 12A is a layout diagram in a plan view of a front portion of an integrated circuit, in accordance with some embodiments of the present disclosure.

Reference is now made to FIG. 12A. FIG. 12A is a layout diagram in a plan view of a front portion of an integrated circuit 122', in accordance with some embodiments of the present disclosure. The integrated circuit 122' includes cells CELL39-CELL51, which abut with each other along the X and/or Y direction. Multiple interconnect structures are included in the integrated circuit 122', for example, the interconnect structure 1281 in the cell CELL39, the interconnect structure 1282 in the cell CELL40, the interconnect structure 1283 in the cell CELL42, the interconnect structure 1284 in the cell CELL43, the interconnect structure 1285 in the cell CELL44, the interconnect structure 1286 in the cell CELL46, the interconnect structure 1287 in the cell CELL48, and the interconnect structure 1288 in the cell CELL49.

Different design rules discussed with respect to FIGS. 8-10C are implemented in designing the layout of the integrated circuit 122' in FIG. 12A, such as the design rules requiring that the interconnect structures 1281-1288 are all arranged on the lower boundaries of the cells, that the cells with interconnect structures (e.g., the cells CELL39-CELL40, CELL42-CELL44, CELL46, and CELL48-CELL49) cannot be flipped vertically (that is, along the X axis), and/or that the cells with the boundaries denoted as L_OD_MD (e.g., the left boundaries of the cells CELL40 and CELL44, the left and right boundaries of the cells CELL41, CELL47, and CELL50-CELL51) cannot abut the boundary denoted as S_OD_VLI (e.g., the right boundaries of the cells CELL39, CELL42-CELL43, and CELL48) or S_OD_VLI_1CPP (e.g., the left boundaries of the cells CELL39 and CELL42).

Figure 12B:
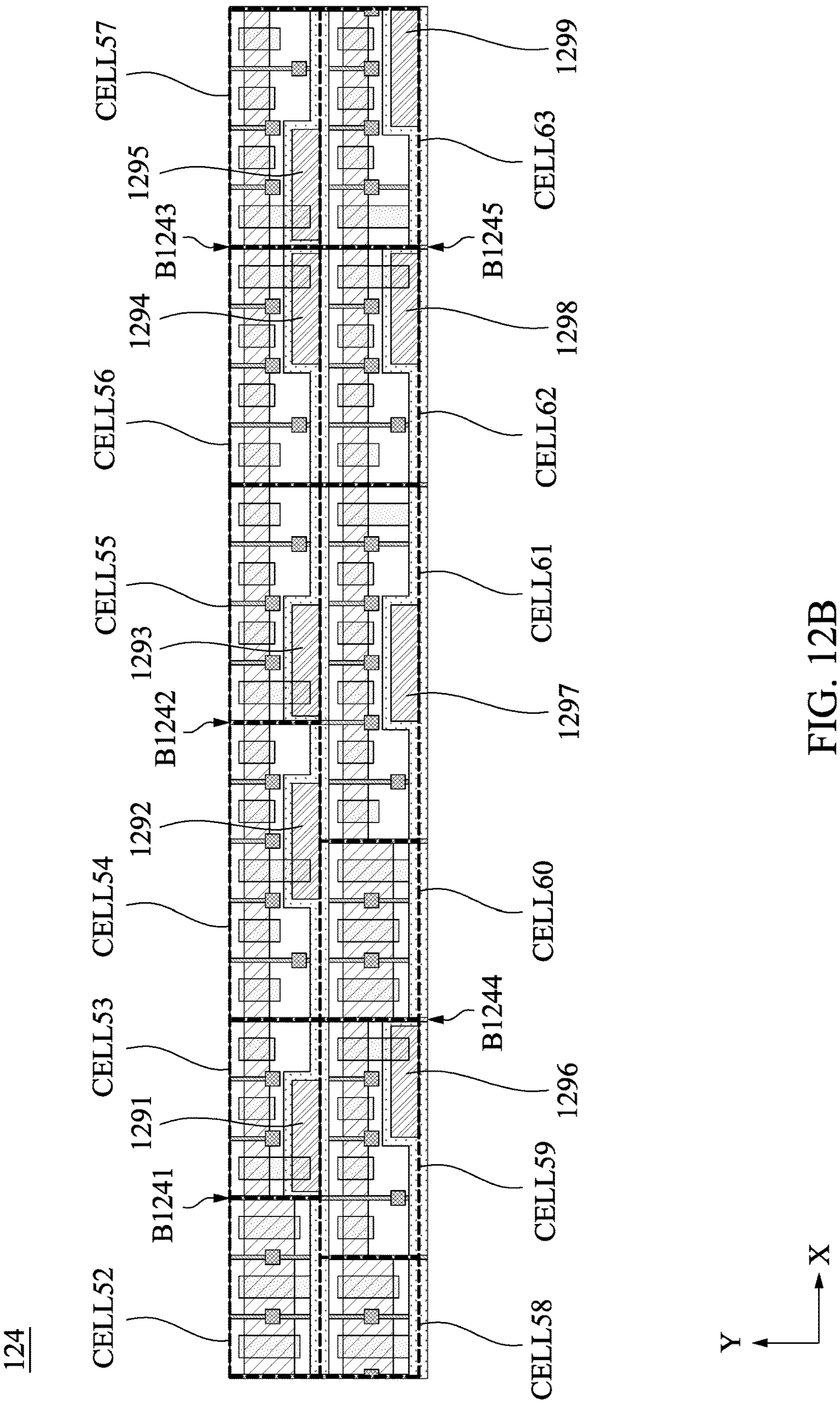
FIG. 12B is a layout diagram in a plan view of a front portion of an integrated circuit, in accordance with some embodiments of the present disclosure.

Reference is now made to FIG. 12B. FIG. 12B is a layout diagram in a plan view of a front portion of an integrated circuit 124, in accordance with some embodiments of the present disclosure. The integrated circuit 124 includes cells CELL52-CELL63, which abut with each other along the X and/or Y direction. Multiple interconnect structures are included in the integrated circuit 124, for example, the interconnect structure 1291 in the cell CELL53, the interconnect structure 1292 in the cell CELL54, the interconnect structure 1293 in the cell CELL55, the interconnect structure 1294 in the cell CELL56, the interconnect structure 1295 in the cell CELL57, the interconnect structure 1296 in the cell CELL59, the interconnect structure 1297 in the cell CELL61, the interconnect structure 1298 in the cell CELL62, and the interconnect structure 1299 in the cell CELL63.

The design rules discussed with respect to FIG. 12A are not implemented in designing the layout of the integrated circuit 124 in FIG. 12B, and multiple issues may arise at the boundaries of different cells of the integrated circuit 124. At the boundary B1241, the active region or conductive segment of the cell CELL52 may contact the interconnect structure 1291 of the cell CELL53. At the boundary B1242, the interconnect structures 1292-1293 may contact with each other accidentally during the process of making them. At the boundary B1243, the interconnect structures 1294-1295 contact with each other. At the boundary B1244, the active region or conductive segment of the cell CELL60 may contact the interconnect structure 1296 of the cell CELL59. At the boundary B1245, the conductive segment of the cell CELL63 may contact the interconnect structure 1298 of the cell CELL62 during the process of making the interconnect structure 1298.

Figure 12C:
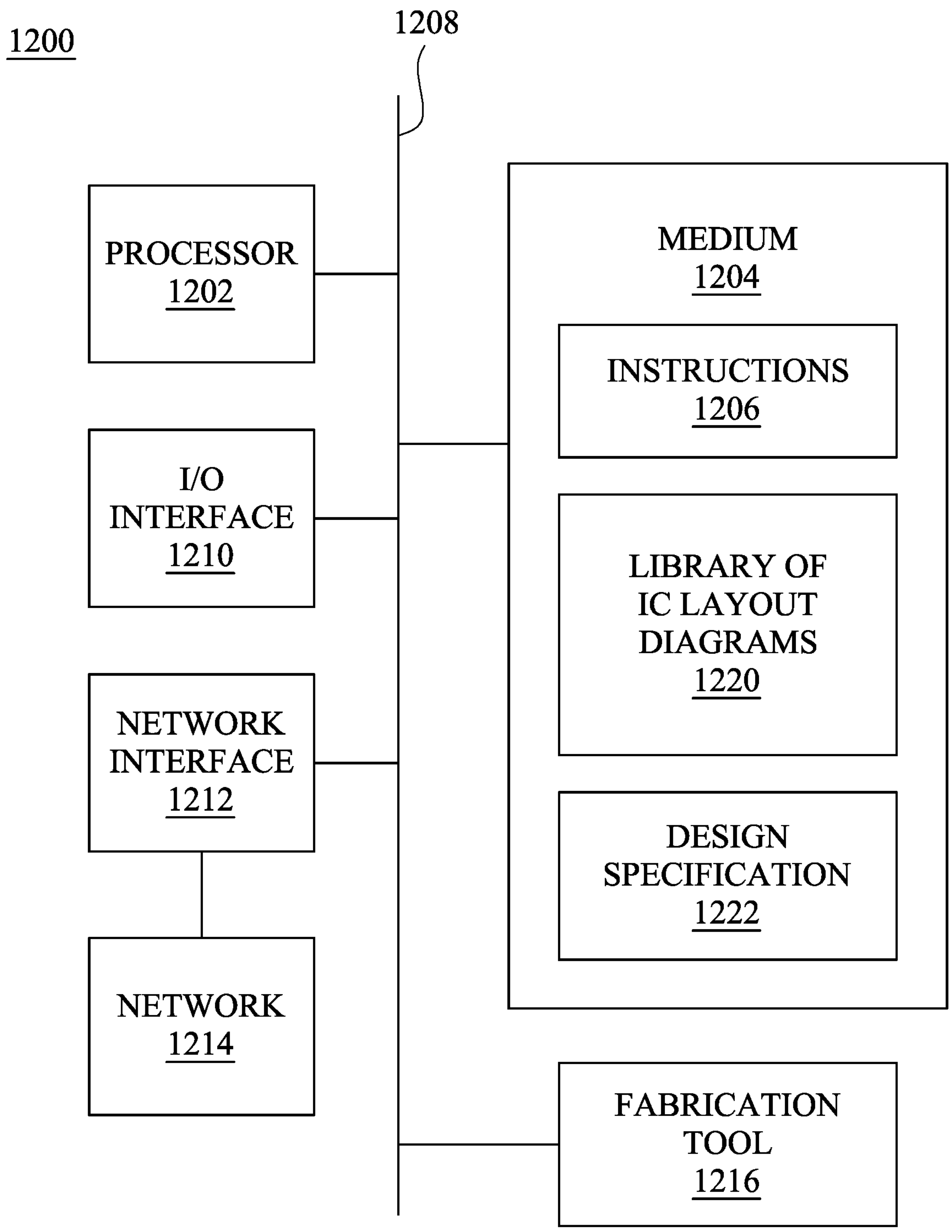
FIG. 12C is a block diagram of an electronic design automation (EDA) system for designing the integrated circuit layout design, in accordance with some embodiments of the present disclosure.

Reference is now made to FIG. 12C. FIG. 12C is a block diagram of an electronic design automation (EDA) system 1200 for designing the integrated circuit layout design, in accordance with some embodiments of the present disclosure. EDA system 1200 is configured to implement one or more operations of the method 800 disclosed in FIG. 8 and generate layout designs of integrated circuits based on the design rules discussed in the embodiments of FIGS. 8-12B. In some embodiments, EDA system 1200 includes an automatic placement and routing (APR) system.

In some embodiments, EDA system 1200 is a general-purpose computing device including a hardware processor 1202 and a non-transitory, computer-readable storage medium 1204. The non-transitory, computer-readable storage medium 1204, amongst other things, is encoded with, i.e., stores, computer program code (instructions) 1206, i.e., a set of executable instructions. Execution of instructions 1206 by the hardware processor 1202 represents (at least in part) an EDA tool which implements a portion or all of, e.g., the method 800.

The non-transitory computer readable medium 1204 is configured to store the set of instructions 1206, the hardware processor 1202 is coupled to the non-transitory computer readable medium 1204 and configured to execute the set of instructions 1206 for generating, based on a set of design rules (e.g., the design rules discussed in the embodiments of FIGS. 8-12B), a layout design of an integrated circuit including multiple cells.

In some embodiments, the hardware processor 1202 is further configured to place a first cell and place a second cell abutting the first cell. The first cell includes a first pair of active regions, a plurality of first gates, and a first interconnect structure. The first pair of active regions extends in a first direction and stacked on each other. The first gates extend in a second direction different from the first direction and are arranged across the first pair of active regions. The first interconnect structure is arranged across a number of the first gates. The second cell includes a second pair of active regions, multiple second gates, and a second interconnect structure. The second pair of active regions extends in the first direction and stacked on each other. The second gates extend in the second direction different from the first direction and are arranged across the second pair of active regions. The second interconnect structure is arranged across a number of the plurality of second gates.

In some embodiments, the set of design rules includes a first design rule that the first interconnect structure and the second interconnect structure are separate from each other. For example, the hardware processor 1202 is configured to generate, based on the set of design rules, the layout design of the integrated circuit 94 as shown in FIG. 9B, where the interconnect structure 983 in the cell CELL6 and the interconnect structure 984 in the cell CELL7 are separate from each other.

In some embodiments, the set of design rules further includes a design rule that, on a condition of the second cell abutting the first cell on a first boundary of the second cell along the first direction, the first interconnect structure and the second interconnect structure are arranged in a same row, and a side of the second interconnect structure is arranged to be close to or aligned with a second boundary of the second cell, which is opposite to the first boundary of the second cell. For example, the hardware processor 1202 is configured to generate, based on the set of design rules, the layout design of the integrated circuit 94 as shown in FIG. 9B, where the interconnect structures 983-984 are arranged in the same row along the X direction, and the right side of the cell CELL7 is arranged to be close to or aligned with the right boundary of the cell CELL7, which is opposite to the left boundary of the cell CELL7 which the cells CELL6-CELL7 abut with each other.

In some embodiments, the set of design rules further includes a design rule that, on a condition of the second cell abutting the first cell along the first direction, the first interconnect structure and the second interconnect structure are separate from each other by a distance that is greater than a pitch between two of the plurality of first gates or two of the plurality of second gates. For example, the hardware processor 1202 is configured to generate, based on the set of design rules, the layout design of the integrated circuit 94 as shown in FIG. 9B, where the interconnect structures 983-984 are separate from each other by a distance that is greater than a pitch between two of the gates arranged in the cell CELL6 or two of the gates arranged in the cell CELL7.

In some embodiments, the set of design rules further includes a design rule that, on a condition of the second cell abutting the first cell along the first direction, the second pair of active regions has a width that is large enough to reach the row in which the first interconnect structure and the second interconnect structure are arranged, and the first interconnect structure and the second pair of active regions are separate from each other by a distance that is greater than a pitch between two of the plurality of first gates or two of the plurality of second gates. For example, the hardware processor 1202 is configured to place, based on the set of design rules, the cells CELL17-CELL18 abutting with each other, as shown in FIG. 11A. In FIG. 11A, the active region of the cell CELL17 has a width that is large enough to reach the row in which the interconnect structure 183 of the cell CELL18 is arranged, and the interconnect structure 183 and the active region of the cell CELL17 are separate from each other by a distance that is approximately two pitches between two of the gates of the cell CELL18, which is greater than the pitch.

In some embodiments, the second cell further includes at least one conductive segment extending in the second direction and coupled to the second pair of active regions, and the set of design rules further includes a design rule that, on a condition of the second cell abutting the first cell along the first direction, the at least one conductive segment has a length that is large enough to reach the row in which the first interconnect structure and the second interconnect structure are arranged, and the first interconnect structure and the at least one conductive segment are separate from each other by a distance that is greater than a pitch between two of the plurality of first gates or two of the plurality of second gates. For example, the hardware processor 1202 is configured to place, based on the set of design rules, the cells CELL17-CELL18 abutting with each other, as shown in FIG. 11A. In FIG. 11A, the cells CELL17-CELL18 abut with each other along the X direction, the cell CELL17 includes conductive segments extending along the Y direction and coupled to its active region, the conductive segments are large enough to reach the row in which the interconnect structure 1183 of the cell CELL18 is arranged, and the interconnect structure 1183 of the cell CELL18 and the conductive segments of the cell CELL17 are separate from each other by approximately two pitches between two of the gates of the cell CELL18, which is greater than the pitch.

The hardware processor 1202 is electrically coupled to the non-transitory, computer-readable storage medium 1204 via a bus 1208. The hardware processor 1202 is also electrically coupled to an I/O interface 1210 and a fabrication tool 1216 by the bus 1208. A network interface 1212 is also electrically connected to the hardware processor 1202 via the bus 1208. The network interface 1212 is connected to a network 1214, so that the hardware processor 1202 and the non-transitory computer-readable storage medium 1204 are capable of connecting to external elements via the network 1214. The hardware processor 1202 is configured to execute the set of instructions 1206 encoded in the non-transitory computer-readable storage medium 1204 in order to cause the EDA system 1200 to be usable for performing a portion or all of the noted processes and/or methods. In one or more embodiments, the hardware processor 1202 is a central processing unit (CPU), a multi-processor, a distributed processing system, an application specific integrated circuit (ASIC), and/or a suitable processing unit.

In one or more embodiments, the non-transitory computer-readable storage medium 1204 is an electronic, magnetic, optical, electromagnetic, infrared, and/or a semiconductor system (or apparatus or device). For example, the non-transitory computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the non-transitory computer-readable storage medium 1204 includes a compact disk-read only memory (CD-ROM), a compact disk-read/write (CD-R/W), and/or a digital video disc (DVD).

In one or more embodiments, the non-transitory computer-readable storage medium 1204 stores the set of instructions configured to cause EDA system 1200 (where such execution represents (at least in part) the EDA tool) to be usable for performing a portion or all of the noted processes and/or methods. In one or more embodiments, the non-transitory computer-readable storage medium 1204 also stores information which facilitates performing a portion or all of the noted processes and/or methods. In one or more embodiments, the non-transitory computer-readable storage medium 1204 stores a library 1220 of IC layout diagram of standard cells including such standard cells as disclosed herein, for example, a cell including in the cells CELL1-CELL63 discussed above with respect to FIGS. 2A-12B.

EDA system 1200 includes an I/O interface 1210. The I/O interface 1210 is coupled to external circuitry. In one or more embodiments, the I/O interface 1210 includes a keyboard, keypad, mouse, trackball, trackpad, touchscreen, and/or cursor direction keys for communicating information and commands to the hardware processor 1202.

The EDA system 1200 also includes the network interface 1212 coupled to the hardware processor 1202. The network interface 1212 allows the EDA system 1200 to communicate with the network 1214, to which one or more other computer systems are connected. The network interface 1212 includes wireless network interfaces such as BLUETOOTH, WIFI, WIMAX, GPRS, or WCDMA; or wired network interfaces such as ETHERNET, USB, or IEEE-1764. In one or more embodiments, a portion or all of noted processes and/or methods, is implemented in two or more EDA systems 1200.

The EDA system 1200 also includes the fabrication tool(s) 1216 coupled to the hardware processor 1202. The fabrication tools 1216 are configured to fabricate integrated circuits, e.g., the integrated circuits illustrated in FIGS. 1-20, according to the design files processed by the hardware processor 1202. In some embodiments, the fabrication tools 1216 perform various semiconductor processes including, for example, generating photomasks based on layouts, fabricating using the photomasks, etching, deposition, implantation, and annealing. The fabrication tools 1216 include, for example, photolithography steppers, etch tools, deposition tools, polishing tools, rapid thermal anneal tools, ion implantation tools, and the like. Each fabrication tool 1216 modifies the wafer according to a particular operating recipe. For illustration, one fabrication tool 1216 is configured to deposit a film having a certain thickness on a wafer, and another fabrication tool 1216 is configured to etch away a layer from a wafer. Furthermore, in some embodiments, the fabrication tools 1216 of the same type are designed to perform the same type of process.

The EDA system 1200 is configured to receive information through the I/O interface 1210. The information received through the I/O interface 1210 includes one or more of instructions, data, design rules, libraries of standard cells, and/or other parameters for processing by the hardware processor 1202. The information is transferred to the hardware processor 1202 via the bus 1208. The EDA system 1200 is configured to receive information related to a UI through the I/O interface 1210. The information is stored in the non-transitory computer-readable medium 1204 as design specification 1222.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by the EDA system 1200. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 13B:
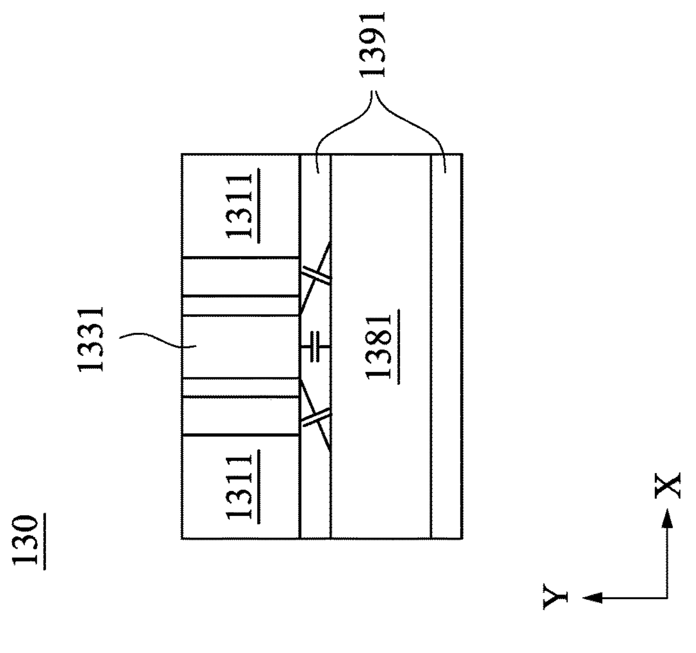
FIG. 13B is a plan view of the integrated circuit in FIG. 13A, in accordance with some embodiments of the present disclosure.
Figure 13A:
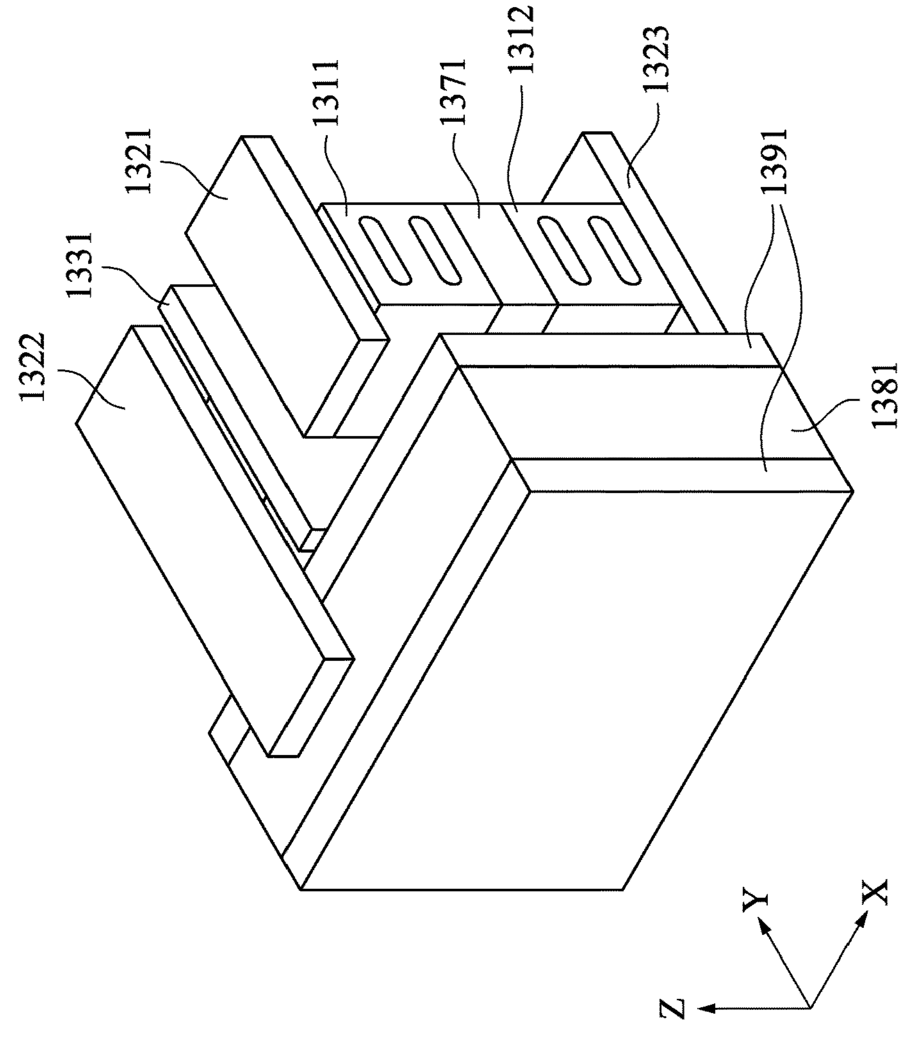
FIG. 13A is a schematic diagram of an integrated circuit including a portion of the integrated circuit in FIG. 1, in accordance with various embodiments of the present disclosure.

Reference is now made to FIGS. 13A-13B. FIG. 13A is a schematic diagram of an integrated circuit 130 including a portion of the integrated circuit 10 in FIG. 1, in accordance with some embodiments of the present disclosure. Active regions 1311-1312 correspond to the active regions 111-112 in FIG. 1, an isolation region 1371 corresponds to the isolation region 171 in FIG. 1, a gate 1331 corresponds to the gate 131 in FIG. 1, conductive segments 1321-1323 corresponds to the conductive segments 121-123 in FIG. 1, and an interconnect structure 1381 corresponds to the interconnect structure 181 in FIG. 1. Compared with the integrated circuit 10 as shown in FIG. 1, the integrated circuit 130 further includes a dielectric structure 1391 that surrounds an interconnect structure 1381 and is separate from the active regions 1311-1312 and the gate 1331.

FIG. 13B is a plan view of the integrated circuit 130 in FIG. 13A, in accordance with some embodiments of the present disclosure. In some embodiments, large capacitance will exist between the interconnect structure 1381 and the gate 1331, and/or between the interconnect structure 1381 and the active regions 1311-1312, as the interconnect structure 1381 has a large height along the Z direction and thus large volume and may carry a voltage different from the voltage carried by the gate 1331 and/or the active regions 1311-1312.

Figure 14A:
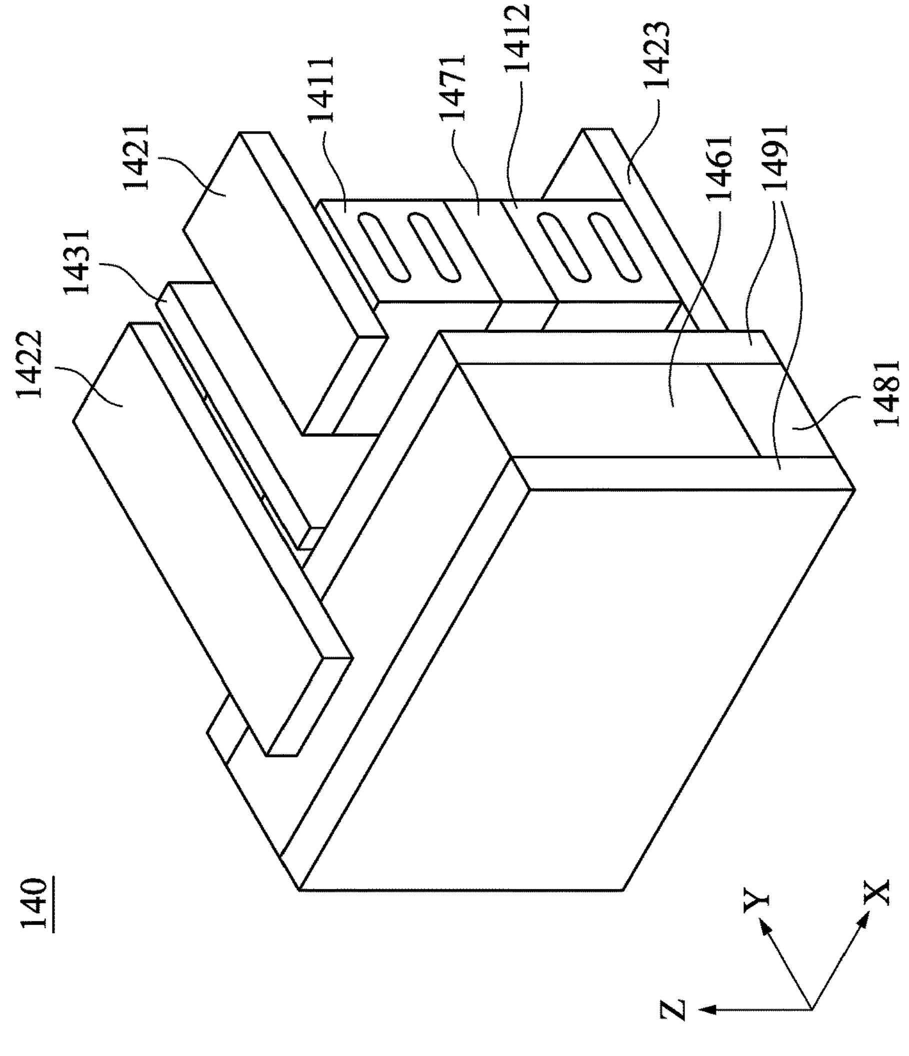
FIG. 14A is a schematic diagram of an integrated circuit including a portion of the integrated circuit in FIG. 1, in accordance with various embodiments of the present disclosure.
Figure 14B:
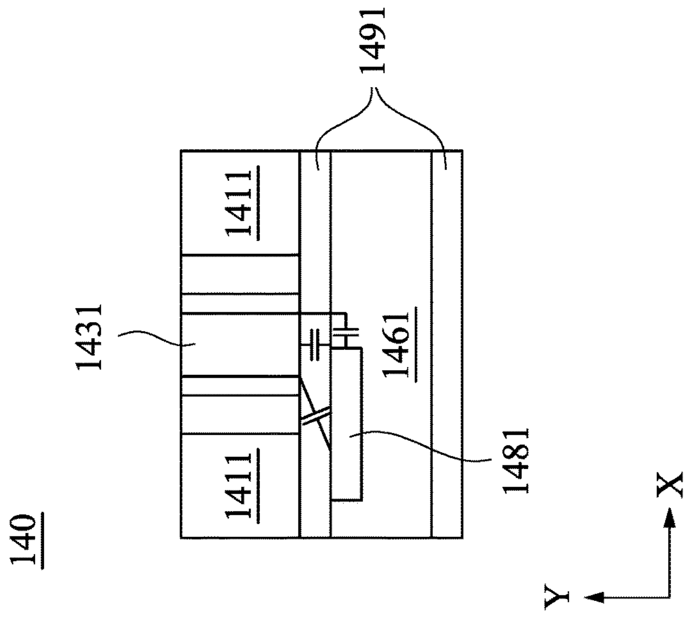
FIG. 14B is a plan view of the integrated circuit in FIG. 14A, in accordance with some embodiments of the present disclosure.

Reference is now made to FIGS. 14A-14B. FIG. 14A is a schematic diagram of an integrated circuit 140 including a portion of the integrated circuit 10 in FIG. 1, in accordance with some embodiments of the present disclosure. Active regions 1411-1412 correspond to the active regions 1311-1312 in FIG. 13A, an isolation region 1471 corresponds to the isolation region 1371 in FIG. 13A, a gate 1431 corresponds to the gate 1331 in FIG. 13A, conductive segments 1421-1423 corresponds to the conductive segments 1321-1323 in FIG. 13A, an interconnect structure 1481 corresponds to the interconnect structure 1381 in FIG. 13A, and an dielectric structure 1491 corresponds to the dielectric structure 1391 in FIG. 13A.

For illustration, the difference between the integrated circuits 130-140 is that, in FIG. 14A, a capping layer 1461 is disposed above and covers a portion of the interconnect structure 1481. In some embodiments, the capping layer 1461 is a material with low dielectric constant, such as oxide or nitride. In the configuration of FIG. 14A, the volume of the interconnect structure 1481 is smaller than the one of the interconnect structure 1381 in FIG. 13A because of the existence of the capping layer 1461.

FIG. 14B is a plan view of the integrated circuit 140 in FIG. 14A, in accordance with some embodiments of the present disclosure. In some embodiments, capacitance still exists between the interconnect structure 1481 and the gate 1431, and/or between the interconnect structure 1481 and the active regions 1411-1412, but no capacitance exists between the capping layer 1461 and the gate 1431, and/or between the capping layer 1461 and the active regions 1411-1412. Thus, the overall capacitance that the integrated circuit 140 has is smaller than the one that the integrated circuit 130 in FIGS. 13A-13B has.

In various embodiments, the capping layer 1461 and the interconnect structure 1481 have structures, shapes, and/or configuration different from the ones as shown in FIG. 14A, ands an electrical path still exists in the interconnect structure for signal transmission between the conductive segments 1422-1423 coupled to the interconnect structure.

Figure 15A:
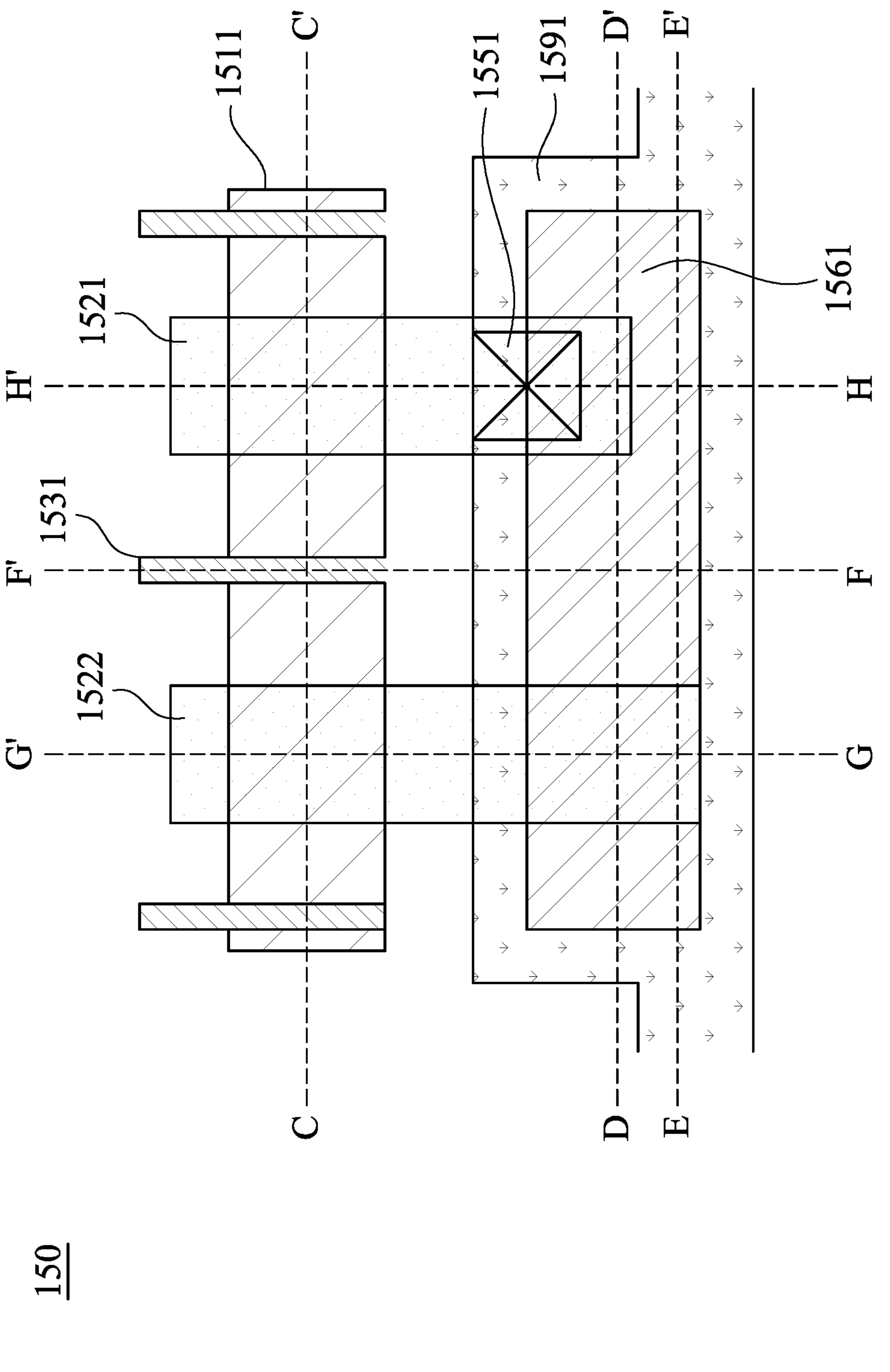
FIG. 15A is a plan view of an integrated circuit including a portion of the integrated circuit in FIG. 14A, in accordance with some embodiments of the present disclosure.

Below discuss the process for manufacturing an integrated circuit with the interconnect structure and the capping layer discussed above. Reference is now made to FIGS. 15A-15H. FIG. 15A is a plan view of an integrated circuit 150 including a portion of the integrated circuit 140 in FIG. 14A, in accordance with some embodiments of the present disclosure. FIGS. 15B-15H are cross-sectional diagrams of the integrated circuit 150 in FIG. 15A along lines C-C', D-D', E-E', F-F', G-G', and H-H', in accordance with some embodiments of the present disclosure.

The integrated circuit 150 includes a pair of active regions 1511, conductive segments 1521-1522, a gate 1531, a via 1551, a capping layer 1561, and a dielectric structure 1591. The pair of active regions 1511 extends along the X direction and is coupled to the gate 1531 and the conductive segments 1521-1522 extending along the Y direction.

Portions of the integrated circuit 150 are not shown in FIG. 15A. For example, an interconnect structure is also included in the integrated circuit 150, which is disposed below and covered by the capping layer 1561 and is surrounded by the dielectric layer 1591. Various components which are arranged at the back portion of the integrated circuit 150 are not shown in FIG. 15A as well, such as conductive segments coupled to the pair of active regions 1511.

For the purpose of illustration, the process of making the interconnect structure and the capping layer 1561 disposed above can be understood through the cross-sectional diagrams of the integrated circuit 150 along lines D-D' and E-E, as shown in FIGS. 15A-15H.

Figure 15B:
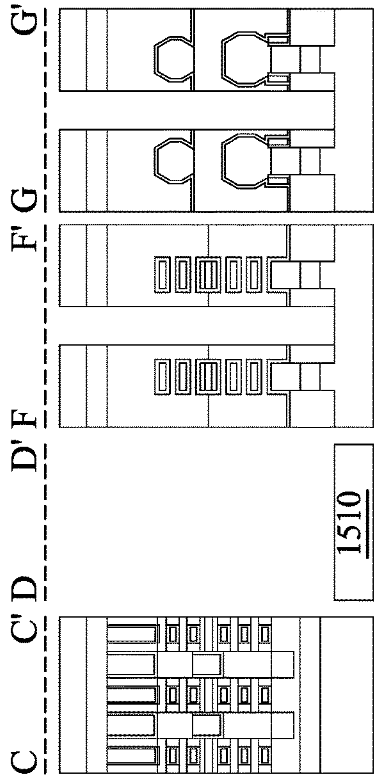
FIGS. 15B-15H are cross-sectional diagrams of the integrated circuit in FIG. 15A along lines C-C', D-D', E-E', F-F', G-G', and H-H', in accordance with some embodiments of the present disclosure.

In FIG. 15B, as the cross-sectional diagram of the integrated circuit 150 along line D-D' shows, a substrate 1510 is formed.

Figure 15C:
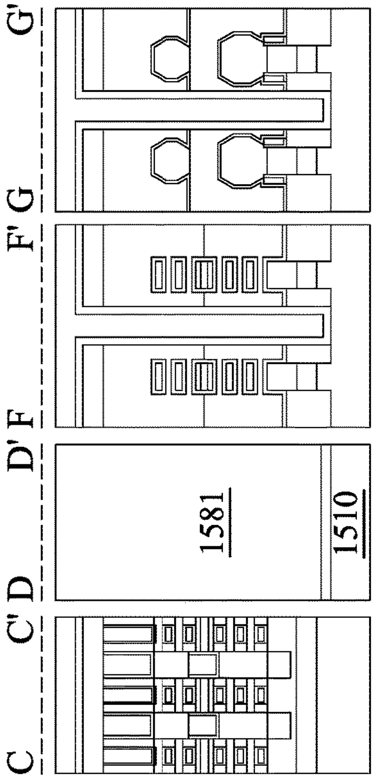

In FIG. 15C, as the cross-sectional diagram of the integrated circuit 150 along line D-D' shows, the interconnect structure 1581 is formed. In some embodiments, the interconnect structure 1581 is metal. In some embodiments, a dielectric layer is disposed above the substrate 1510 before the interconnect structure 1581 is formed.

Figure 15D:
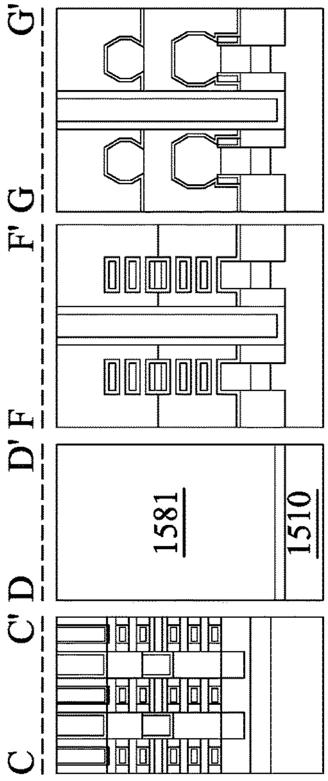

In FIG. 15D, as the cross-sectional diagram of the integrated circuit 150 along line D-D' shows, the interconnect structure 1581 is cut or shallowed to a lower height.

Figures 15E, 15F, 15G, 15H:
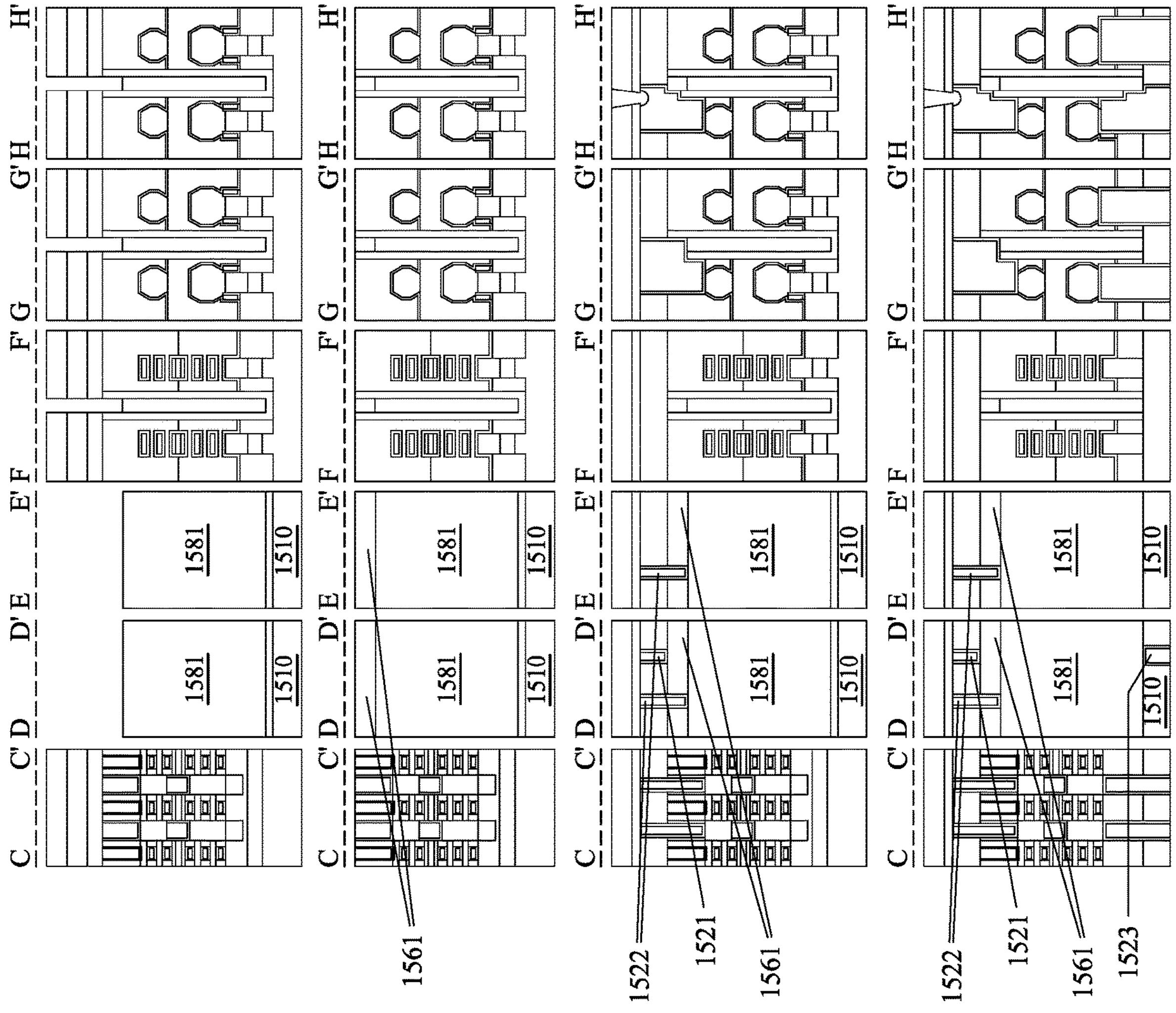

In FIG. 15E, as the cross-sectional diagrams of the integrated circuit 150 along lines C-C', D-D', E-E', F-F', G-G', and H-H' show, the interconnect structure 1581 remains the same while other materials are disposed.

In FIG. 15F, as the cross-sectional diagrams of the integrated circuit 150 along lines D-D' and E-E' show, the capping layer 1561 is formed and disposed above the interconnect structure 1581.

In FIG. 15G, as the cross-sectional diagrams of the integrated circuit 150 along lines D-D' and E-E' show, the conductive segments 1521-1522 are formed. In some embodiments, the conductive segment 1522 contacts the interconnect structure 1581, while the conductive segment 1521 is separate from the interconnect structure 1581 by the capping layer 1561. In some embodiments, the conductive segment 1522 is configured to transmit signals or voltages from and/or to the interconnect structure 1581. In some embodiments, the conductive segment 1521 is electrically isolated from the interconnect structure 1581 by the capping layer 1561 and configured to transmit signals or voltages from components (e.g., the pair of active regions 1511 in FIG. 15A) of the integrated circuits 150 to a conductive line above the integrated circuits 150 through a via (e.g., the via 1551 in FIG. 15A).

In FIG. 15H, as the cross-sectional diagrams of the integrated circuit 150 along lines D-D' and E-E' show, a conductive segment 1523 is formed. In some embodiments, the conductive segment 1523 is arranged on the back portion of the integrated circuit 150 and coupled to the interconnect structure 1581.

Figure 16:
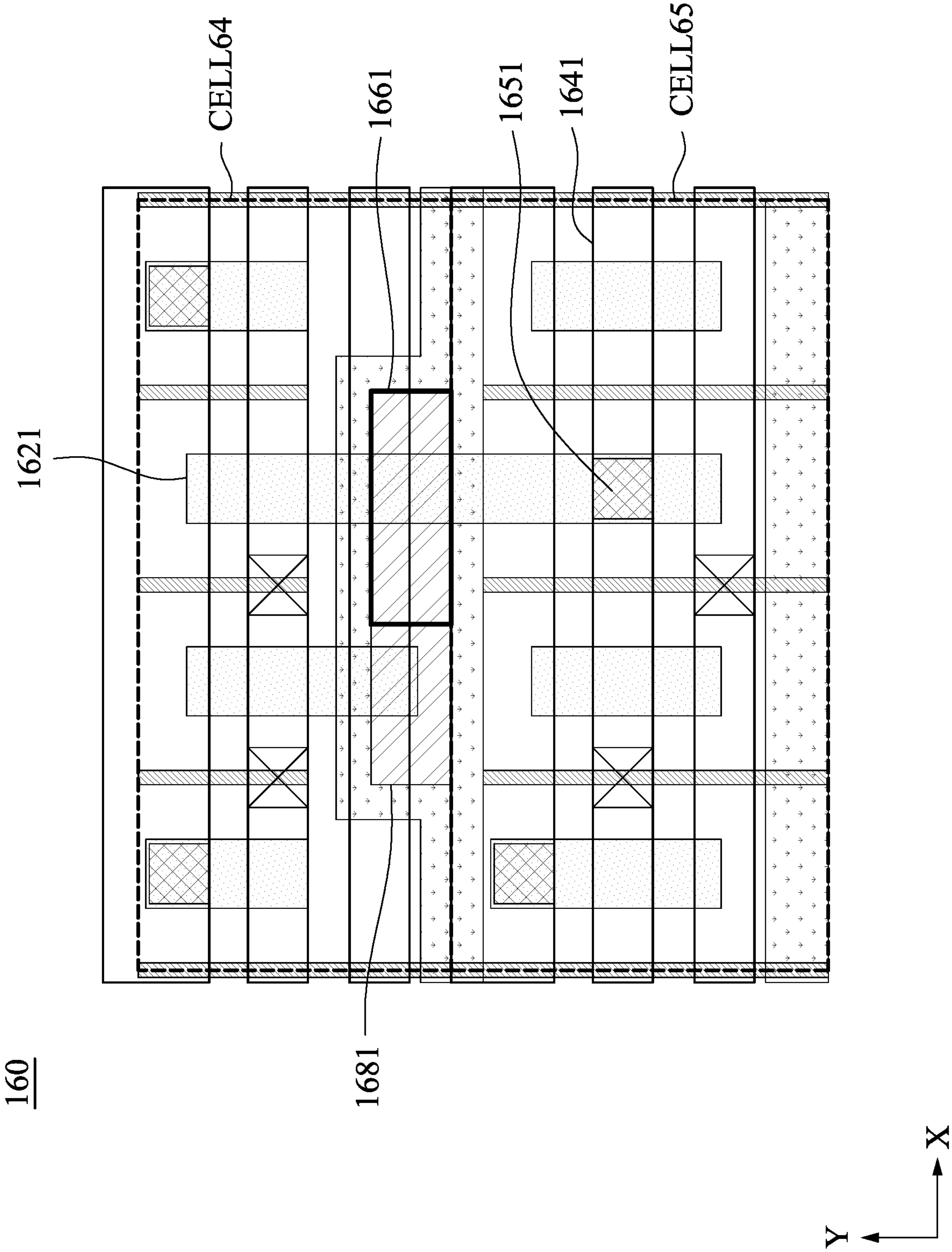
FIG. 16 is a layout diagram in a plan view of a front portion of an integrated circuit including a portion of the integrated circuit in FIG. 14A, in accordance with some embodiments of the present disclosure.

Reference is now made to FIG. 16. FIG. 16 is a layout diagram in a plan view of a front portion of an integrated circuit 160 including a portion of the integrated circuit 140 in FIG. 14A, in accordance with some embodiments of the present disclosure. The integrated circuit 160 includes cells CELL64-CELL65, which abut with each other along the Y direction.

The cell CELL64 includes an interconnect structure 1681 configured to transmit signal between different components of the cell CELL64. As shown in FIG. 16, a portion of the interconnect structure 1681 is covered by a capping layer 1661. The capping layer 1661 is disposed above the interconnect structure 1681.

A conductive segment 1621 is disposed above and crosses the interconnect structure 1681 and the capping layer 1661. The conductive segment 1621 extends along the Y direction to couple the pair of active regions (not shown in FIG. 16) of the cell CELL64 to the pair of active regions (not shown in FIG. 16) of the cell CELL65. Alternatively stated, because of the capping layer 1661 sandwiched between the portion of the interconnect structure 1681 and the conductive segment 1621, the conductive segment 1621 can transmit signals or voltages between the cells CELL64-CELL65, without contacting and causing electrical short with the interconnect structure 1681.

In some embodiments, the conductive segment 1621 is configured to couple the pair of active regions (not shown in FIG. 16) of the cell CELL64 to the via 1651 of the cell CELL65, and the via 1651 is coupled to the conductive line 1641 disposed above.

Figure 17A:
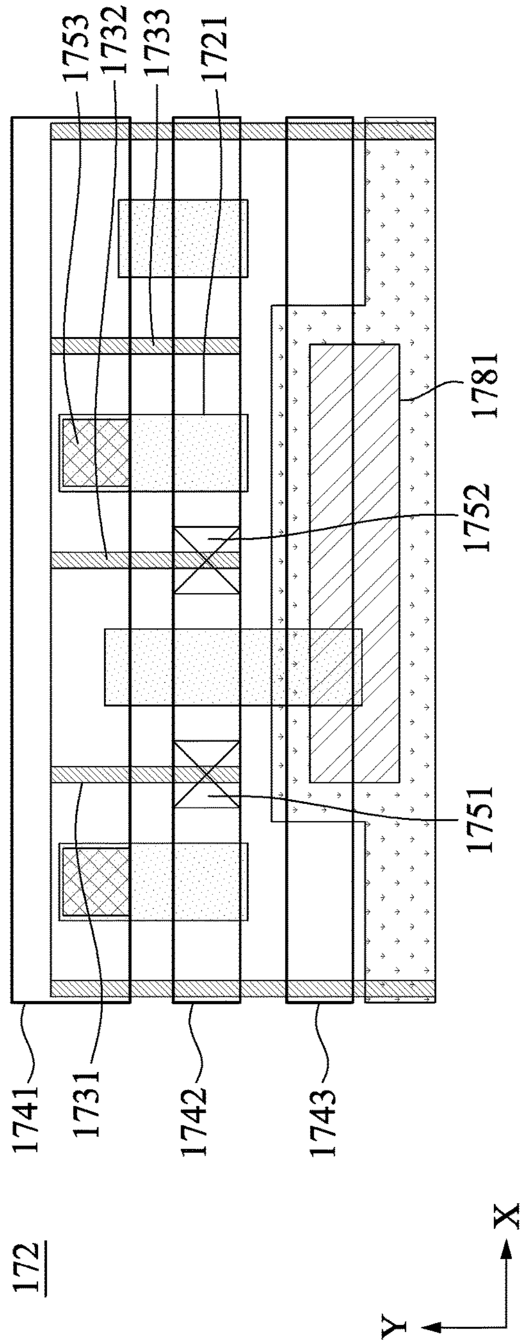
FIG. 17A is a layout diagram in a plan view of a front portion of an integrated circuit, in accordance with some embodiments of the present disclosure.
Figure 17B:
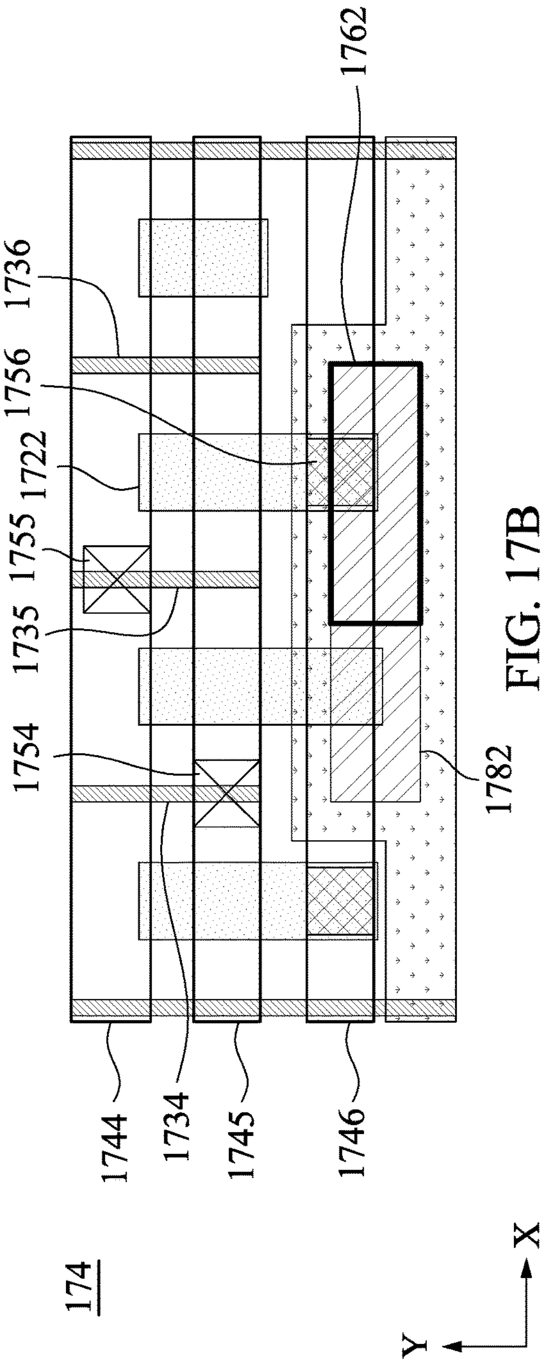
FIG. 17B is a layout diagram in a plan view of a front portion of an integrated circuit including a portion of the integrated circuit in FIG. 14A, in accordance with some embodiments of the present disclosure.

Reference is now made to FIGS. 17A-17B. FIG. 17A is a layout diagram in a plan view of a front portion of an integrated circuit 172, in accordance with some embodiments of the present disclosure. The integrated circuit 172 includes gates 1731-1733, conductive segment 1721, conductive lines 1741-1743, vias 1751-1753, and an interconnect structure 1781. The vias 1751-1752 are coupled to the gates 1731-1732 respectively.

In some embodiments, the conductive segment 1721 is coupled to the via 1753 disposed above, the via 1753 is coupled to the conductive line 1741 disposed above, the conductive line 1741 is configured to transmit supply voltage, such as the supply voltage VDD or VSS as discussed above, and the conductive segment 1742 is configured to transmit signals configured to control the gates 1731-1732. In such embodiments, only the conductive line 1742 can be used to transmit signals configured to control the gates 1731-1732, and thus the vias 1751-1752 has to be arranged in the same row along the X direction to couple to the conductive line 1742. Alternatively stated, the positions that the vias 1751-1752 can be placed are limited.

FIG. 17B is a layout diagram in a plan view of a front portion of an integrated circuit 174 including a portion of the integrated circuit 140 in FIG. 14A, in accordance with some embodiments of the present disclosure. The integrated circuit 174 includes a conductive segment 1722, gates 1734-1736, conductive lines 1744-1746, vias 1754-1756, an interconnect structure 1782, and a capping layer 1762 disposed above and covers the interconnect structure 1782. The vias 1754-1755 are coupled to the gates 1734-1735 respectively.

Compared with the integrated circuit 172 in FIG. 17A, the integrated circuit 174 further includes the capping layer 1762 disposed above and covering the interconnect structure 1782. In some embodiments, because the capping layer 1762 can electrically isolate the interconnect structure 1782 from the conductive segment 1746, the conductive segment 1722 can be placed on the capping layer 1762 to couple to the via 1756, the via 1756 is coupled to the conductive line 1746, and the conductive line 1746 can be configured to transmit supply voltage, such as the supply voltage VDD or VSS as discussed above, without causing electrical short with the interconnect structure 1782. In such embodiments, because supply voltage is transmitted through the conductive line 1746, both of the conductive lines 1744-1745 can be used to transmit signals configured to control the gates 1734-1735, and thus the vias 1753-1754 can be arranged to couple to the conductive line 1744 or the conductive line 1745. Alternatively stated, the vias 1754-1755 can be placed under the conductive line 1744 or the conductive line 1745.

Figure 18:
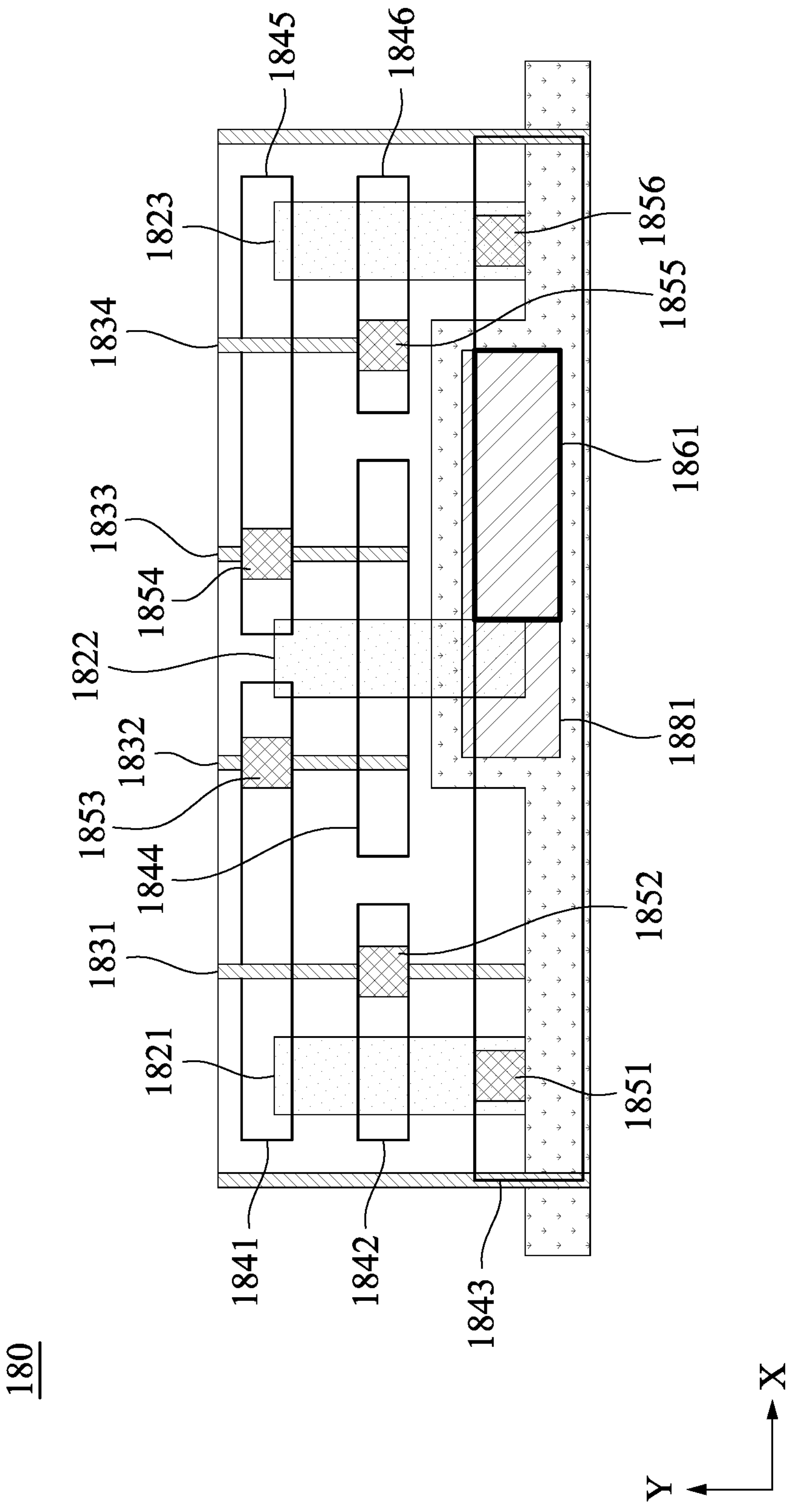
FIG. 18 is a layout diagram in a plan view of a front portion of an integrated circuit 180 including a portion of the integrated circuit in FIG. 14A, in accordance with some embodiments of the present disclosure.

FIG. 18 is a layout diagram in a plan view of a front portion of an integrated circuit 180 including a portion of the integrated circuit 140 in FIG. 14A, in accordance with some embodiments of the present disclosure. The integrated circuit 180 includes conductive segments 1821-1823, gates 1831-1834, conductive lines 1841-1846, vias 1851-1856, an interconnect structure 1881, and a capping layer 1861 disposed above and covering the interconnect structure 1881. The vias 1852-1855 are coupled to the gates 1831-1834 respectively.

Similar to the integrated circuit 174 in FIG. 17B, the interconnect structure 1881 of the integrated circuit 180 also has capping layer 1861 disposed above. In some embodiments, the conductive line 1843 is configured to transmit supply voltage, such as the supply voltage VDD or VSS as discussed above the conductive segments 1821 and 1823 are coupled to the conductive line 1843 through the vias 1851 and 1856 respectively, the conductive segments 1821 and 1823 are configured to transmit the received supply voltage to a pair of active regions (not shown in FIG. 18) of the integrated circuit 180. In such embodiments, the conductive lines 1841-1842, and 1845-1846 can be used to transmit signals configured to control the gates 1831-1834, and thus the vias 1852-1855 can be arranged to couple to the conductive lines 1841-1842, and 1845-1846. Alternatively stated, the vias 1852-1855 can be placed under the conductive line 1841-1842, and 1845-1846.

In various embodiments, the interconnect structure 1881 of the integrated circuit 180 does not include the capping layer 1861. In such embodiments, vias configured to receive signals for controlling the gates have to couple to the same conductive line, and multiple conductive lines (metal-one) extending along the Y direction can only be placed above the gates, which will cause a shift of the boundaries of the integrated circuit and impact the utilization rate.

Figure 19A:
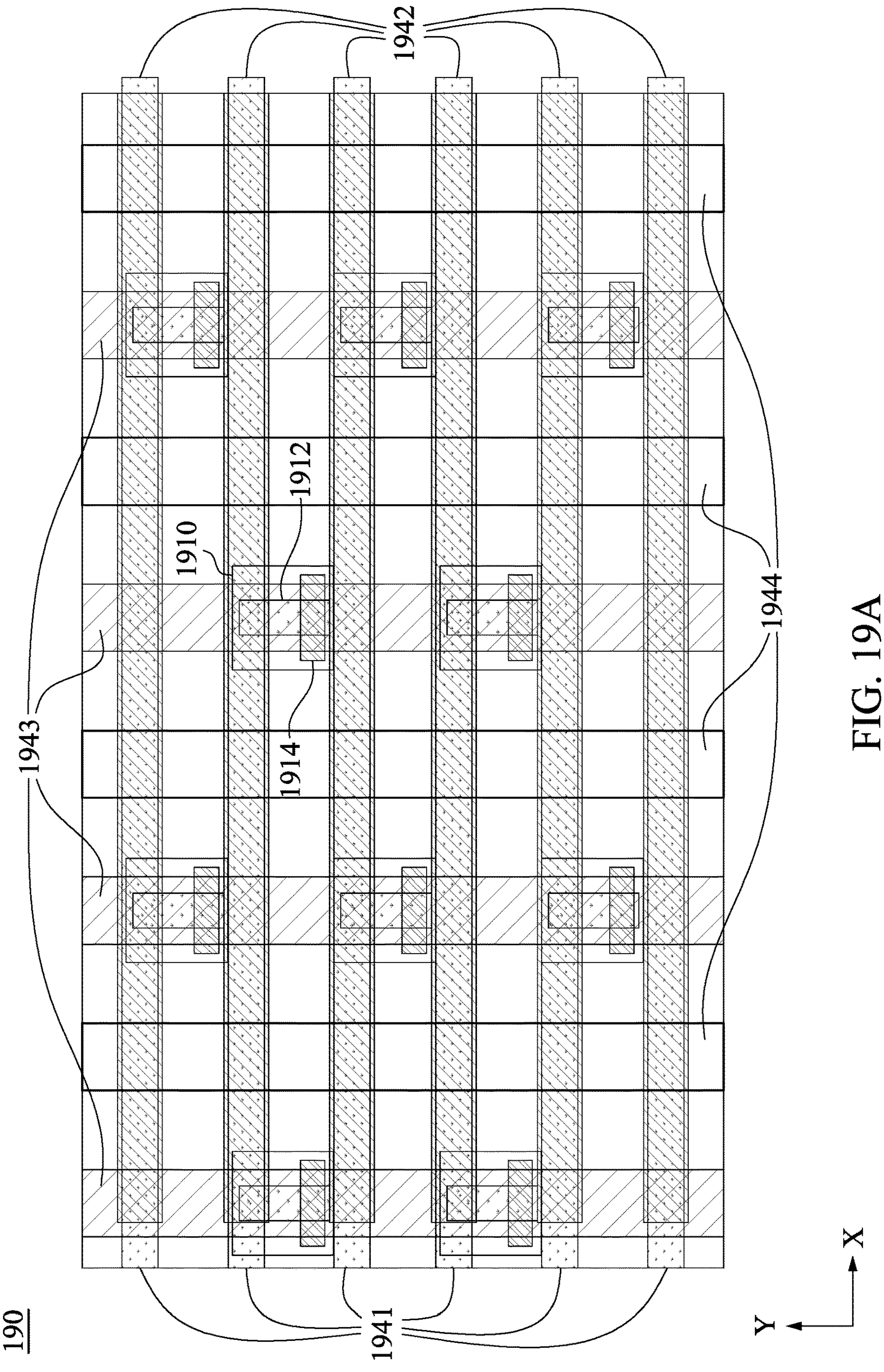
FIG. 19A is a layout diagram in a plan view of an integrated circuit including a portion of the integrated circuit in FIG. 14A, in accordance with some embodiments of the present disclosure.
Figure 19B:
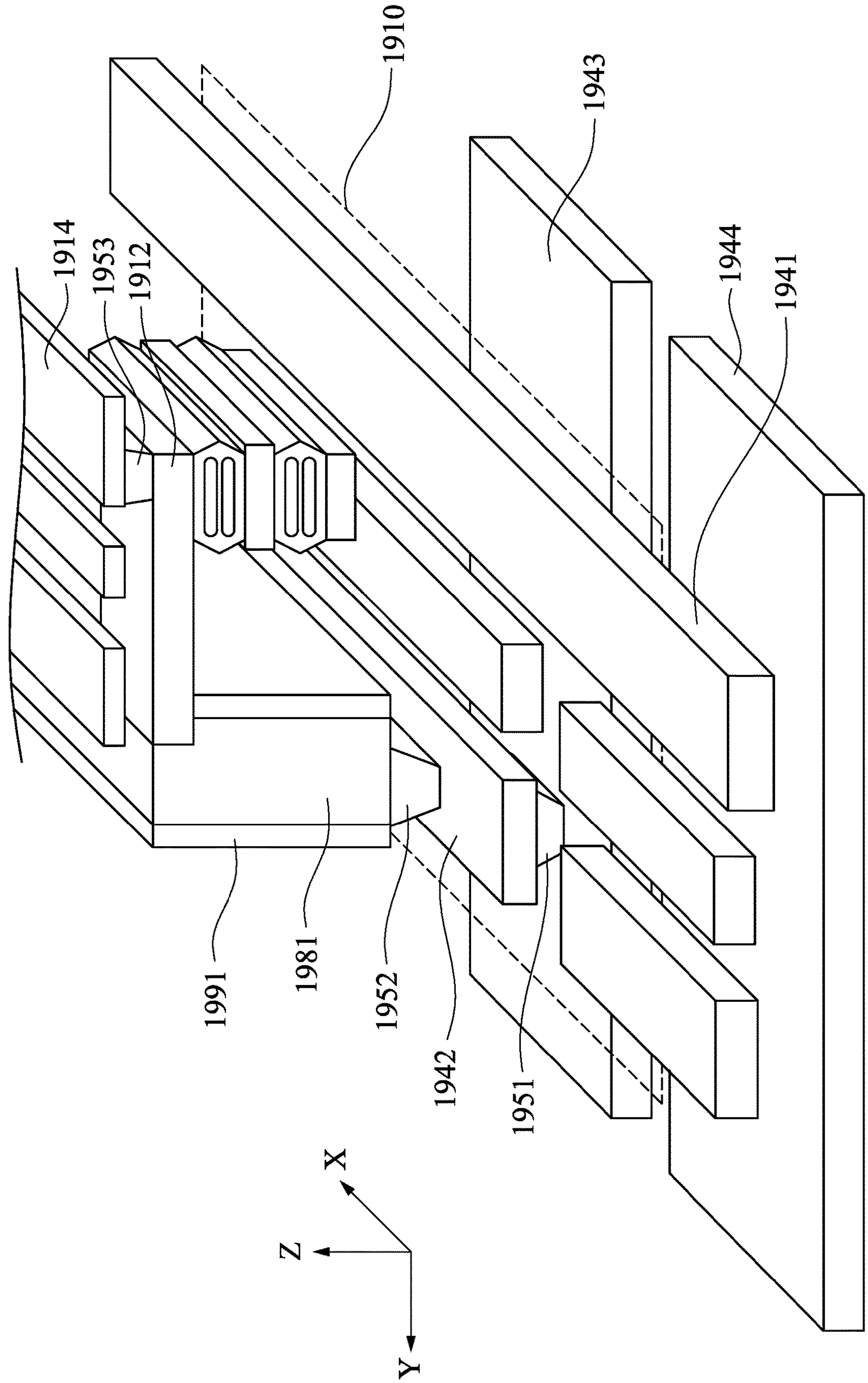
FIG. 19B is a schematic diagram of a portion of the integrated circuit in FIG. 19A, in accordance with some embodiments of the present disclosure.

Reference is now made to FIGS. 19A-19B. FIG. 19A is a layout diagram in a plan view of an integrated circuit 190 including a portion of the integrated circuit 140 in FIG. 14A, in accordance with some embodiments of the present disclosure. FIG. 19B is a schematic diagram of a portion of the integrated circuit 190 in FIG. 19A, in accordance with some embodiments of the present disclosure.

As shown in FIG. 19A, the integrated circuit 190 includes conductive lines 1943 configured to transmit the supply voltage VSS along the Y direction, conductive lines 1944 configured to transmit the supply voltage VDD along the Y direction, conductive lines 1942 coupled to the conductive lines 1943 configured to transmit the supply voltage VSS along the X direction, conductive lines 1941 coupled to the conductive lines 1944 configured to transmit the supply voltage VDD along the X direction, and power tap cells 1910 coupled to the conductive lines 1942 and configured to pick up the supply voltage VSS from the back portion to the front portion of the integrated circuit 190.

Specifically, the integrated circuit 190 has a CFET structure discussed above, which N-type transistors are arranged at the front portion of the integrated circuit 190 and P-type transistors are arranged at the back portion of the integrated circuit 190. In some embodiments, the conductive lines 1943-1944 are all arranged at the back portion of the integrated circuit 190, the conductive lines 1944 are configured to transmit the supply voltage VDD to the P-type transistors of the integrated circuit 190 through the conductive lines 1941, which are arranged at the back portion of the integrated circuit 190 and disposed above the conductive lines 1944.

On the other hand, the conductive lines 1943, which are arranged at the back portion of the integrated circuit 190, are configured to transmit the supply voltage VSS to the N-type transistors of the integrated circuit 190, which are arranged at the front portion of the integrated circuit 190. To do so, the conductive lines 1943 are coupled to the conductive lines 1941, which are also arranged at the back portion of the integrated circuit 190, and each conductive line 1941 is coupled to an interconnect structure (not shown in FIG. 19A) of the power tap cell 1910. The interconnect structures in the power tap cells 1910 extend from the back portion of the integrated circuit 190 to the front portion of the integrated circuit 190 and couple the conductive lines 1941 to conductive segments 1912, which are arranged at the front portion of the integrated circuit 190. The conductive segments 1912 are coupled to conductive lines 1914, and the conductive lines 1914 are configured to transmit the supply voltage VSS to the N-type transistors arranged at the front portion.

In FIG. 19B, various components correspond to their counterparts in FIG. 19A, for example, a power tap cell 1910 corresponds to the power tap cells 1910 in FIG. 19A. A via 1951 couples the conductive line 1943 configured to transmit the supply voltage VSS along the Y direction to the conductive line 1942 configured to transmit the supply voltage VSS along the X direction. A via 1952 couples the conductive line 1942 to the interconnect structure 1981 of the power tap cell 1910. In some embodiments, the interconnect structure 1981 is surrounded by a dielectric structure 1991, as discussed in previous embodiments. The interconnect structure 1981 receives the supply voltage VSS from the conductive line 1942 and transmits the supply voltage VSS to the conductive segment 1912. The conductive segment 1912 then transmits the supply voltage VSS to the conductive line 1914 arranged at the front portion through a via 1953. Thus, the supply voltage VSS is successfully picked up by the power tap cell 1910.

In some embodiments, the conductive line 1944 configured to transmit the supply voltage VDD along the Y direction is coupled to the conductive line 1941 configured to transmit the supply voltage VDD along the X direction through a via (not shown in FIG. 19B).

In some embodiments, a capping layer (not shown in FIG. 19B) is disposed above and covers a portion of the interconnect structure 1981. As discussed in previous embodiments of FIGS. 17B and 18, because the capping layer can prevent electrical short between the interconnect structure 1981 and other conductive segment or conductive line, the conductive line (e.g., the conductive line 1914 in FIG. 19B) configured to transmit supply voltage, such as the supply voltage VSS can be placed above the interconnect structure 1981. In such embodiments, the conductive segments 1912 can be omitted, and the supply voltage VSS can be directly transmitted along the Z direction. Alternatively stated, the supply voltage VSS is picked up by the interconnect structure 1981. In some embodiments, because the conductive segment 1912 is omitted, the area of the power tap cell 1910 is reduced, and such interconnect structure 1981 can be used in different cells in order to transmit supply voltage vertically, or along the Z direction.

It is worth noted that the embodiments discussed in FIGS. 19A-19B are merely explanatory. In various embodiments, P-type transistors are arranged at the front portion of the integrated circuit 190, N-type transistors are arranged at the back portion of the integrated circuit 190, the conductive lines 1942-1943 are configured to transmit the supply voltage VDD, the conductive lines 1941 and 1944 are configured to transmit the supply voltage VSS, and the interconnect structures 1981 of the power tap cells 1910 are configured to transmit the supply voltage VDD from the conductive lines 1942 to the conductive segments 1912, the conductive lines 1914 are configured to transmit the supply voltage VDD to the P-type transistors arranged at the front portion.

In various embodiments, the interconnect structure is configured to transmit the supply voltage VDD or VSS from the front portion to the back portion of an integrated circuit.

Figure 20:
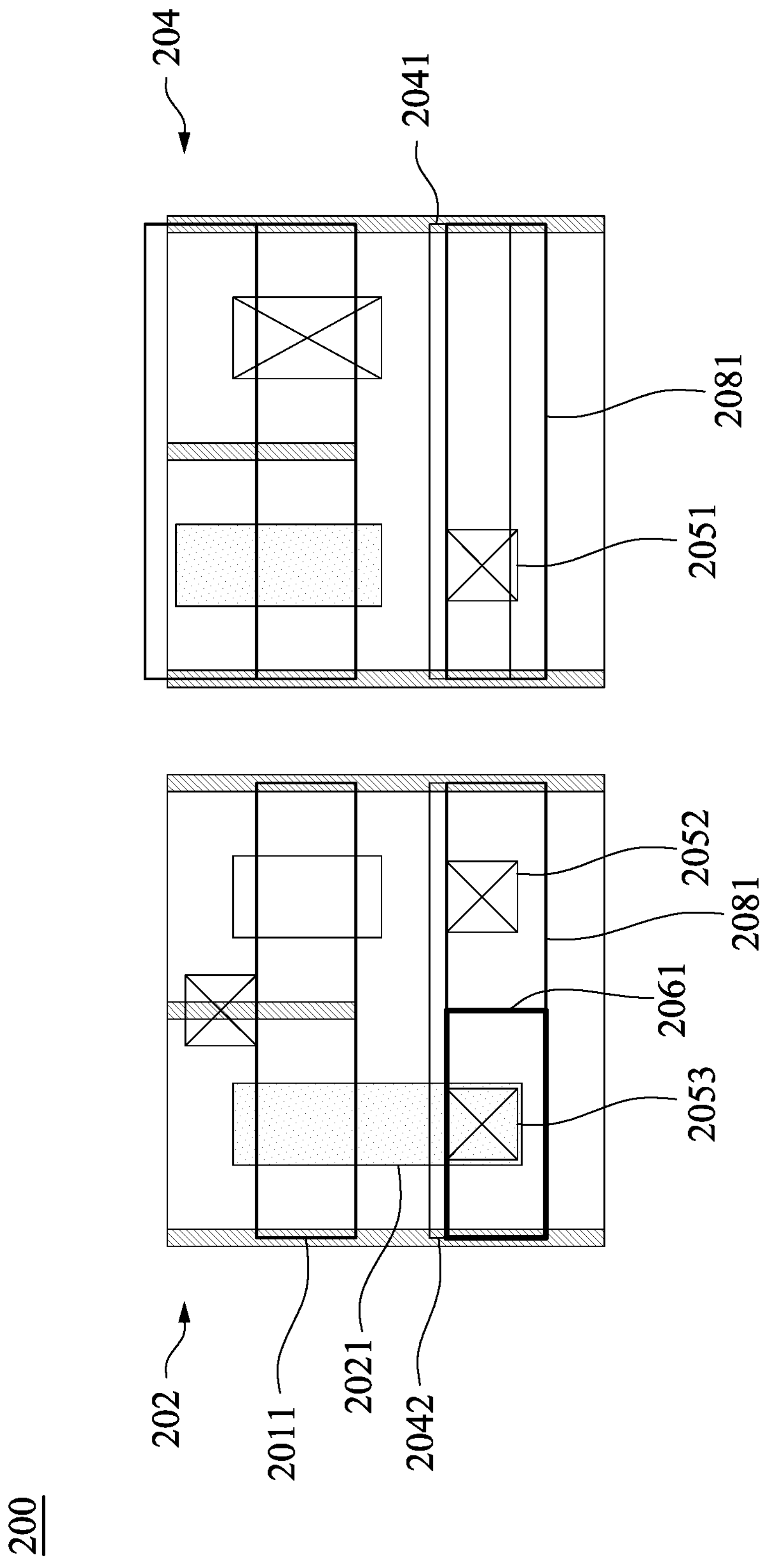
FIG. 20 is a layout diagram in a plan view of a front portion and a back portion of an integrated circuit, in accordance with some embodiments of the present disclosure.

Reference is now made to FIG. 20. FIG. 20 is a layout diagram in a plan view of a front portion 202 and a back portion 204 of an integrated circuit 200, in accordance with some embodiments of the present disclosure. In the integrated circuit 200, an interconnect structure 2081 is used to transmit supply voltage from the back portion 204 to the front portion 202. Specifically, a conductive line 2041 is arranged at the back portion 204 and configured to transmit the supply voltage VDD or VSS, and a via 2051 is disposed above and coupled to the conductive line 2041 and configured to transmit supply voltage from the conductive line 2041 to the interconnect structure 2081 disposed above the via 2051. The interconnect structure 2081 receives the supply voltage from the via 2051 arranged at the back portion 204 and transmits the supply voltage to a via 2052 disposed above and coupled to the interconnect structure 2081. The via 2052 is coupled to a conductive line 2042 disposed above, a via 2053 couples the conductive line 2042 and a conductive segment 2021. Specifically, the via 2053 is sandwiched between the conductive line 2042 disposed above and the conductive segment 2021 disposed below, and the conductive segment 2021 is placed on a capping layer 2061, which is disposed above and covers a portion of the interconnect structure 2081. The conductive segment 2021 transmits the supply voltage to an active region 2011. Therefore, the interconnect structure 2081 is configured to transmit the supply voltage from the back portion 204 to the front portion 202.

Figure 21:
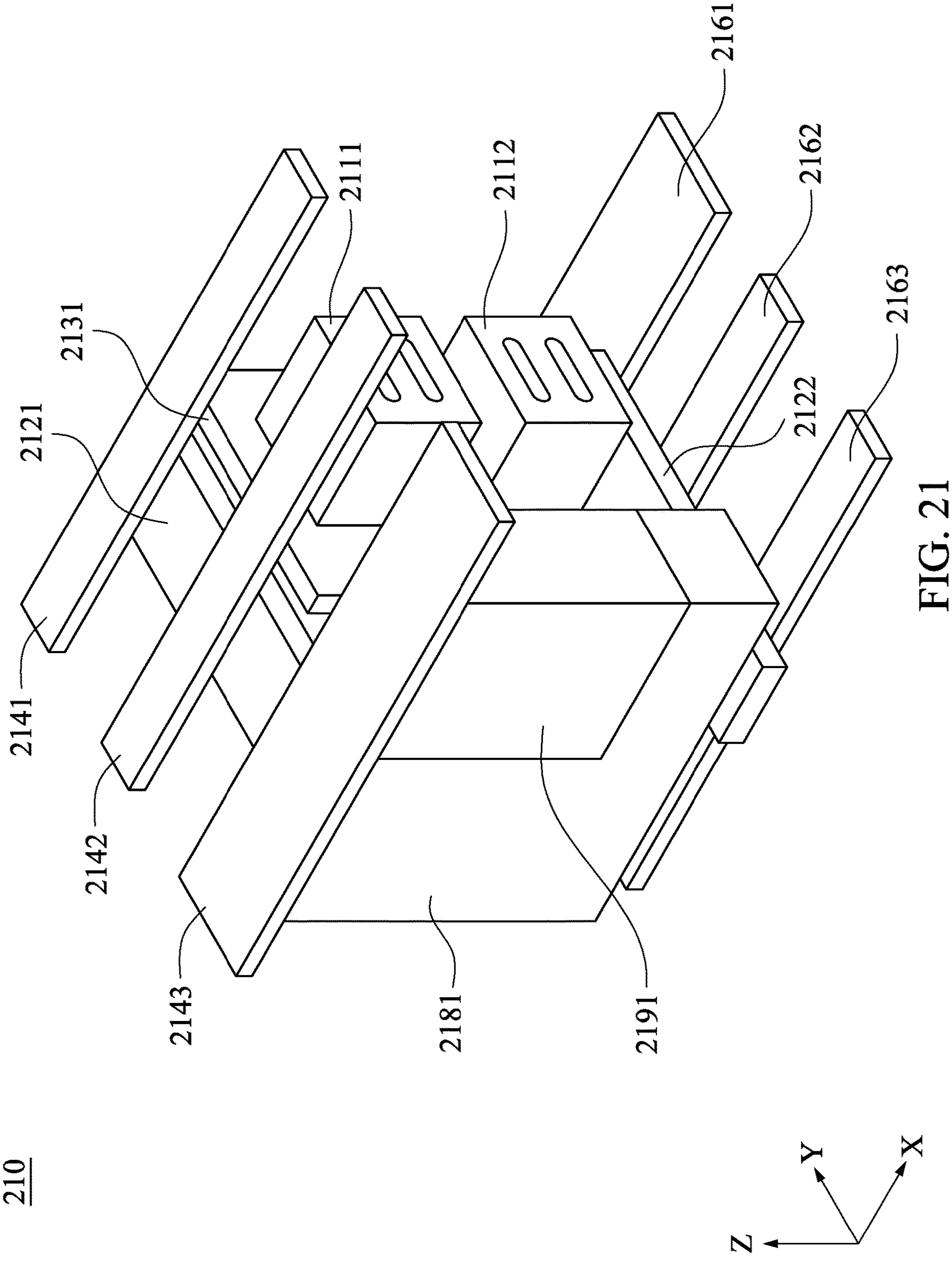
FIG. 21 is a schematic diagram of an integrated circuit, in accordance with various embodiments of the present disclosure.

Reference is now made to FIG. 21. FIG. 21 is a schematic diagram of an integrated circuit 210, in accordance with some embodiments of the present disclosure. The integrated circuit 210 includes active regions 2111-2112, a gate 2131, conductive segments 2121-2122, conductive lines 2141-2143 and 2161-2163, an interconnect structure 2181, and a dielectric structure 2191. In some embodiments, the gate 2131 is referred to as a poly.

For illustration, some components of the integrated circuit 210 have configurations that are similar to the corresponding components of the integrated circuit 10 as illustrated in FIG. 1. For example, the active regions 2111-2112 correspond to the active regions 111-112, the gate 2131 corresponds to the gate 131, the conductive segments 2121-2122 correspond to the conductive segments 122-123, and the conductive lines 2141-2143 and 2161-2163 correspond to the conductive lines 141-143 and 161-163. Previous discussion of these components of the integrated circuit 10 can be referred to in understanding the components of the integrated circuit 210.

For illustration, the integrated circuit 210 includes the interconnect structure 2181 and the dielectric structure 2191. The dielectric structure 2191 is disposed above and covers a portion of the interconnect structure 2181. The interconnect structure 2181 and the dielectric structure 2191 together form a wall-shaped structure.

In some embodiments, the interconnect structure 2181 is made of a conductive material, such as metal, and the dielectric structure 2191 is made of an insulating material with low dielectric constant, such as oxide or nitride. The interconnect structure 2181 is configured to transmit signals between the active regions 2111 and 2112 through the conductive segments 2121-2122. On the other hand, electrical paths are not formed in the dielectric structure 2191, and signals are isolated from the dielectric structure 2191.

In some embodiments, because the dielectric structure 2191 occupies a certain volume, the volume of the interconnect structure 2181 is smaller than the volume of the interconnect structure 181 as illustrated in FIG. 1. In some embodiments, because the interconnect structure 2181 has a reduced volume, the capacitance between the interconnect structure 2181 and the gate 2131 and between the interconnect structure 2181 and the active regions 2111-2112 are smaller than the corresponding capacitance of the integrated circuit 10, and thus the integrated circuit 210 has better performance than the integrated circuit 10.

In some embodiments, in order to form the interconnect structure 2181 and the dielectric structure 2191, a conductive structure, such as metal, is filled in first. The conductive structure is a wall-shaped structure. Then, a portion of the conductive structure is then cut or removed, and a cavity is formed. Lastly, a dielectric material is filled into the cavity. The dielectric material filled into the cavity forms the dielectric structure 2191, and the remained conductive structure forms the interconnect structure 2181.

In some embodiments, the interconnect structure 2181 is referred to as a vertical interconnect (VLI) structure, and the dielectric structure 2191 is referred to as a cut vertical interconnect (CVLI) structure.

In some embodiments, the dielectric structure 2191 is referred to as a capping layer.

Figure 22:
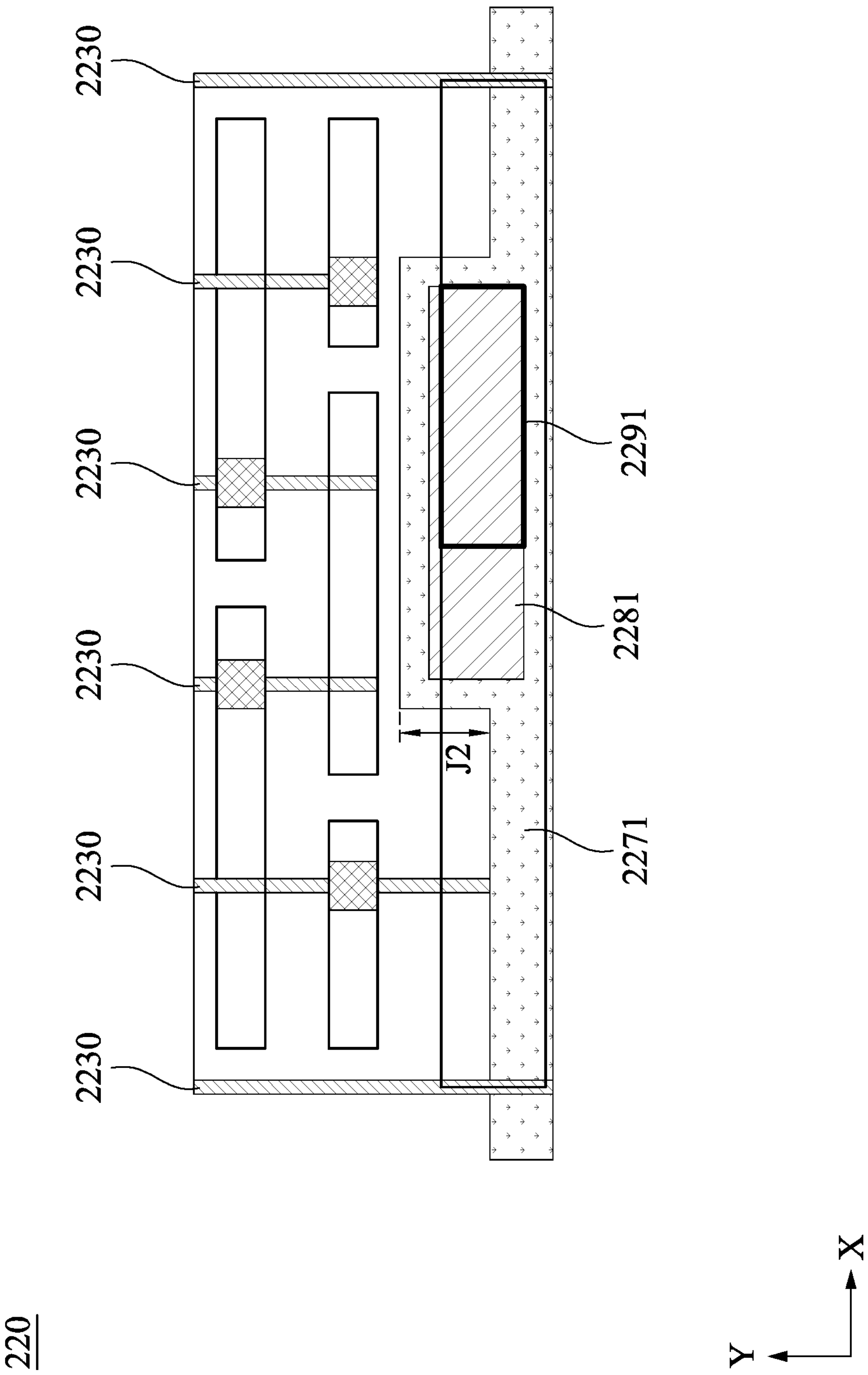
FIG. 22 is a layout diagram in a plan view of a front portion of an integrated circuit including a portion of the integrated circuit in FIG. 21, in accordance with some embodiments of the present disclosure.

Reference is now made to FIG. 22. FIG. 22 is a layout diagram in a plan view of a front portion of an integrated circuit 220 including a portion of the integrated circuit 210 in FIG. 21, in accordance with some embodiments of the present disclosure. The integrated circuit 220 includes gates 2230, an interconnect structure 2281, a dielectric structure 2291, and a dielectric structure 2271.

The integrated circuit 220 has components similar to the interconnect structure 2181 and the dielectric structure 2191 illustrated in FIG. 21 for signal transmission and isolation. For illustration of FIGS. 21-22, the interconnect structure 2281 corresponds to the interconnect structure 2181, the dielectric structure 2291 corresponds to the dielectric structure 2191. Alternatively stated, the interconnect structure 2281 and the dielectric structure 2291 are abutted with each other along the X direction, and together form a wall-shaped structure.

For illustration, the dielectric structure 2271 surrounds the interconnect structure 2281 and the dielectric structure 2291. In some embodiments, the dielectric structure 2271 is configured to separate the interconnect structure 2281 and the dielectric structure 2291 from the gates 2230, or from other components or device, and is filled in before the interconnect structure 2281 and the dielectric structure 2291 in the process of manufacturing the integrated circuit 220. In some embodiments, the dielectric structure 2271 is made of an insulating material with low dielectric constant.

In some embodiments, portions of the gates 2230 are cut and removed, and then the dielectric structure 2271 is filled in. In some embodiments, the dielectric structure 2271 is referred to as a cut-poly (CPO) structure. In some embodiments, CPO refers to the process of cutting portions of the gates 2230, and after CPO process is implemented, no structure is formed, until the dielectric structure 2271 is filled in in later process.

For illustration, the dielectric structure 2271 has a jog distance J2, and the width of the dielectric structure 2271 in the Y direction is not uniform. Alternatively stated, the portions of the dielectric structure 2271 where the interconnect structure 2281 and the dielectric structure 2291 are arranged has a larger width in the Y direction, the portions of the dielectric structure 2271 where the interconnect structure 2281 and the dielectric structure 2291 are not arranged has a smaller width in the Y direction, and the difference between the larger and smaller widths equals the jog distance J2.

In some embodiments, the distance between any two of the gates 2230 is 1 CPP, and each of the interconnect structure 2281 and the dielectric structure 2291 has a length of around 1 CPP along the X direction.

For illustration, the integrated circuit 220 includes conductive lines, and/or vias (not labeled in FIG. 22). In some embodiments, the integrated circuit 220 further includes other components so that the integrated circuit 220 is able to function as an electrical device, such as transistor(s).

Figure 23:
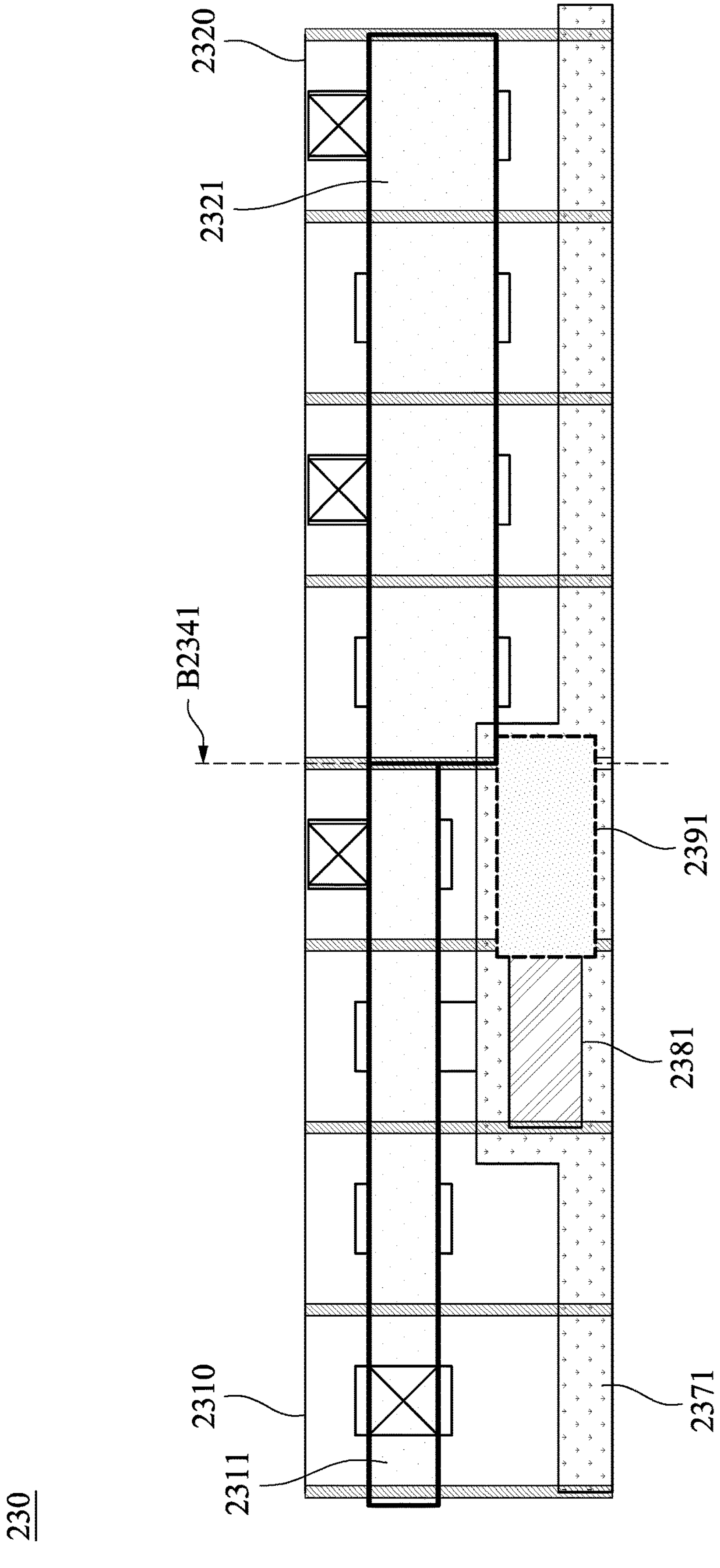
FIG. 23 is a layout diagram in a plan view of a front portion of an integrated circuit including a portion of the integrated circuit in FIG. 21, in accordance with some embodiments of the present disclosure.

Reference is now made to FIG. 23. FIG. 23 is a layout diagram in a plan view of a front portion of an integrated circuit 230 including a portion of the integrated circuit 210 in FIG. 21, in accordance with some embodiments of the present disclosure. The integrated circuit 230 includes cells 2310 and 2320 abutting with each other at a boundary B2341. The cell 2310 includes an active region 2311, and the cell 2320 includes an active region 2321. The cell 2310 further includes an interconnect structure 2381 corresponding to the interconnect structures 2181 and 2281 illustrated in FIGS. 21-22 and a dielectric structure 2391 corresponding to the dielectric structures 2191 and 2291 illustrated in FIGS. 21-22. The integrated circuit 230 also includes a dielectric structure 2371 extending across the cells 2310-2320 along the X direction. The dielectric structure 2371 corresponds to the dielectric structure 2271 illustrated in FIG. 22.

For illustration, the active region 2311 of the cell 2310 has a smaller width in the Y direction, and the active region 2321 of the cell 2320 has a larger width in the Y direction. Such difference results from the interconnect structure 2381 and the dielectric structure 2391 arranged in the cell 2310. In order to form the interconnect structure 2381 and the dielectric structure 2391 arranged in the cell 2310, a portion of the dielectric structure 2371 in the cell 2310 has a larger width in the Y direction, while the portion of the dielectric structure 2371 arranged in the cell 2210 has a smaller width in the Y direction because no the interconnect structure 2381 or the dielectric structure 2391 is arranged in the cell 2320.

The integrated circuit 230 has the dielectric structure 2371 that is similar to the dielectric structure 2271 as illustrated in FIG. 22, and the non-uniform width of the dielectric structure 2271 causes a contact between the dielectric structure 2271 of the cell 2310 and the active region 2321 of the cell 2320 at the boundary B2341. For illustration, the portion of the dielectric structure 2371 having the larger width contacts the active region 2321 at the boundary B2341. In some embodiments, in the process of manufacturing the integrated circuit 230, the contact between the dielectric structure 2371 and the active region 2321 will induce defect in the active region 2321 and cause the malfunction of the active regions 2321.

In some embodiments, in designing the integrated circuit 230, a design rule is implemented and forbids the cells 2310-2320 to abut with each other, to prevent the defect mentioned above. In some embodiments, such design rule is referred to as a abutment constraint.

Figure 24:
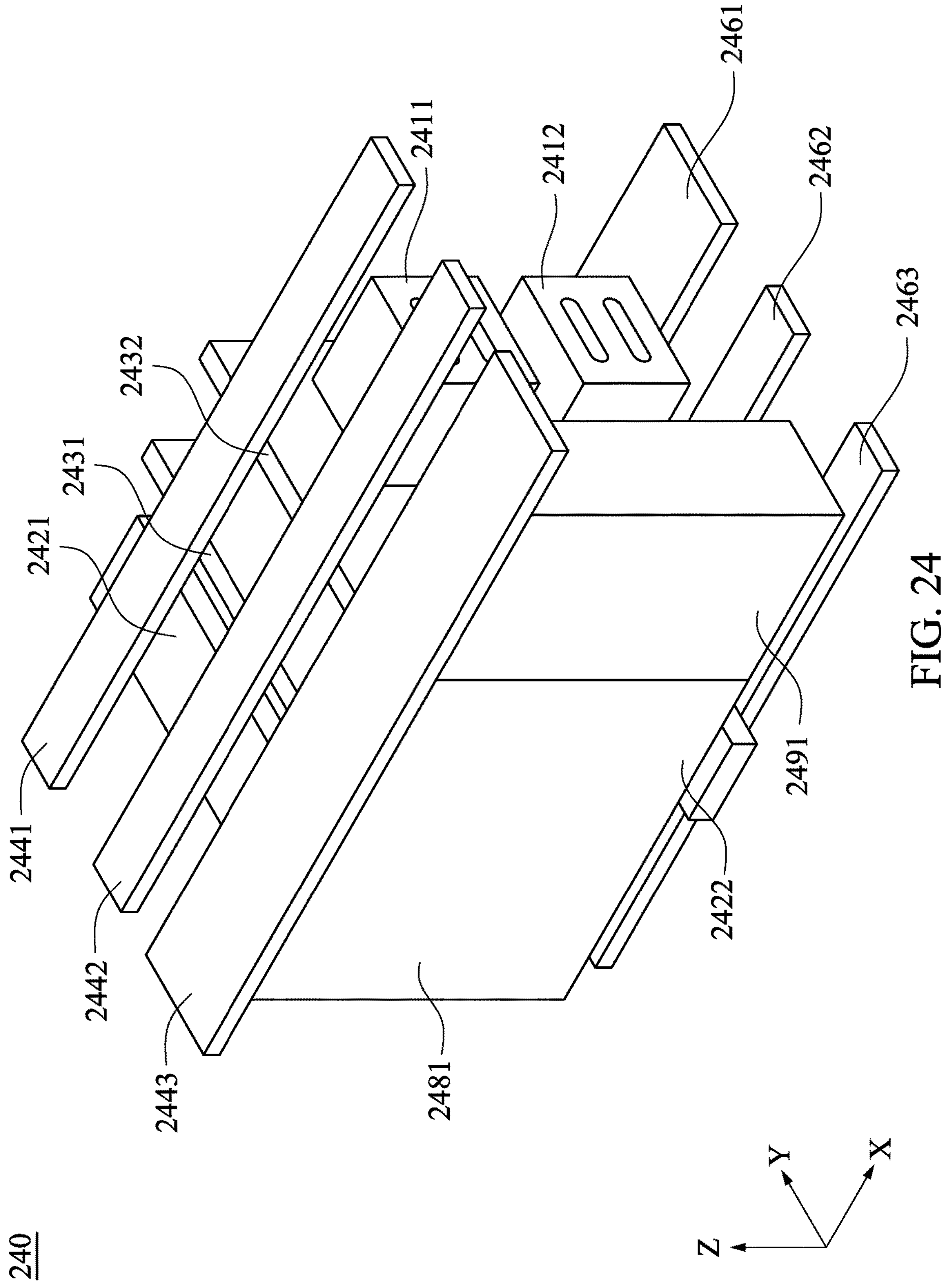
FIG. 24 is a schematic diagram of an integrated circuit, in accordance with various embodiments of the present disclosure.

Reference is now made to FIG. 24. FIG. 24 is a schematic diagram of an integrated circuit 240, in accordance with some embodiments of the present disclosure. The integrated circuit 240 includes active regions 2411-2412, a gate 2431, conductive segments 2421-2422, conductive lines 2441-2443 and 2461-2463, an interconnect structure 2481, and a dielectric structure 2491. In some embodiments, the gate 2431 is referred to as a poly.

For illustration, some components of the integrated circuit 240 have configurations that are similar to the corresponding components of the integrated circuit 210 as illustrated in FIG. 21. For example, the active regions 2411-2412 correspond to the active regions 2111-2112, the gate 2431 corresponds to the gate 2131, the conductive segments 2421-2422 correspond to the conductive segments 2121-2122, and the conductive lines 2441-2443 and 2461-2463 correspond to the conductive lines 2141-2143 and 2161-2163. Previous discussion of these components of the integrated circuit 210 can be referred to in understanding the components of the integrated circuit 240.

For illustration, the integrated circuit 240 includes the interconnect structure 2481 and the dielectric structure 2491. Different from the configuration of the interconnect structure 2181 and the dielectric structure 2191 as illustrated in FIG. 21, the dielectric structure 2491 in FIG. 24 is not disposed above a portion of the interconnect structure 2481 and does not cover a portion of the interconnect structure 2481. Instead, the dielectric structure 2491 is arranged to be right next to the interconnect structure 2481. The dielectric structure 2491 abuts the interconnect structure 2481 along the X direction and has a height in the Z direction that is substantially the same as the height of the interconnect structure 2481.

In some embodiments, the interconnect structure 2481 is made of a conductive material, such as metal, and the dielectric structure 2491 is made of an insulating material with low dielectric constant, such as oxide or nitride. The interconnect structure 2481 is configured to transmit signals between the active regions 2411 and 2412 through the conductive segments 2421-2422. On the other hand, electrical paths are not formed in the dielectric structure 2491, and signals are isolated from the dielectric structure 2491.

In some embodiments, the volume of the interconnect structure 2481 substantially equals to the volume of the interconnect structure 2181 plus the volume of the dielectric structure 2191 illustrated in FIG. 21.

In some embodiments, in order to form the interconnect structure 2481 and the dielectric structure 2491, a conductive structure, such as metal, is filled in first. The conductive structure is a wall-shaped structure. Then, a portion of the conductive structure is then cut or removed, and a cavity is formed. The cavity has a height that is substantially the same as the height of the remained conductive structure. Lastly, a dielectric material is filled into the cavity. The dielectric material filled into the cavity forms the dielectric structure 2491, and the remained conductive structure forms the interconnect structure 2481.

In some embodiments, the interconnect structure 2481 is referred to as a vertical interconnect (VLI) structure, and the dielectric structure 2491 is referred to as a cut vertical interconnect (CVLI) structure.

In some embodiments, compared with the integrated circuit 210 as illustrated in FIG. 21, the interconnect structure 2481 has a width in the Y direction that is smaller than the width of the interconnect structure 2181, the dielectric structure 2491 has a width in the Y direction that is smaller than the width of the dielectric structure 2191, the active region 2411 has a width in the Y direction that is larger than the active region 2111, and the active 2412 has a width in the Y direction that is larger than the active region 2112. Alternatively stated, because of the widths of the interconnect structure 2481 and the dielectric structure 2491 are reduced, the widths of the active regions 2411-2412 are increased. In some embodiments, the active regions 2411-2412 with increased widths include wider active regions 2411-2412. This allows larger currents passing through the active regions 2411-2412, and thus the performance of the integrated circuit 240 is better than the integrated circuit 210.

Figure 25:
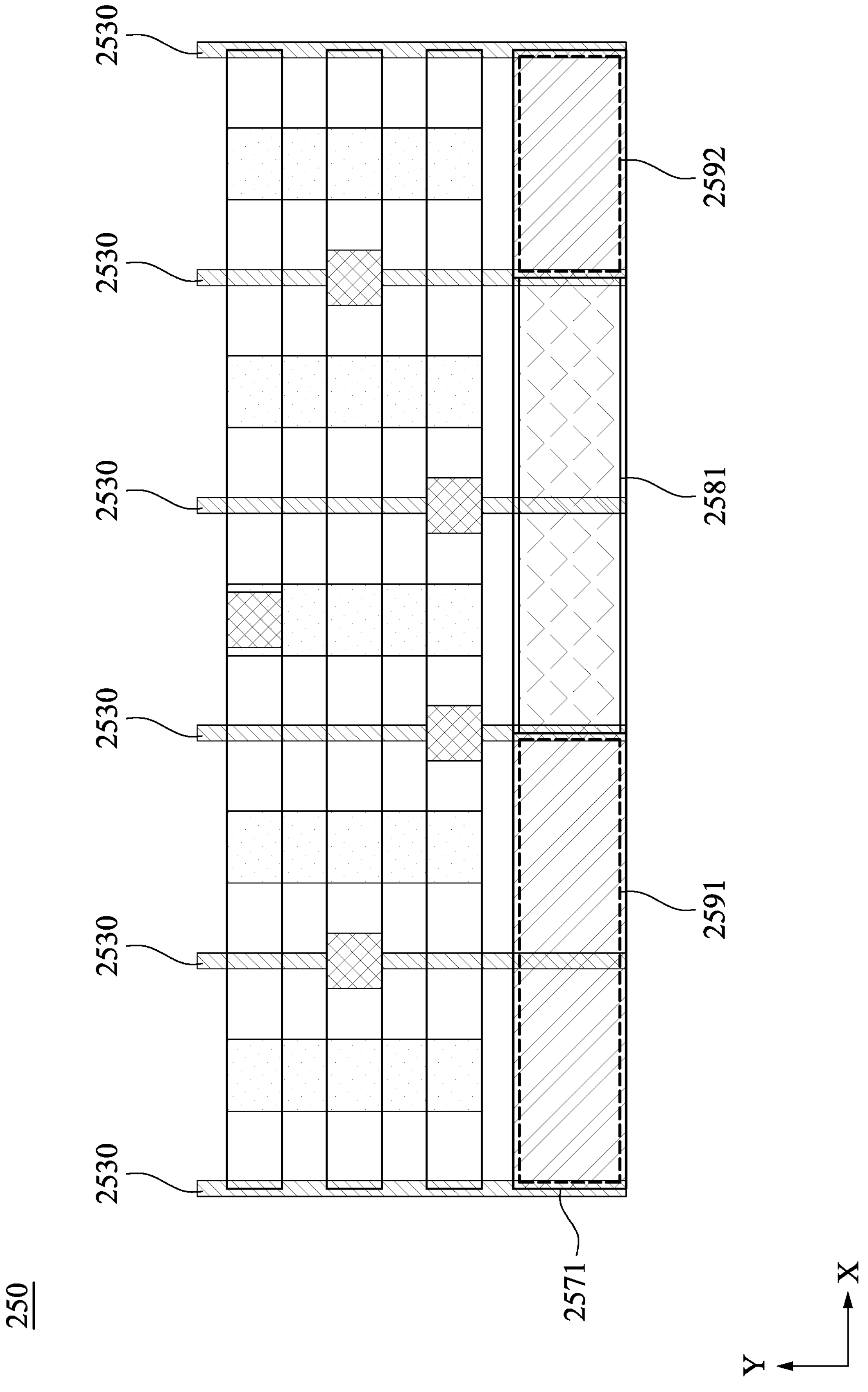
FIG. 25 is a layout diagram in a plan view of a front portion of an integrated circuit including a portion of the integrated circuit in FIG. 24, in accordance with some embodiments of the present disclosure.

Reference is now made to FIG. 25. FIG. 25 is a layout diagram in a plan view of a front portion of an integrated circuit 250 including a portion of the integrated circuit 240 in FIG. 24, in accordance with some embodiments of the present disclosure. The integrated circuit 250 includes gates 2530, an interconnect structure 2581, dielectric structures 2591-2592, and a dielectric structure 2571.

The integrated circuit 250 has components similar to the interconnect structure 2481 and the dielectric structure 2491 illustrated in FIG. 24 for signal transmission and isolation. For illustration of FIGS. 24-25, the interconnect structure 2581 corresponds to the interconnect structure 2481, the dielectric structure 2592 corresponds to the dielectric structure 2491. The interconnect structure 2581 and the dielectric structure 2592 are abutted with each other along the X direction.

For illustration, the integrated circuit 250 further includes a dielectric structure 2591. The dielectric structure 2591 abuts the interconnect structure 2581 along the X direction. Similar to the function of the dielectric structure 2592, the dielectric structure 2591 is configured for signal isolation.

In various embodiments, the integrated circuit 250 only includes the dielectric structure 2592 abutting the interconnect structure 2581 and does not include the dielectric structure 2591.

For illustration, the dielectric structure 2571 surrounds the interconnect structure 2581 and the dielectric structures 2591-2592. In some embodiments, the dielectric structure 2571 is configured to separate the interconnect structure 2581 and the dielectric structures 2591-2592 from the gates 2530, or from other components or devices, and is filled in before the interconnect structure 2581 and the dielectric structures 2591-2592 in the process of manufacturing the integrated circuit 250. In some embodiments, the dielectric structure 2571 is made of an insulating material with low dielectric constant.

In some embodiments, portions of the gates 2530 are cut and removed, and then the dielectric structure 2571 is filled in. In some embodiments, the dielectric structure 2571 is referred to as a cut-poly (CPO) structure.

For illustration, different from the dielectric structure 2271 illustrated in FIG. 22, the dielectric structure 2571 does not have a jog distance, and the width of the dielectric structure 2571 in the Y direction is uniform. Alternatively stated, different portions of the dielectric structure 2571 all have the same widths in the Y direction.

In some embodiments, compared with the integrated circuit 220 as illustrated in FIG. 22, the interconnect structure 2581 has a width in the Y direction that is smaller than the width of the interconnect structure 2281, and each of the dielectric structures 2591-2592 has a width in the Y direction that is smaller than the width of the dielectric structure 2291.

In some embodiments, the distance between any two of the gates 2530 is 1 CPP. For illustration, the interconnect structure 2581 has a length around 2 CPP in the X direction, the dielectric structure 2591 has a length around 2 CPP in the X direction, and the dielectric structure 2592 has a length around 1 CPP in the X direction.

For illustration, the integrated circuit 250 includes conductive lines, and/or vias (not labeled in FIG. 25). In some embodiments, the integrated circuit 250 further includes other components so that the integrated circuit 250 is able to function as an electrical device, such as transistor(s).

Figure 26:
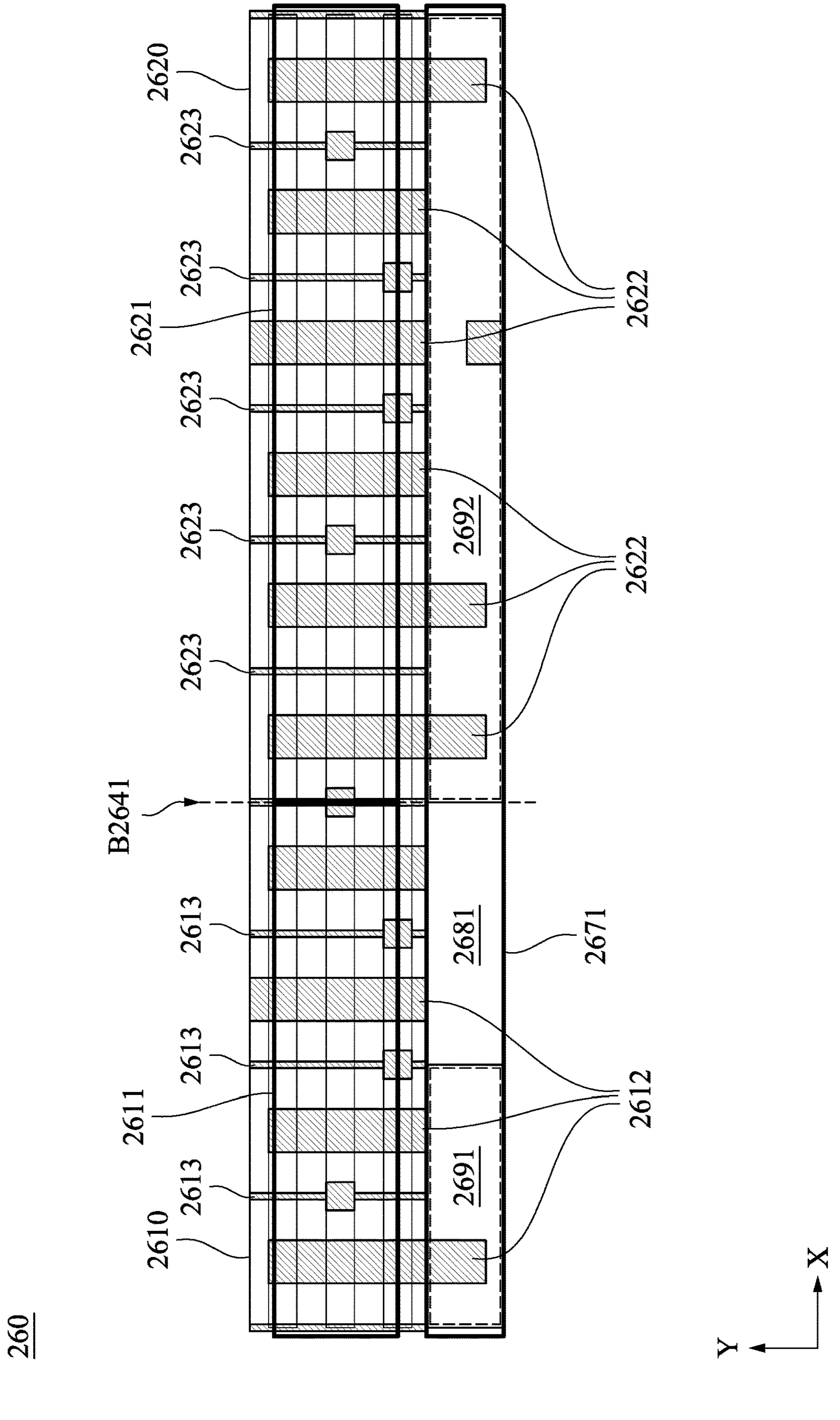
FIG. 26 is a layout diagram in a plan view of a front portion of an integrated circuit including a portion of the integrated circuit in FIG. 24, in accordance with some embodiments of the present disclosure.

Reference is now made to FIG. 26. FIG. 26 is a layout diagram in a plan view of a front portion of an integrated circuit 260 including a portion of the integrated circuit 240 in FIG. 24, in accordance with some embodiments of the present disclosure. The integrated circuit 260 includes cells 2610 and 2620 abutting with each other at a boundary B2641. The cell 2610 includes an active region 2611, conductive segments 2612, and gates 2613, and the cell 2620 includes an active region 2621, conductive segments 2622, and gates 2623. The cell 2610 further includes an interconnect structure 2681 corresponding to the interconnect structures 2481 and 2581 illustrated in FIGS. 24-25 and a dielectric structure 2691 corresponding to the dielectric structures 2491 and 2591-2592 illustrated in FIGS. 24-25. The cell 2620 further includes a dielectric structure 2692. The integrated circuit 260 also includes a dielectric structure 2671 extending across the cells 2610-2620 along the X direction and surrounding the interconnect structure 2681 and the dielectric structures 2691-2692. The dielectric structure 2671 corresponds to the dielectric structure 2571 illustrated in FIG. 25.

In some embodiments, the active region 2611 is arranged at the front side of the integrated circuit 260 and is stacked over another active region (not shown in FIG. 26) arranged at the back side of the integrated circuit 260, and the two active regions are referred to as a pair of active regions. The active region 2621 is arranged at the front side of the integrated circuit 260 and is stacked over another active region (not shown in FIG. 26) arranged at the back side of the integrated circuit 260, and the two active regions are referred to as a pair of active regions.

In some embodiments, the gates 2613 extend in the Y direction and are arranged across the pair of active regions including the active region 2611, to form a pair of devices that are stacked on each other. The gates 2623 extend in the Y direction and are arranged across the pair of active regions including the active region 2621, to form a pair of devices that are stacked on each other.

For illustration, at least one of the conductive segments 2612 is coupled to the active region 2611, and at least one of the conductive segments 2622 is coupled to the active region 2621.

For illustration, different from the active region 2311 of the cell 2310 and the active region 2321 of the cell 2320 having different widths as illustrated in FIG. 23, the active region 2611 of the cell 2610 and the active region 2621 of the cell 2620 have substantially the same widths in the Y direction. Such difference between the active regions of the integrated circuits 230 and 260 results from the dielectric structure 2671 that has a uniform width in the Y direction. Because the dielectric structure 2671 has a uniform width in the Y direction, the active regions 2611 and 2621 are able to have the same widths.

In some embodiments, compared with the integrated circuit 230 illustrated in FIG. 23, the width of the dielectric structure 2671 is smaller than the width of the dielectric structure 2371.

In some embodiments, because of the uniform width of the dielectric structure 2671, the design rule that forbids the cells 2310-2320 to abut with each other as mentioned in previous embodiments is not involved in manufacturing the integrated circuit 260.

In some embodiments, each of the cells 2610-2620 includes a pair of active regions stacked on each other, at least one gate extending in the Y direction, and at least one conductive segment (not labeled in FIG. 26).

Figure 27A:
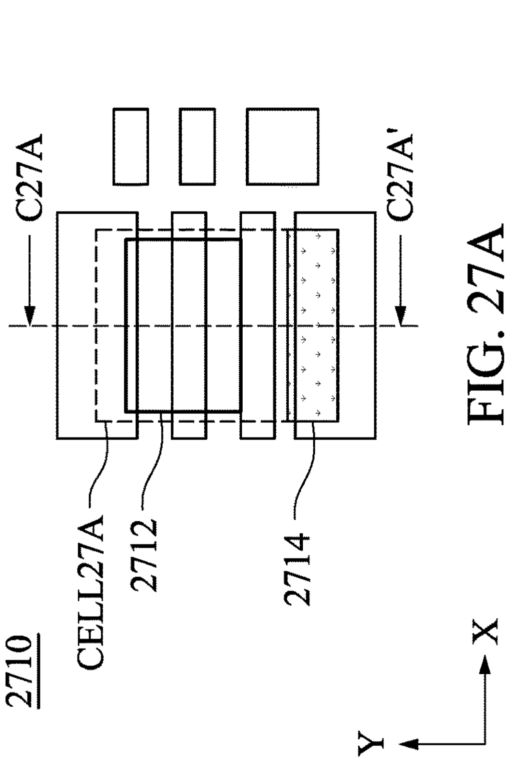
FIG. 27A is a layout diagram in a plan view of a front portion of an integrated circuit, in accordance with some embodiments of the present disclosure.
Figure 27B:
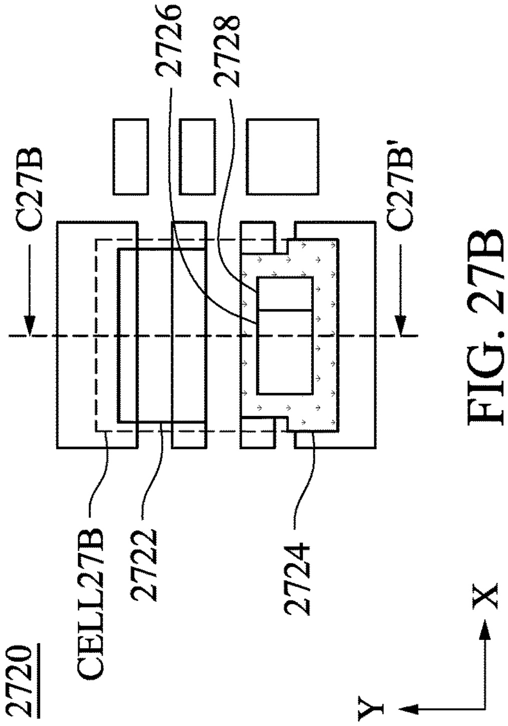
FIG. 27B is a layout diagram in a plan view of a front portion of an integrated circuit, in accordance with some embodiments of the present disclosure.

Reference is now made to FIGS. 27A-27B. FIG. 27A is a layout diagram in a plan view of a front portion of an integrated circuit 2710, in accordance with some embodiments of the present disclosure. The integrated circuit 2710 includes a cell CELL27A. The cell CELL27A includes an active region 2712 and a dielectric structure 2714.

FIG. 27B is a layout diagram in a plan view of a front portion of an integrated circuit 2720, in accordance with some embodiments of the present disclosure. The integrated circuit 2720 includes a cell CELL27B. The cell CELL27B includes an active region 2722, a dielectric structure 2724, an interconnect structure 2726, and a dielectric structure 2728.

In some embodiments, the cells CELL27A-CELL27B are arranged to abut with each other along the X direction.

The integrated circuits 2710-2720 illustrated in FIGS. 27A-27B correspond to the previous embodiments in FIGS. 21-23, where the CPO structure has a jog distance due to the VLI and CVLI structures. The cell CELL27A corresponds to the cell 2320, and the cell CELL27B corresponds to a portion of the cell 2310. The interconnect structure 2726 corresponds to the interconnect structures 2181, 2281, and 2381 in FIGS. 21-23. The dielectric structure 2728 corresponds to the dielectric structures 2191, 2291, and 2391 in FIGS. 21-23. The dielectric structures 2724 and 2714 correspond to the dielectric structures 2271 and 2371 in FIGS. 22-23.

For illustration of FIGS. 27A-27B, the dielectric structure 2714 has a smaller width in the Y direction, and the dielectric structure 2724 has a larger width in the Y direction because of the interconnect structure 2726 and the dielectric structure 2728. The active region 2712 has a larger width in the Y direction and the active region 2722 has a smaller width in the Y direction.

Figure 28A:
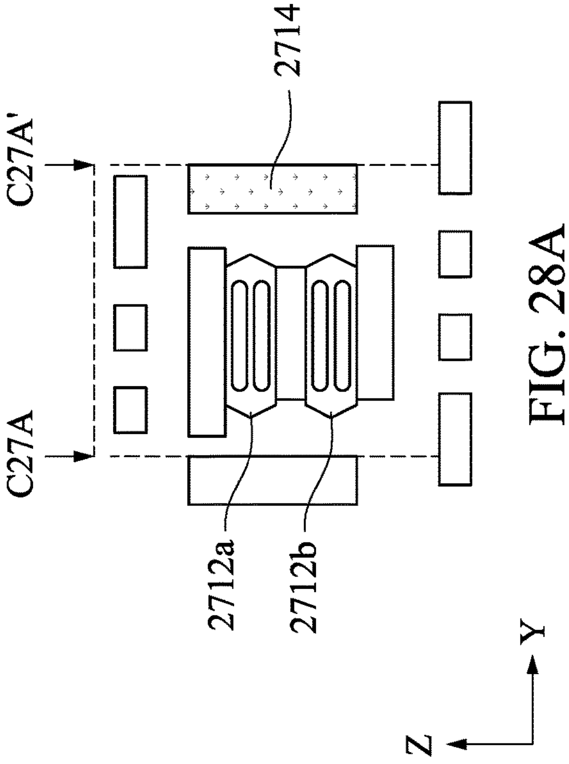
FIG. 28A is a cross-sectional diagram of the integrated circuit along line C27A-C27A' in FIG. 27A, in accordance with some embodiments of the present disclosure.
Figure 28B:
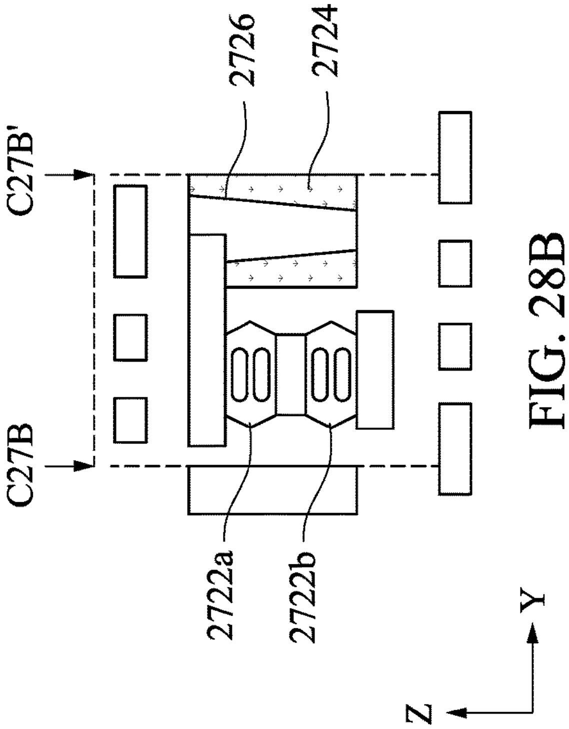
FIG. 28B is a cross-sectional diagram of the integrated circuit along line C27B-C27B' in FIG. 27B, in accordance with some embodiments of the present disclosure.

Reference is now made to FIGS. 28A-28B. FIG. 28A is a cross-sectional diagram of the integrated circuit 2710 along line C27A-C27A' in FIG. 27A, in accordance with some embodiments of the present disclosure.

For illustration of FIG. 28A, the integrated circuit 2710 has a pair of active regions 2712*a*-2712*b* stacked over each other along the Z direction. The pair of active regions 2712*a*-2712*b* in FIG. 28A correspond to the active region 2712 illustrated in FIG. 27A.

FIG. 28B is a cross-sectional diagram of the integrated circuit 2720 along line C27B-C27B' in FIG. 27B, in accordance with some embodiments of the present disclosure.

For illustration of FIG. 28B, the integrated circuit 2720 has a pair of active regions 2722*a*-2722*b* stacked over each other along the Z direction. The pair of active regions 2722*a*-2722*b* in FIG. 28B correspond to the active region 2722 illustrated in FIG. 27B.

For illustration of FIGS. 28A-28B, the pair of active regions 2712*a*-2712*b* has larger widths in the Y direction, and the pair of active regions 2722*a*-2722*b* has smaller widths in the Y direction. The dielectric structure 2714 has a smaller width in the Y direction, and the dielectric structure 2724 has a larger width in the Y direction.

Figure 29A:
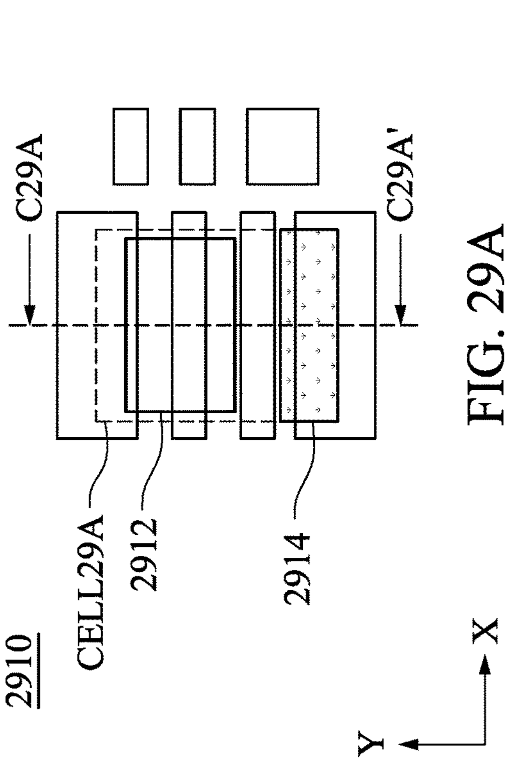
FIG. 29A is a layout diagram in a plan view of a front portion of an integrated circuit, in accordance with some embodiments of the present disclosure.
Figure 29B:
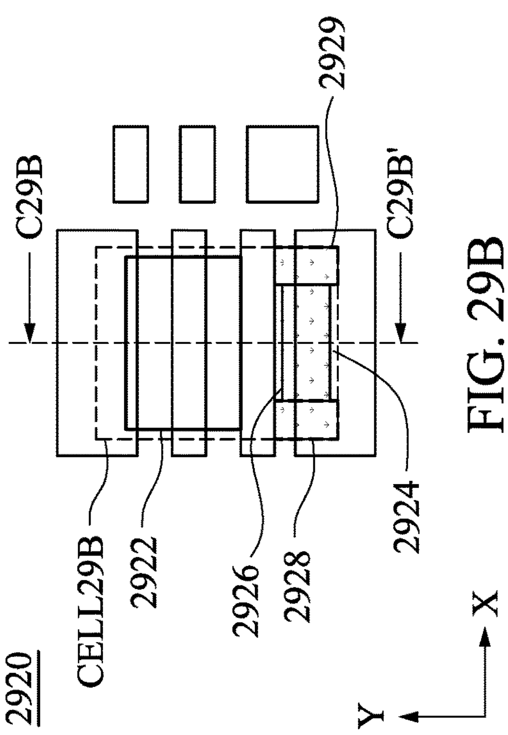
FIG. 29B is a layout diagram in a plan view of a front portion of an integrated circuit, in accordance with some embodiments of the present disclosure.

Reference is now made to FIGS. 29A-29B. FIG. 29A is a layout diagram in a plan view of a front portion of an integrated circuit 2910, in accordance with some embodiments of the present disclosure. The integrated circuit 2910 includes a cell CELL29A. The cell CELL29A includes an active region 2912 and a dielectric structure 2914.

FIG. 29B is a layout diagram in a plan view of a front portion of an integrated circuit 2920, in accordance with some embodiments of the present disclosure. The integrated circuit 2920 includes a cell CELL29B. The cell CELL29B includes an active region 2922, a dielectric structure 2924, an interconnect structure 2926, and dielectric structures 2928-2929.

In some embodiments, the dielectric structures 2714, 2724, 2914, and 2924 as shown in FIGS. 27A-30B are referred to as cut-poly (CPO) structures.

In some embodiments, the cells CELL29A-CELL29B are arranged to abut with each other along the X direction.

The integrated circuits 2910-2920 illustrated in FIGS. 29A-29B correspond to the previous embodiments in FIGS. 24-26, where the CPO structure has no jog distance and has a uniform width in the Y direction. The cell CELL29A corresponds to the cell 2620, and the cell CELL29B corresponds to the cell 2610. The interconnect structure 2926 corresponds to the interconnect structures 2481, 2581, and 2681 in FIGS. 24-26. The dielectric structures 2928-2929 correspond to the dielectric structures 2491, 2591-2592, and 2691-2692 in FIGS. 24-26. The dielectric structures 2924 and 2914 correspond to the dielectric structures 2571 and 2671 in FIGS. 25-26.

For illustration of FIGS. 29A-29B, the dielectric structures 2914 and 2924 have substantially the same widths in the Y direction, and the active regions 2912 and 2922 have substantially the same widths in the Y direction.

Figure 30A:
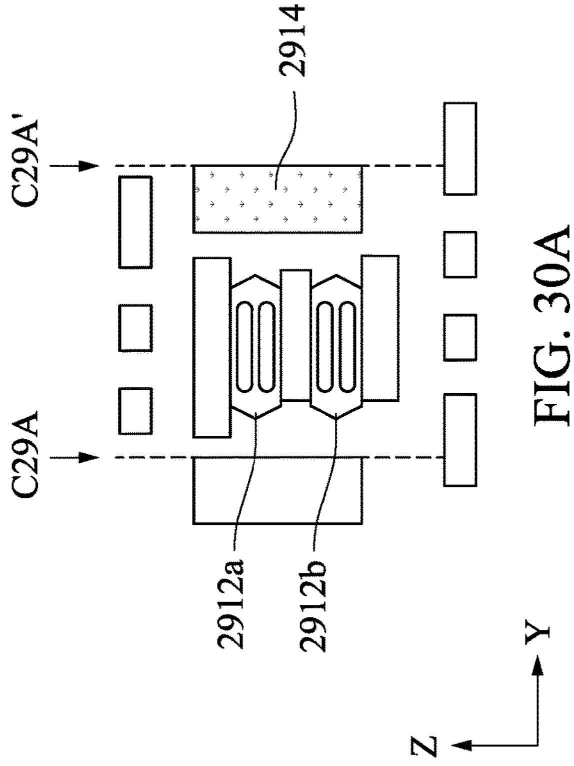
FIG. 30A is a cross-sectional diagram of the integrated circuit along line C29A-C29A' in FIG. 29A, in accordance with some embodiments of the present disclosure.
Figure 30B:
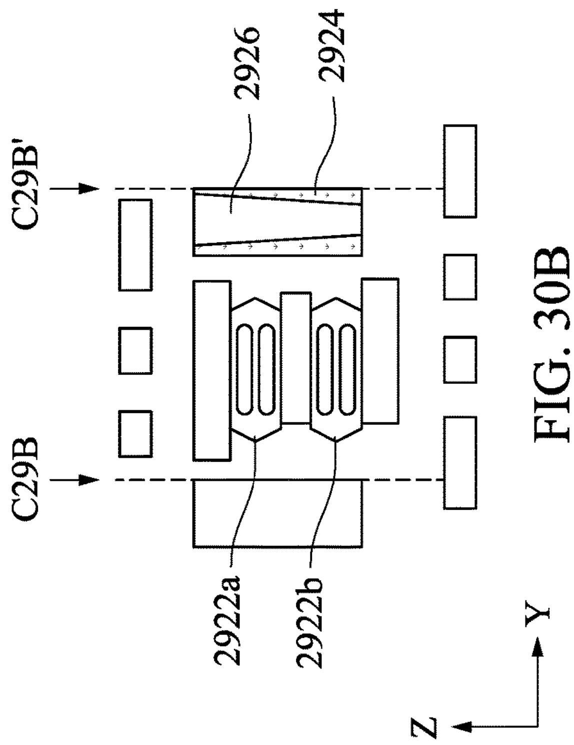
FIG. 30B is a cross-sectional diagram of the integrated circuit along line C29B-C29B' in FIG. 29B, in accordance with some embodiments of the present disclosure.

Reference is now made to FIGS. 30A-30B. FIG. 30A is a cross-sectional diagram of the integrated circuit 2910 along line C29A-C29A' in FIG. 29A, in accordance with some embodiments of the present disclosure.

For illustration of FIG. 30A, the integrated circuit 2910 has a pair of active regions 2912*a*-2912*b* stacked over each other along the Z direction. The pair of active regions 2912*a*-2912*b* in FIG. 30A correspond to the active region 2912 illustrated in FIG. 29A.

FIG. 30B is a cross-sectional diagram of the integrated circuit 2920 along line C29B-C29B' in FIG. 29B, in accordance with some embodiments of the present disclosure.

For illustration of FIG. 30B, the integrated circuit 2920 has a pair of active regions 2922*a*-2922*b* stacked over each other along the Z direction. The pair of active regions 2922*a*-2922*b* in FIG. 30B correspond to the active region 2922 illustrated in FIG. 29B.

For illustration of FIGS. 30A-30B, the pair of active regions 2912*a*-2912*b* and the pair of active regions 2922*a*-2922*b* have substantially the same widths in the Y direction, and the dielectric structures 2914 and 2924 have substantially the same widths in the Y direction.

For illustration, the integrated circuits 2710-2710 and 2910-2920 include conductive lines, and/or vias (not labeled in FIGS. 27A-30B). In some embodiments, the integrated circuits 2710-2710 and 2910-2920 further include other components so that the integrated circuits 2710-2710 and 2910-2920 are able to function as electrical devices, such as transistors.

Reference is now made FIGS. 31A-31D. FIGS. 31A-31D are schematic diagrams illustrating a process of manufacturing an integrated circuit 310, in accordance with some embodiments of the present disclosure. The integrated circuit 310 corresponds to the previous embodiments where the CPO structure has a jog distance and does not have a uniform width in the Y direction, such as the integrated circuits 210, 220, and 2720 as illustrated in FIGS. 21-22, 27B, and 28B.

Figure 31A:
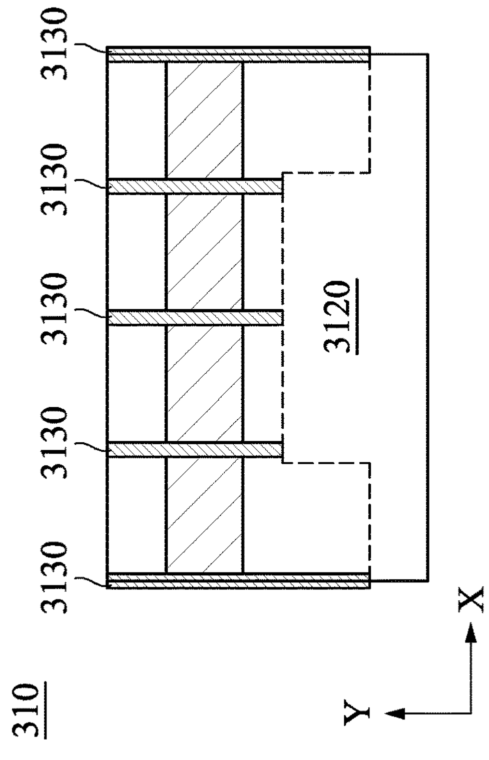
FIGS. 31A-31D are schematic diagrams illustrating a process of manufacturing an integrated circuit, in accordance with some embodiments of the present disclosure.
Figure 31B:
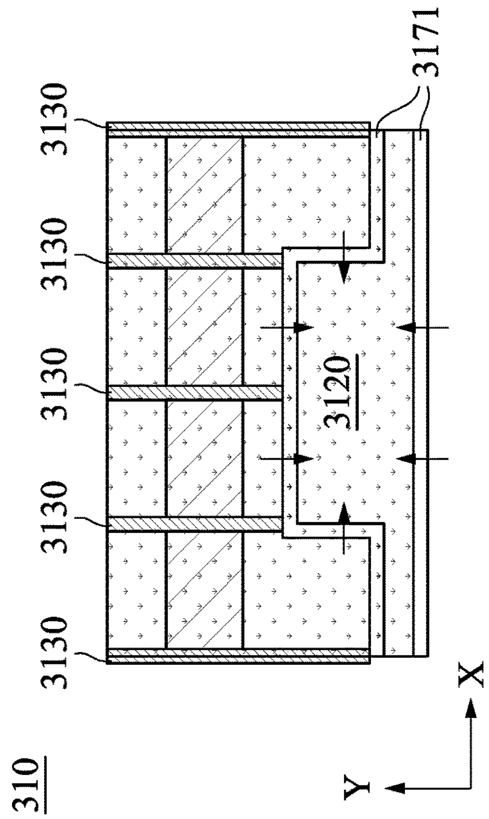
Figure 31C:
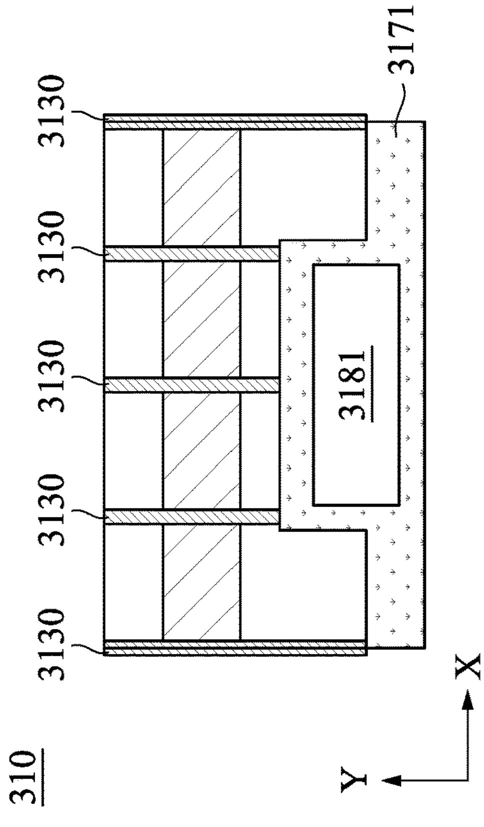
Figure 31D:
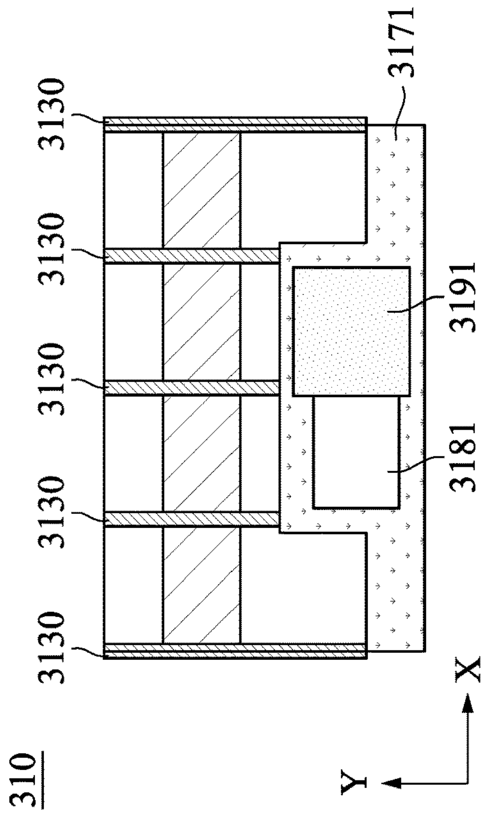

FIGS. 31A-31D illustrate the steps to manufacture the integrated circuit 310 as illustrated in FIG. 31D. First, as illustrated in FIG. 31A, portions of gates 3130 are cut and removed away, and a space 3120 is formed.

Second, as illustrated in FIG. 31B, a dielectric structure 3171 is filled into the space 3120 inwardly. The dielectric structure 3171 corresponds to the dielectric structures 2271, 2371, and 2724 as illustrated in FIGS. 22-23 and 27B. The dielectric structure 3171 occupies merely a portion of the space 3120.

Third, as illustrated in FIG. 31C, an interconnect structure 3171 is filled into the remained space 3120.

Lastly, as illustrated in FIG. 31D, a portion of the interconnect structure 3181 is cut and removed away, and a cavity (not shown in FIG. 31D) is formed. A dielectric structure 3191 is then filled into the cavity. The remained interconnect structure 3181 as illustrated in FIG. 31D corresponds to the interconnect structures 2281, 2381, and 2724 as illustrated in FIGS. 22-23 and 27B. The dielectric structure 3191 corresponds to the dielectric structures 2291, 2391, and 2728 as illustrated in FIGS. 22-23 and 27B.

For illustration of FIGS. 31A-31D, the resulting dielectric structure 3171 has a jog distance and has a non-uniform width in the Y direction, as discussed in previous embodiments.

Reference is now made FIGS. 32A-32D. FIGS. 32A-32D are schematic diagrams illustrating a process of manufacturing an integrated circuit 320, in accordance with some embodiments of the present disclosure. The integrated circuit 320 corresponds to the previous embodiments where the CPO structure has no jog distance and has a uniform width in the Y direction, such as the integrated circuits 240, 250, 260, and 2920 as illustrated in FIGS. 24-26, 29B, and 30B.

Figure 32A:
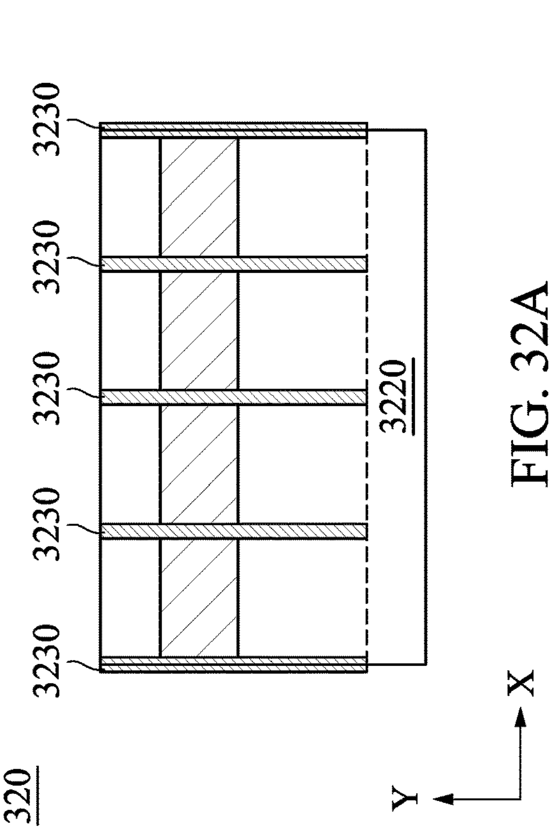
FIGS. 32A-32D are schematic diagrams illustrating a process of manufacturing an integrated circuit, in accordance with some embodiments of the present disclosure.
Figure 32B:
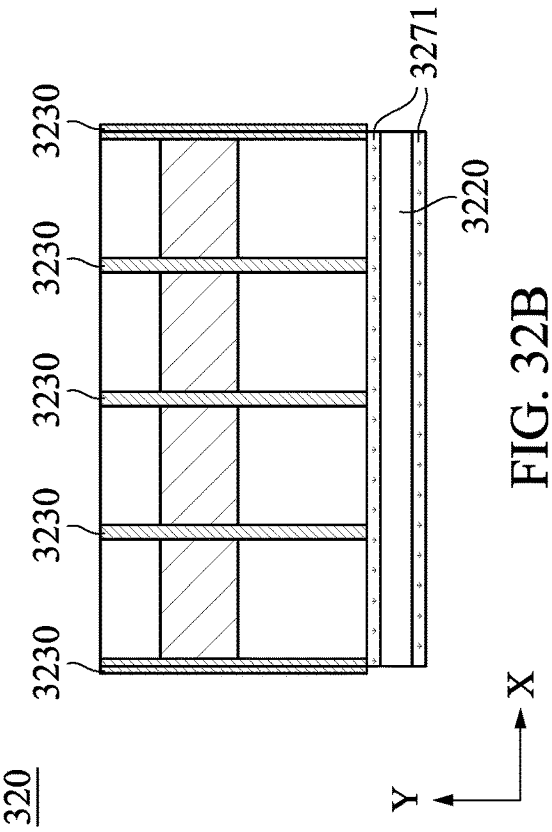
Figure 32C:
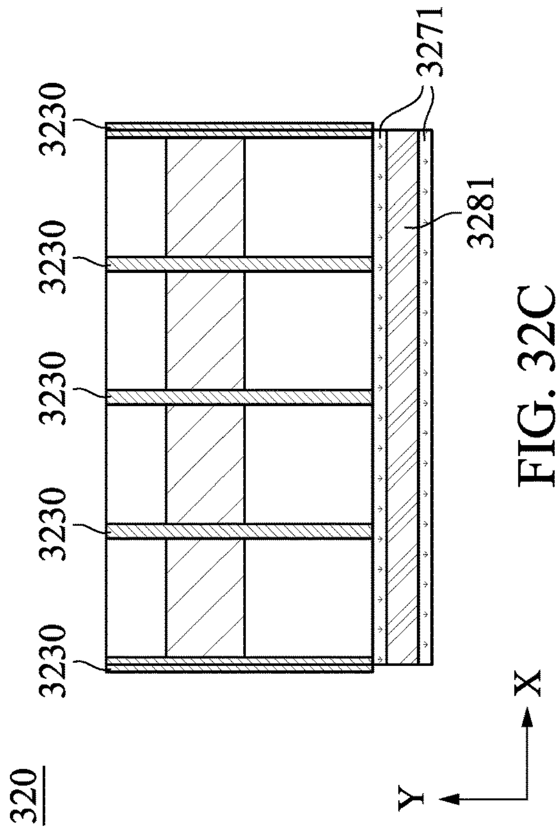
Figure 32D:
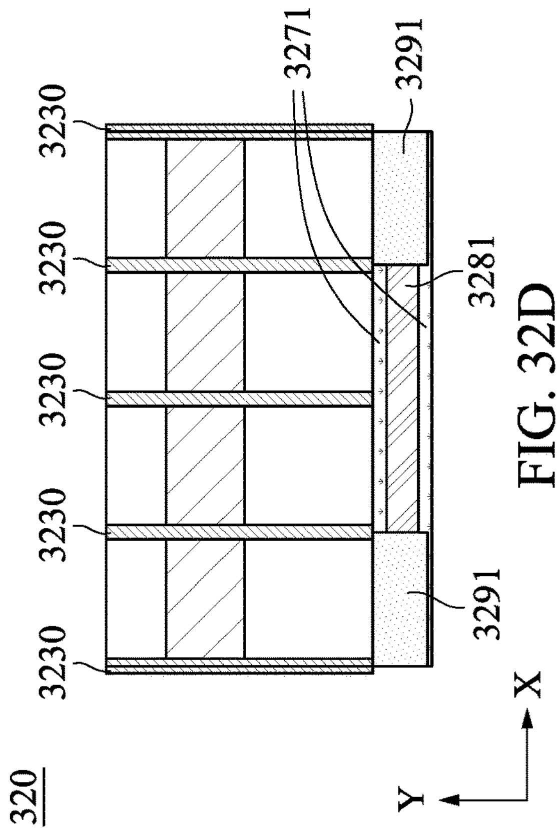

FIGS. 32A-32D illustrate the steps to manufacture the integrated circuit 320 as illustrated in FIG. 32D. First, as illustrated in FIG. 32A, portions of gates 3230 are cut and removed away, and a space 3220 is formed.

In some embodiments, a same portion of each of the gates 3230 is cut and removed away.

Second, as illustrated in FIG. 32B, a dielectric structure 3271 is filled into the space 3220 inwardly. The dielectric structure 3271 corresponds to the dielectric structures 2571, 2671, and 2924 as illustrated in FIGS. 25-26, 29B, and 30B. The dielectric structure 3271 occupies merely a portion of the space 3220.

Third, as illustrated in FIG. 32C, an interconnect structure 3271 is filled into the remained space 3220.

Lastly, as illustrated in FIG. 32D, two portions of the interconnect structure 3281 are cut and removed away, and two cavities (not shown in FIG. 32D) are formed. Two dielectric structures 3291 are then filled into the cavities. The remained interconnect structure 3281 as illustrated in FIG. 32D corresponds to the interconnect structures 2581, 2681, and 2924 as illustrated in FIGS. 25-26, 29B, and 30B. The dielectric structures 3291 correspond to the dielectric structures 2591-2592, 2691-2692, and 2928 as illustrated in FIGS. 25-26, 29B, and 30B.

In various embodiments, only one dielectric structure 3291 is formed in the integrated circuit 320.

For illustration of FIGS. 32A-32D, the resulting dielectric structure 3271 has a uniform width in the Y direction, as discussed in previous embodiments.

Therefore, through FIGS. 21-32D, the present disclosure discloses integrated circuits having an interconnect structure with reduced volume and integrated circuits having dielectric structures with uniform widths for signal isolation. Such integrated circuits have an improved performance, allow active regions to have uniform widths, and release the abutment constraint(s) discussed in previous embodiments.

Figure 33:
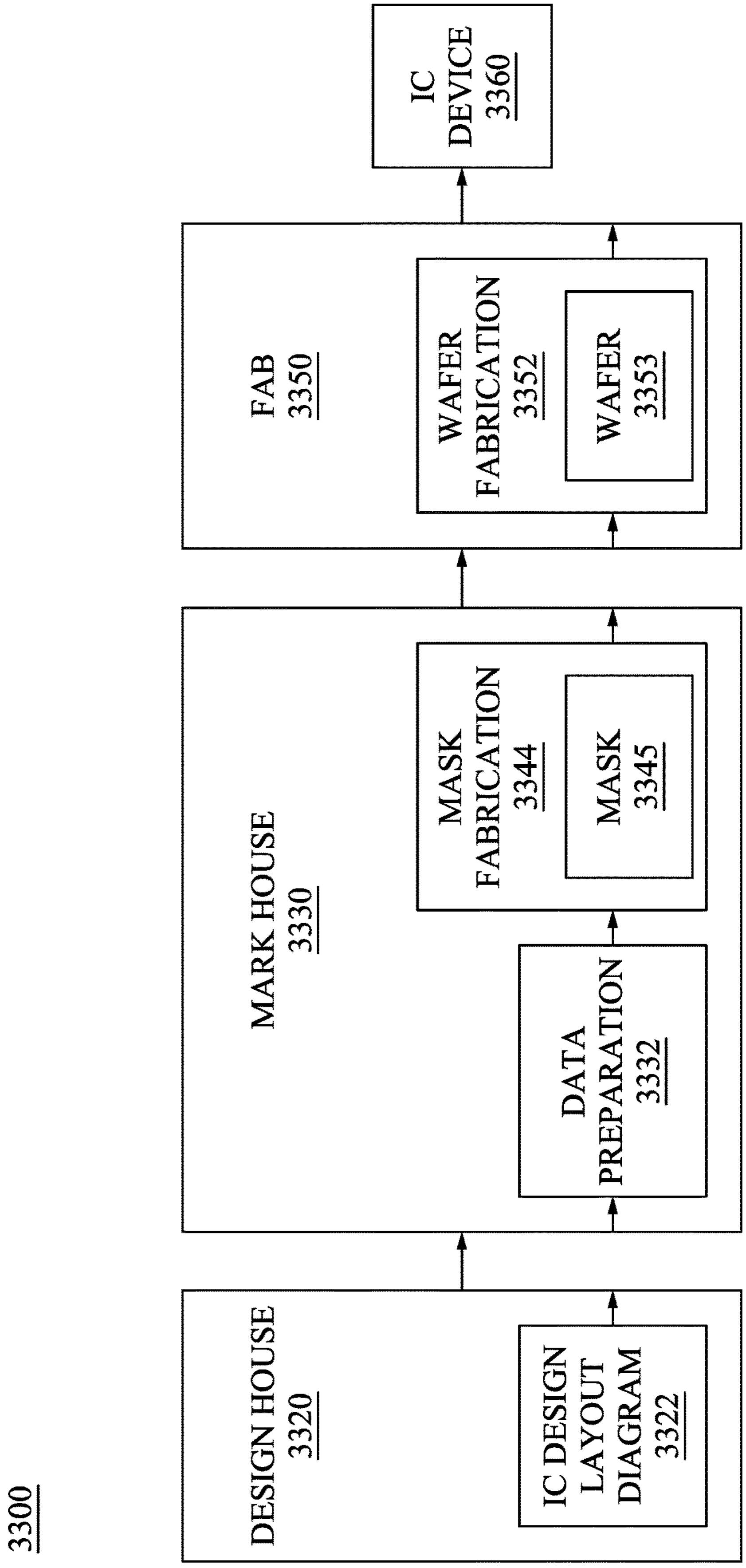
FIG. 33 is a block diagram of IC manufacturing system, and an IC manufacturing flow associated therewith, in accordance with some embodiments of the present disclosure.

FIG. 33 is a block diagram of IC manufacturing system 3300, and an IC manufacturing flow associated therewith, in accordance with some embodiments of the present disclosure. In some embodiments, based on a layout diagram, at least one of (A) one or more semiconductor masks or (B) at least one component in a layer of a semiconductor integrated circuit is fabricated using IC manufacturing system 3300.

In FIG. 33, the IC manufacturing system 3300 includes entities, such as a design house 3320, a mask house 3330, and an IC manufacturer/fabricator ("fab") 3350, that interact with one another in the design, development, and manufacturing cycles and/or services related to manufacturing an IC device 3360. The entities in IC manufacturing system 3300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 3320, mask house 3330, and IC fab 3350 is owned by a single larger company. In some embodiments, two or more of design house 3320, mask house 3330, and IC fab 3350 coexist in a common facility and use common resources.

Design house (or design team) 3320 generates an IC design layout diagram 3322. IC design layout diagram 3322 includes various geometrical patterns, for example, an IC layout design depicted in FIGS. 2A-32D, designed for an IC device 3360, for example, the integrated circuits discussed above with respect to FIGS. 1-32D. The geometrical patterns correspond to patterns of metal, oxide, or semiconductor layers that make up the various components of IC device 3360 to be fabricated. The various layers combine to form various IC features. For example, a portion of IC design layout diagram 3322 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 3320 implements a proper design procedure to form IC design layout diagram 3322. The design procedure includes one or more of logic design, physical design or place and route. IC design layout diagram 3322 is presented in one or more data files having information of the geometrical patterns. For example, IC design layout diagram 3322 can be expressed in a GDSII file format or DFII file format.

Mask house 3330 includes data preparation 3332 and mask fabrication 3344. Mask house 3330 uses IC design layout diagram 3322 to manufacture one or more masks 3345 to be used for fabricating the various layers of IC device 3360 according to IC design layout diagram 3322. Mask house 3330 performs mask data preparation 3332, where IC design layout diagram 3322 is translated into a representative data file ("RDF"). Mask data preparation 3332 provides the RDF to mask fabrication 3344. Mask fabrication 3344 includes a mask writer. A mask writer converts the RDF to an image on a substrate, such as a mask (reticle) 3345 or a semiconductor wafer 3353. The IC design layout diagram 3322 is manipulated by mask data preparation 3332 to comply with particular characteristics of the mask writer and/or requirements of IC fab 3350. In FIG. 33, data preparation 3332 and mask fabrication 3344 are illustrated as separate elements. In some embodiments, data preparation 3332 and mask fabrication 3344 can be collectively referred to as mask data preparation.

In some embodiments, data preparation 3332 includes optical proximity correction (OPC) which uses lithography enhancement techniques to compensate for image errors, such as those that can arise from diffraction, interference, other process effects and the like. OPC adjusts IC design layout diagram 3322. In some embodiments, data preparation 3332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 3332 includes a mask rule checker (MRC) that checks the IC design layout diagram 3322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 3322 to compensate for limitations during mask fabrication 3344, which may undo part of the modifications performed by OPC in order to meet mask creation rules.

In some embodiments, data preparation 3332 includes lithography process checking (LPC) that simulates processing that will be implemented by IC fab 3350 to fabricate IC device 3360. LPC simulates this processing based on IC design layout diagram 3322 to create a simulated manufactured device, such as IC device 3360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 3322.

It should be understood that the above description of data preparation 3332 has been simplified for the purposes of clarity. In some embodiments, data preparation 3332 includes additional features such as a logic operation (LOP) to modify the IC design layout diagram 3322 according to manufacturing rules. Additionally, the processes applied to IC design layout diagram 3322 during data preparation 3332 maybe executed in a variety of different orders.

After data preparation 3332 and during mask fabrication 3344, a mask 3345 or a group of masks 3345 are fabricated based on the modified IC design layout diagram 3322. In some embodiments, mask fabrication 3344 includes performing one or more lithographic exposures based on IC design layout diagram 3322. In some embodiments, an electron-beam (e-beam) or a mechanism of multiple e-beams is used to form a pattern on a mask (photomask or reticle) 3345 based on the modified IC design layout diagram 3322. Mask 3345 can be formed in various technologies. In some embodiments, mask 3345 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 3345 includes a transparent substrate (for example, fused quartz) and an opaque material (for example, chromium) coated in the opaque regions of the binary mask. In another example, mask 3345 is formed using a phase shift technology. In a phase shift mask (PSM) version of mask 3345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 3344 is used in a variety of processes. For example, such a mask(s) is used in an ion implantation process to form various doped regions in semiconductor wafer 3353, in an etching process to form various etching regions in semiconductor wafer 3353, and/or in other suitable processes.

IC fab 3350 includes wafer fabrication 3352. IC fab 3350 is an IC fabrication business that includes one or more manufacturing facilities for the fabrication of a variety of different IC products. In some embodiments, IC Fab 3350 is a semiconductor foundry. For example, there may be a manufacturing facility for the front end fabrication of a plurality of IC products (front-end- of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 3350 uses mask(s) 3345 fabricated by mask house 3330 to fabricate IC device 3360. Thus, IC fab 3350 at least indirectly uses IC design layout diagram 3322 to fabricate IC device 3360. In some embodiments, semiconductor wafer 3353 is fabricated by IC fab 3350 using mask(s) 3345 to form IC device 3360. In some embodiments, the IC fabrication includes performing one or more lithographic exposures based at least indirectly on IC design layout diagram 3322. Semiconductor wafer 3353 includes a silicon substrate or other proper substrate having material layers formed thereon. Semiconductor wafer 3353 further includes one or more of various doped regions, dielectric features, multilevel interconnects, and the like (formed at subsequent manufacturing steps).

As described above, the present disclosure provides integrated circuits with interconnect structures having low resistance and configured to transmit signals or voltages vertically. Moreover, a capping layer can be disposed above and cover a portion of such interconnect structure, in order to reduce the capacitance formed between the interconnect structure and active regions or gates. Accordingly, the power, performance and area of the integrated circuit manufactured based on the layout design is improved.

In some embodiments, an integrated circuit is provided, including a first cell. The first cell includes a first pair of active regions, at least one first gate, two first conductive segments, and a first interconnect structure. The first pair of active regions extends in a first direction and stacked on each other. The at least one first gate extends in a second direction different from the first direction, and is arranged across the first pair of active regions, to form at least one first pair of devices that are stacked on each other. The first conductive segments are coupled to the first pair of active regions respectively. The first interconnect structure is coupled to at least one of a first via or one of the two first conductive segments. In a cross section view, the first interconnect structure extends from a layer where one of the two first conductive segments is disposed to a layer where the other one of the two first conductive segments is disposed, and the first interconnect structure is separate from the first pair of active regions and the at least one first gate. In a layout view, the first interconnect structure extends in the first direction and has a length and a width that is smaller than the length.

In some embodiments, the at least one first gate includes multiple first gates, and in the layout view, the first interconnect structure is arranged across a number of the first gates.

In some embodiments, in the layout view, two first gates in the first gates have a pitch therebetween, and a minimum of the length of the first interconnect structure is in a range from approximately the pitch to approximately two times of the pitch.

In some embodiments, the integrated circuit further includes a second cell abutting the first cell. The second cell includes a second pair of active regions, at least one second gate, two second conductive segments, and a second interconnect structure. The second pair of active regions extends in the first direction and stacked on each other. The at least one second gate extends in the second direction, and is arranged across the second pair of active regions, to form at least one second pair of devices that are stacked on each other. The second conductive segments are coupled to the second pair of active regions respectively. The second interconnect structure is coupled to at least one of a second via or one of the second two conductive segments. In the cross section view, the second interconnect structure extends from a layer where one of the two second conductive segments is disposed to a layer where the other one of the two second conductive segments is disposed, and the second interconnect structure is separate from the second pair of active regions and the at least one second gate. In the layout view, the second interconnect structure extends in the first direction and has a length and a width that is smaller than the length.

In some embodiments, in the layout view, the at least one first gate comprises multiple first gates, and the at least one second gate includes multiple second gates, two first gates of the first gates have a pitch therebetween, two second gates of the second gates have the pitch therebetween, the first cell and the second cell are abutted with each other along the first direction, and a minimum of an interval between the first interconnect structure and the second interconnect structure is in a range from approximately the pitch to approximately two times of the pitch.

In some embodiments, in the layout view, the first cell and the second cell are abutted with each other along the second direction, and the first interconnect structure is coupled through a third conductive segment to one of the first pair of active regions in the first cell, and is coupled through a fourth conductive segment to one of the second pair of active regions in the second cell.

In some embodiments, in the layout view, the first cell and the second cell are abutted with each other along the second direction. The first cell further includes a capping layer disposed above and covering a portion of the first interconnect structure and a third conductive segment disposed above and crossing over the capping layer and the first interconnect structure. The third conductive segment extends in the second direction to couple one of the first pair of active regions in the first cell to one of the second pair of active regions in the second cell.

In some embodiments, the integrated circuit further includes a first dielectric structure and a second dielectric structure. The first dielectric structure abuts the first interconnect structure along the first direction and has a height that is substantially the same as the height of the first interconnect structure. The second dielectric structure surrounds the first interconnect structure and the first dielectric structure. A width of the second dielectric structure in the second direction is uniform.

In some embodiments, the integrated circuit further includes a second cell abutting the first cell along the first direction and a dielectric structure. The second cell includes a second pair of active regions, at least one second gate, and at least one conductive segment. The second pair of active regions extends in the first direction and stacked on each other. The at least one second gate extends in the second direction, and is arranged across the second pair of active regions, to form at least one second pair of devices that are stacked on each other. The at least one conductive segment is coupled to the second pair of active regions, respectively. The dielectric structure extends across the first cell and the second cell along the first direction and surrounds the first interconnect structure. A width of the dielectric structure in the second direction is uniform.

In some embodiments, the first cell further includes a capping layer disposed above and covering a portion of the first interconnect structure.

In some embodiments, an integrated circuit is provided, including a first cell and a second cell. The first cell includes a first pair of active regions, a first portion of multiple gates, and a first interconnect structure. The first pair of active regions extends in a first direction and stacked on each other. The first portion of a plurality of gates is continuous in a second direction different from the first direction, and arranged across the first pair of active regions. The first interconnect structure is coupled to one of the first pair of active regions and has a height greater than a sum of heights of the first pair of active regions. The first interconnect structure is separate from the first pair of active regions and the first portion of the gates, and in a layout view, the first interconnect structure is arranged across a first number of the gates. The second cell abuts the first cell and includes a second pair of active regions, a second portion of the plurality of gates, and a second interconnect structure. The second pair of active regions extends in the first direction and stacked on each other. The second portion of the gates is arranged across the second pair of active regions. The second interconnect structure is coupled to one of the second pair of active regions and and has a height greater than a sum of heights of the second pair of active regions. The second interconnect structure is separate from the second pair of active regions and the second portion of the gates, and in the layout view, the second interconnect structure is arranged across a second number of the gates.

In some embodiments, in the layout view, two gates of the gates have a pitch therebetween, and a minimum of an interval between the first interconnect structure and a third interconnect structure that is disposed in a third cell abutting the first cell is in a range from approximately the pitch to approximately two times of the pitch.

In some embodiments, in the layout view, the first cell and the second cell are abutted with each other along the second direction, and the first interconnect structure is coupled through a first conductive segment to one of the first pair of active regions in the first cell, and is coupled through a second conductive segment to one of the second pair of active regions in the second cell.

In some embodiments, the first cell further includes a capping layer, and a conductive segment. The capping layer is disposed above and covers a portion of the first interconnect structure. The conductive segment is disposed above and crosses over the capping layer and the first interconnect structure. In the layout view, the conductive segment couples one of the first pair of active regions in the first cell to one of the second pair of active regions in the second cell.

In some embodiments, in the layout view, two gates of the gates have a pitch therebetween, and a minimum of the length of at least one of the first interconnect structure or the second interconnect structure is in a range from approximately the pitch to approximately two times of the pitch.

In some embodiments, a method for fabricating an integrated circuit is provided, including generating, based on a set of design rules, a layout design of the integrated circuit including a plurality of cells. Generating the layout design includes: placing a first cell including a first pair of active regions, multiple first gates, and a first interconnect structure, wherein the first pair of active regions extending in a first direction and stacked on each other, the first gates extend in a second direction different from the first direction and are arranged across the first pair of active regions, and the first interconnect structure is arranged across a number of the first gates; and placing a second cell abutting the first cell and including a second pair of active regions, multiple second gates, and a second interconnect structure, wherein the second pair of active regions extending in the first direction and stacked on each other, the second gates extend in the second direction different from the first direction and are arranged across the second pair of active regions, and the second interconnect structure is arranged across a number of the second gates. The set of design rules includes a first design rule that the first interconnect structure and the second interconnect structure are separate from each other.

In some embodiments, the set of design rules further includes a second design rule that, on a condition of the second cell abutting the first cell on a first boundary of the second cell along the first direction, the first interconnect structure and the second interconnect structure are arranged in a same row, and a side of the second interconnect structure is arranged to be close to or aligned with a second boundary of the second cell, which is opposite to the first boundary of the second cell.

In some embodiments, the set of design rules further includes a second design rule that, on a condition of the second cell abutting the first cell along the first direction, the first interconnect structure and the second interconnect structure are separate from each other by a distance that is greater than a pitch between two of the first gates or two of the second gates.

In some embodiments, the set of design rules further includes a second design rule that, on a condition of the second cell abutting the first cell along the first direction, the second pair of active regions has a width that is large enough to reach the row in which the first interconnect structure and the second interconnect structure are arranged, and the first interconnect structure and the second pair of active regions are separate from each other by a distance that is greater than a pitch between two of the first gates or two of the second gates.

In some embodiments, the second cell further includes at least one conductive segment extending in the second direction and coupled to the second pair of active regions. The set of design rules further includes a second design rule that, on a condition of the second cell abutting the first cell along the first direction, the at least one conductive segment has a length that is large enough to reach the row in which the first interconnect structure and the second interconnect structure are arranged, and the first interconnect structure and the at least one conductive segment are separate from each other by a distance that is greater than a pitch between two of the first gates or two of the second gates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first cell comprising:
a first pair of active regions extending in a first direction and stacked on each other;
at least one first gate extending in a second direction different from the first direction, and arranged across the first pair of active regions, to form at least one first pair of devices that are stacked on each other;
two first conductive segments coupled to the first pair of active regions, respectively; and
a first interconnect structure coupled to at least one of a first via or one of the two first conductive segments, wherein in a cross section view, the first interconnect structure extends from a layer where one of the two first conductive segments is disposed to a layer where the other one of the two first conductive segments is disposed, and the first interconnect structure is separate from the first pair of active regions and the at least one first gate;
wherein in a layout view, the first interconnect structure extends in the first direction and has a length and a width that is smaller than the length.

2. The integrated circuit of claim 1, wherein the at least one first gate comprises a plurality of first gates, and in the layout view, the first interconnect structure is arranged across a number of the plurality of first gates.

3. The integrated circuit of claim 2, wherein in the layout view,
two first gates in the plurality of first gates have a pitch therebetween, and
a minimum of the length of the first interconnect structure is in a range from approximately the pitch to approximately two times of the pitch.

4. The integrated circuit of claim 1, further comprising:
a second cell abutting the first cell, and comprising:
a second pair of active regions extending in the first direction and stacked on each other;
at least one second gate extending in the second direction, and arranged across the second pair of active regions, to form at least one second pair of devices that are stacked on each other;
two second conductive segments coupled to the second pair of active regions, respectively; and
a second interconnect structure coupled to at least one of a second via or one of the second two conductive segments, wherein in the cross section view, the second interconnect structure extends from a layer where one of the two second conductive segments is disposed to a layer where the other one of the two second conductive segments is disposed, and the second interconnect structure is separate from the second pair of active regions and the at least one second gate;
wherein in the layout view, the second interconnect structure extends in the first direction and has a length and a width that is smaller than the length.

5. The integrated circuit of claim 4, wherein in the layout view,
the at least one first gate comprises a plurality of first gates, and the at least one second gate comprises a plurality of second gates, two first gates of the plurality of first gates have a pitch therebetween, two second gates of the plurality of second gates have the pitch therebetween,
the first cell and the second cell are abutted with each other along the first direction, and
a minimum of an interval between the first interconnect structure and the second interconnect structure is in a range from approximately the pitch to approximately two times of the pitch.

6. The integrated circuit of claim 4, wherein in the layout view,
the first cell and the second cell are abutted with each other along the second direction, and
the first interconnect structure is coupled through a third conductive segment to one of the first pair of active regions in the first cell, and is coupled through a fourth conductive segment to one of the second pair of active regions in the second cell.

7. The integrated circuit of claim 4, wherein in the layout view,
the first cell and the second cell are abutted with each other along the second direction, and
the first cell further comprises:
a capping layer disposed above and covering a portion of the first interconnect structure; and a third conductive segment disposed above and crossing over the capping layer and the first interconnect structure, and extending in the second direction to couple one of the first pair of active regions in the first cell to one of the second pair of active regions in the second cell.

8. The integrated circuit of claim 1, wherein the first cell further comprises:

a first dielectric structure abutting the first interconnect structure along the first direction and having a height that is substantially the same as the height of the first interconnect structure; and a second dielectric structure surrounding the first interconnect structure and the first dielectric structure, wherein a width of the second dielectric structure in the second direction is uniform.

9. The integrated circuit of claim 1, further comprising:

a second cell abutting the first cell along the first direction, and comprising:

a second pair of active regions extending in the first direction and stacked on each other;

at least one second gate extending in the second direction, and arranged across the second pair of active regions, to form at least one second pair of devices that are stacked on each other; and at least one conductive segment coupled to the second pair of active regions, respectively; and a dielectric structure extending across the first cell and the second cell along the first direction and surrounding the first interconnect structure, wherein a width of the dielectric structure in the second direction is uniform.

10. The integrated circuit of claim 1, wherein the first cell further comprises:

a capping layer disposed above and covering a portion of the first interconnect structure.

11. An integrated circuit comprising:

a first cell comprising:

a first pair of active regions extending in a first direction and stacked on each other;

a first portion of a plurality of gates being continuous in a second direction different from the first direction, and arranged across the first pair of active regions; and a first interconnect structure coupled to one of the first pair of active regions and having a height greater than a sum of heights of the first pair of active regions, wherein the first interconnect structure is separate from the first pair of active regions and the first portion of the plurality of gates, and in a layout view, the first interconnect structure is arranged across a first number of the plurality of gates; and a second cell abutting the first cell, and comprising:

a second pair of active regions extending in the first direction and stacked on each other;

a second portion of the plurality of gates, arranged across the second pair of active regions; and a second interconnect structure coupled to one of the second pair of active regions and and having a height greater than a sum of heights of the second pair of active regions, wherein the second interconnect structure is separate from the second pair of active regions and the second portion of the plurality of gates, and in the layout view, the second interconnect structure is arranged across a second number of the plurality of gates.

12. The integrated circuit of claim 11, wherein in the layout view, two gates of the plurality of gates have a pitch therebetween, a minimum of an interval between the first interconnect structure and a third interconnect structure that is disposed in a third cell abutting the first cell is in a range from approximately the pitch to approximately two times of the pitch.

13. The integrated circuit of claim 11, wherein in the layout view, the first cell and the second cell are abutted with each other along the second direction, and the first interconnect structure is coupled through a first conductive segment to one of the first pair of active regions in the first cell, and is coupled through a second conductive segment to one of the second pair of active regions in the second cell.

14. The integrated circuit of claim 11, wherein the first cell further comprises:

a capping layer disposed above and covering a portion of the first interconnect structure; and a conductive segment disposed above and crossing over the capping layer and the first interconnect structure, wherein in the layout view, the conductive segment couples one of the first pair of active regions in the first cell to one of the second pair of active regions in the second cell.

15. The integrated circuit of claim 11, wherein in the layout view, two gates of the plurality of gates have a pitch therebetween, and a minimum of a length of at least one of the first interconnect structure or the second interconnect structure is in a range from approximately the pitch to approximately two times of the pitch.

16. A method for fabricating an integrated circuit, comprising:

generating, based on a set of design rules, a layout design of the integrated circuit including a plurality of cells, wherein generating the layout design comprises:

placing a first cell including a first pair of active regions, a plurality of first gates, and a first interconnect structure, wherein the first pair of active regions extending in a first direction and stacked on each other, the plurality of first gates extend in a second direction different from the first direction and are arranged across the first pair of active regions, and the first interconnect structure is arranged across a number of the plurality of first gates; and placing a second cell abutting the first cell and including a second pair of active regions, a plurality of second gates, and a second interconnect structure, wherein the second pair of active regions extending in the first direction and stacked on each other, the plurality of second gates extend in the second direction different from the first direction and are arranged across the second pair of active regions, and the second interconnect structure is arranged across a number of the plurality of second gates;

wherein the set of design rules comprises a first design rule that the first interconnect structure and the second interconnect structure are separate from each other.

17. The method of claim 16, wherein the set of design rules further comprises a second design rule that, on a condition of the second cell abutting the first cell on a first boundary of the second cell along the first direction, the first interconnect structure and the second interconnect structure are arranged in a same row, and a side of the second interconnect structure is arranged to be close to or aligned with a second boundary of the second cell, which is opposite to the first boundary of the second cell.

18. The method of claim 16, wherein the set of design rules further comprises a second design rule that, on a condition of the second cell abutting the first cell along the first direction, the first interconnect structure and the second interconnect structure are separate from each other by a distance that is greater than a pitch between two of the plurality of first gates or two of the plurality of second gates.

19. The method of claim 16, wherein the set of design rules further comprises a second design rule that, on a condition of the second cell abutting the first cell along the first direction, the second pair of active regions has a width that is large enough to reach a row in which the first interconnect structure and the second interconnect structure are arranged, and the first interconnect structure and the second pair of active regions are separate from each other by a distance that is greater than a pitch between two of the plurality of first gates or two of the plurality of second gates.

20. The method of claim 16, wherein the second cell further includes at least one conductive segment extending in the second direction and coupled to the second pair of active regions, and the set of design rules further comprises a second design rule that, on a condition of the second cell abutting the first cell along the first direction, the at least one conductive segment has a length that is large enough to reach a row in which the first interconnect structure and the second interconnect structure are arranged, and the first interconnect structure and the at least one conductive segment are separate from each other by a distance that is greater than a pitch between two of the plurality of first gates or two of the plurality of second gates.

* * * * *